(12) United States Patent
Toyama et al.

(10) Patent No.: US 11,870,021 B2
(45) Date of Patent: Jan. 9, 2024

(54) SEMICONDUCTOR LIGHT-EMITTING DEVICE AND METHOD FOR MANUFACTURING THE SAME

(71) Applicant: Rohm Co., Ltd., Kyoto (JP)

(72) Inventors: Tomoichiro Toyama, Kyoto (JP); Ryo Kittaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/840,296

(22) Filed: Jun. 14, 2022

(65) Prior Publication Data

US 2022/0310889 A1 Sep. 29, 2022

Related U.S. Application Data

(63) Continuation of application No. 16/725,484, filed on Dec. 23, 2019, now Pat. No. 11,393,960.

(30) Foreign Application Priority Data

| Feb. 26, 2019 | (JP) | 2019-032442 |
| Mar. 29, 2019 | (JP) | 2019-067019 |
| Oct. 8, 2019 | (JP) | 2019-185283 |

(51) Int. Cl.
*H01L 33/56* (2010.01)
*H01L 33/00* (2010.01)
(Continued)

(52) U.S. Cl.
CPC .......... *H01L 33/56* (2013.01); *H01L 33/0095* (2013.01); *H01L 33/54* (2013.01); *H01L 33/62* (2013.01); *H01L 2933/0066* (2013.01)

(58) Field of Classification Search
CPC ......... H01L 33/54; H01L 33/52; H01L 33/62; H01L 33/486; H01L 33/56
See application file for complete search history.

(56) References Cited

U.S. PATENT DOCUMENTS

| 2010/0059782 A1* | 3/2010 | Fujitomo | H01L 31/0203 |
| | | | 257/E33.056 |
| 2011/0108875 A1 | 5/2011 | Takenaka et al. | |

(Continued)

FOREIGN PATENT DOCUMENTS

| JP | 2004-288657 A | 10/2004 |
| JP | 2010-199454 A | 9/2010 |

(Continued)

OTHER PUBLICATIONS

Office Action received in the corresponding Japanese Patent application, dated Jun. 6, 2023, and machine translation (8 pages).

(Continued)

*Primary Examiner* — Antonio B Crite
(74) *Attorney, Agent, or Firm* — Hamre, Schumann, Mueller & Larson, P.C.

(57) ABSTRACT

A semiconductor light-emitting device includes a substrate, a semiconductor light-emitting element, and a resin member. The substrate includes a base member and a conductive part. The semiconductor light-emitting element is supported on the substrate. The resin member covers at least a portion of the substrate. The base member has a front surface and a back surface that face opposite to each other in a thickness direction. The conductive part includes a front portion formed on the front surface. The semiconductor light-emitting element is mounted on the front portion. The resin member includes a frame-shaped portion surrounding the semiconductor light-emitting element as viewed in the thickness direction, and a front-surface covering portion connected to the frame-shaped portion and covering a portion of the front surface of the base member that is exposed from the front portion.

8 Claims, 51 Drawing Sheets

(51) Int. Cl.
*H01L 33/54* (2010.01)
*H01L 33/62* (2010.01)
*H01L 33/48* (2010.01)

(56) References Cited

U.S. PATENT DOCUMENTS

2015/0137161 A1* 5/2015 Hata .................... H01L 25/167
                                                                        257/98
2020/0176649 A1* 6/2020 Tanaka .................... H01L 33/54

FOREIGN PATENT DOCUMENTS

| JP | 2011-35082 A | 2/2011 |
| JP | 2012-256651 A | 12/2012 |
| JP | 2017-017256 A | 1/2017 |
| JP | 217-69539 A | 4/2017 |
| WO | 2019/018193 A1 | 1/2019 |

OTHER PUBLICATIONS

Office Action received in the corresponding Japanese Patent application, dated Sep. 26, 2023, and machine translation (6 pages).

* cited by examiner

SEMICONDUCTOR LIGHT-EMITTING DEVICE AND METHOD FOR MANUFACTURING THE SAME

FIELD

The present disclosure relates to semiconductor light-emitting devices. The present disclosure also relates to methods for manufacturing a semiconductor light-emitting device.

BACKGROUND

Semiconductor light-emitting devices that include a semiconductor light-emitting element as the light source have been proposed. An example of a conventional semiconductor light-emitting device is disclosed in JP-A-2017-017256. The semiconductor light-emitting device disclosed in this document includes an LED chip, a metal lead on which the LED chip is mounted, and a resin part covering a portion of the lead. The resin part is formed with a frame-shaped portion surrounding the LED chip.

SUMMARY

As a member for mounting the LED chip, a substrate including a base member and an electrically conductive part may be used instead of the metal lead. With such an arrangement, however, the base member may be deteriorated due to exposure to the light emitted from the LED chip. Also, depending on the shape or arrangement of the conductive part, problems such as failure of establishing desired electrical conduction (e.g. the LED chip is not properly mounted on the substrate or the semiconductor light-emitting device is not properly mounted on an external board) may occur.

Under the above-described circumstances, an object of the present disclosure is to provide a semiconductor light-emitting device that is capable of reducing the deterioration of the base member. Another object of the present disclosure is to provide a semiconductor light-emitting device that allows proper mounting of an LED chip or proper mounting of a semiconductor light-emitting device.

According to an aspect of the present disclosure, a semiconductor light-emitting device is provided. The semiconductor light-emitting device includes: a substrate including a base member and a conductive part; a semiconductor light-emitting element supported on the substrate; and a resin member covering at least a portion of the substrate. The base member has a front surface and a back surface that face opposite to each other in a thickness direction. The conductive part includes a front portion formed on the front surface. The semiconductor light-emitting element is mounted on the front portion. The resin member includes a frame-shaped portion surrounding the semiconductor light-emitting element as viewed in the thickness direction, and a front-surface covering portion connected to the frame-shaped portion and covering a portion of the front surface of the base member that is exposed from the front portion.

According to an aspect of the present disclosure, a method for manufacturing a semiconductor light-emitting device is provided. The method includes: preparing a substrate including a base member having a front surface and a conductive portion having a front portion including a front first portion and a front second portion formed on the front surface; loading a resin material with an end surface of a projection of a mold held in contact with a front-portion first surface of the front first portion and a front-portion second surface of the front second portion, with a gap formed between the end surface of the projection and the front surface; hardening the resin material to form a resin member including a frame-shaped portion and a front-surface covering portion connected to the frame-shaped portion and formed on the front surface of the base member, the front-surface covering portion covering a semiconductor light-emitting element supported on the substrate and a portion of the front surface of the base member that is exposed from the front portion; and mounting the semiconductor light-emitting element in a region surrounded by the frame-shaped portion.

According to an aspect of the present disclosure, a semiconductor light-emitting device is provided. The semiconductor light-emitting device includes: a substrate including a base member and a conductive part; a semiconductor light-emitting element supported on the substrate; and a resin member covering at least a portion of the substrate. The base member includes a front surface and a back surface that face opposite to each other in a thickness direction, a first side surface and a second side surface connecting the front surface and the back surface and located on opposite sides from each other in a first direction perpendicular to the thickness direction, a first groove recessed from the first side surface and reaching the front surface and the back surface, and a first through-hole penetrating in the thickness direction. The conductive part includes a front portion formed on the front surface, a back portion formed on the back surface, and a connecting portion including at least a first groove connecting portion formed in the first groove and a first through-hole connecting portion formed in the first through-hole. The front portion has a front first portion to which the semiconductor light-emitting element is mounted. The back portion has a back first portion. The first through-hole connecting portion connects the front first portion and the back first portion. The first groove connecting portion is connected to the back first portion. The front first portion and the first groove connecting portion are spaced apart from each other.

Other features and advantages of the present disclosure will become apparent from the detailed description given below with reference to the accompanying drawings.

DRAWINGS

EMBODIMENTS

Preferred embodiments of the present disclosure are described below with reference to the drawings.

In the present disclosure, the terms such as "first", "second" and "third" are used merely as labels and not intended to impose orders on their objects.

FIGS. 1-15 show a semiconductor light-emitting device according to a first embodiment of a first aspect of the present disclosure and its manufacturing method. The semiconductor light-emitting device A1 illustrated in the figure includes a substrate 1, a semiconductor light-emitting element 4, a first resin member 5 and a second resin member 6 configured to transmit light from the element 4.

Figure 1:
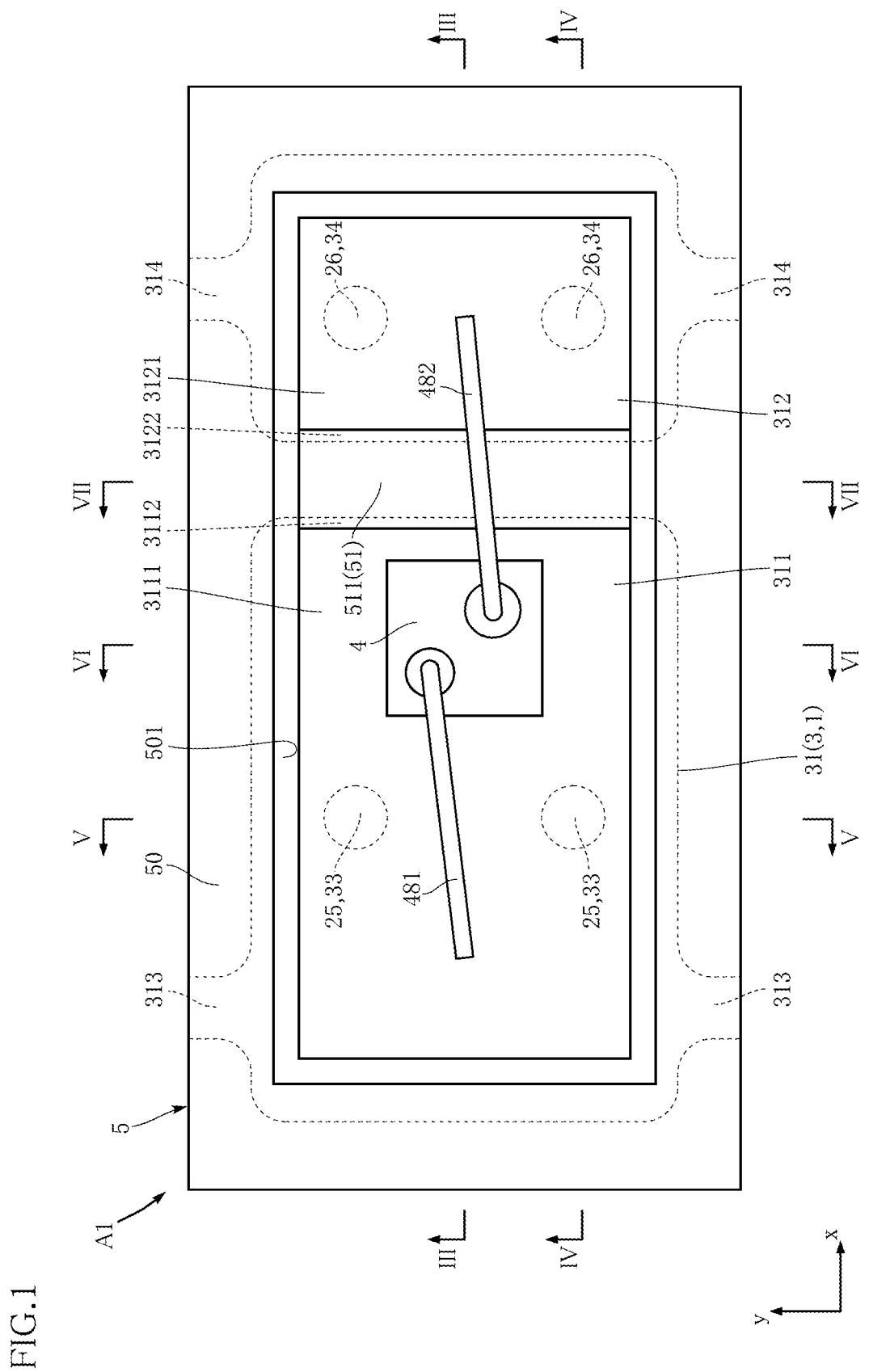
FIG. 1 is a plan view showing a semiconductor light-emitting device according to a first embodiment of a first aspect.
Figure 2:
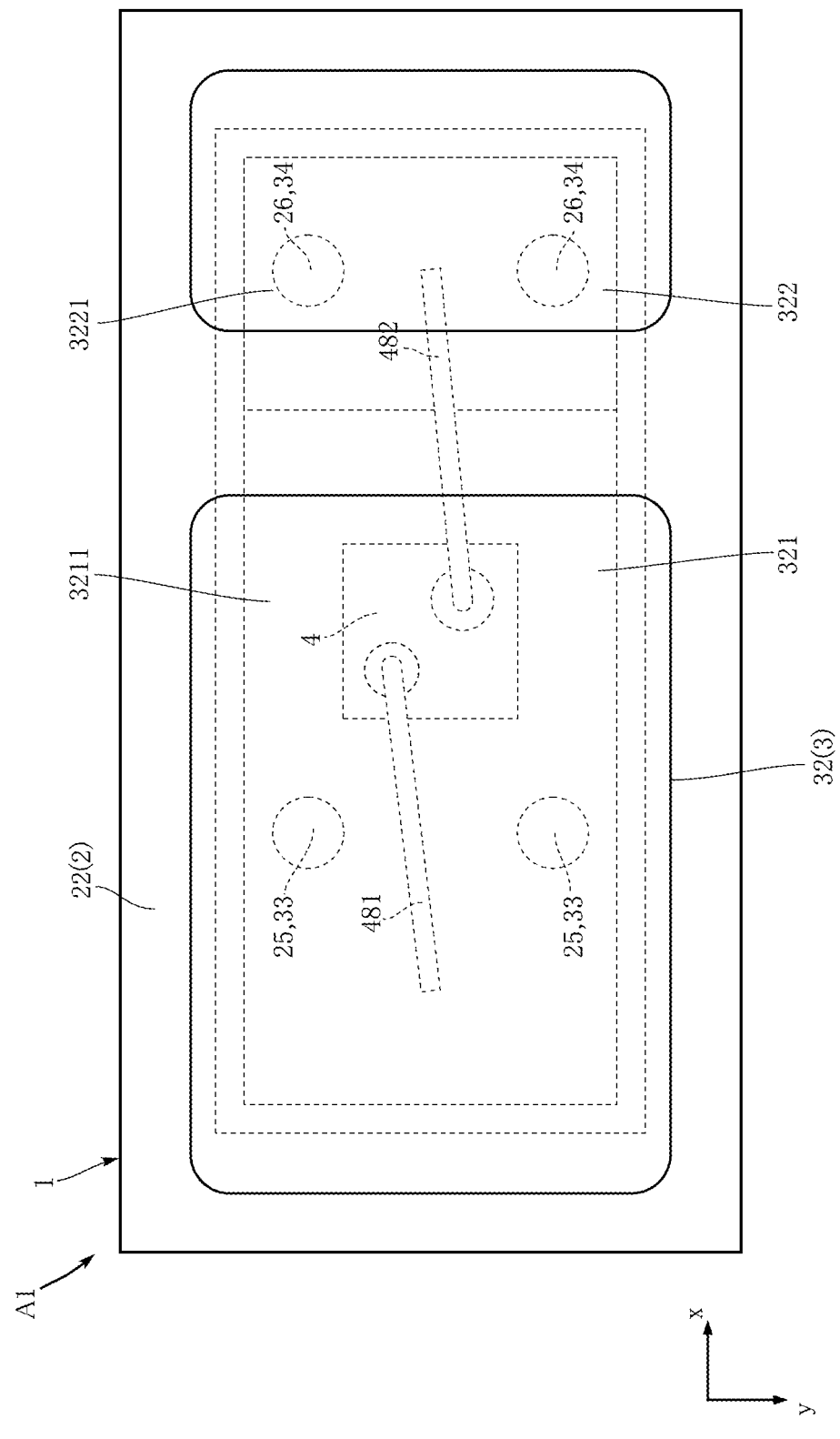
FIG. 2 is a bottom view showing the semiconductor light-emitting device according to the first embodiment of the first aspect.
Figure 3:
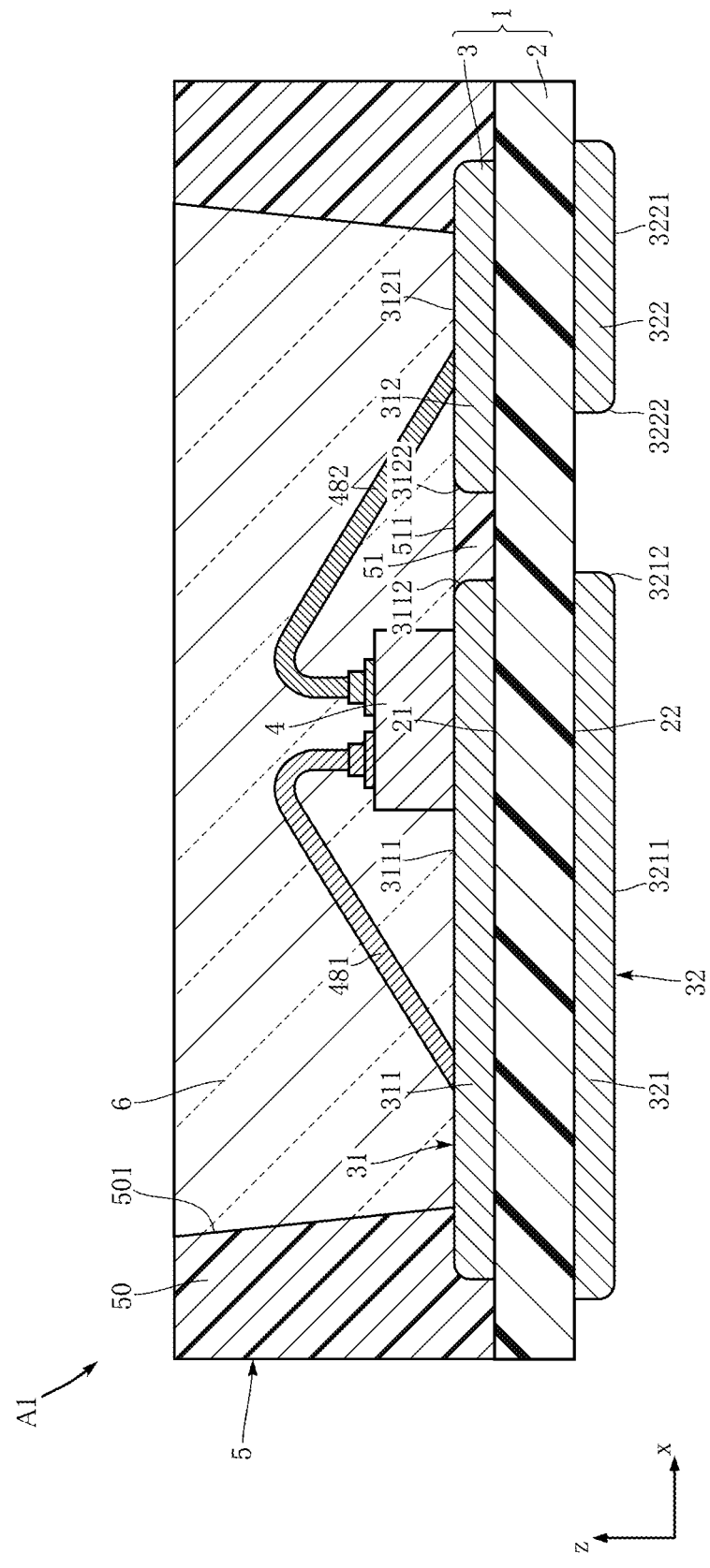
FIG. 3 is a sectional view taken along line III-III in FIG. 1.
Figure 4:
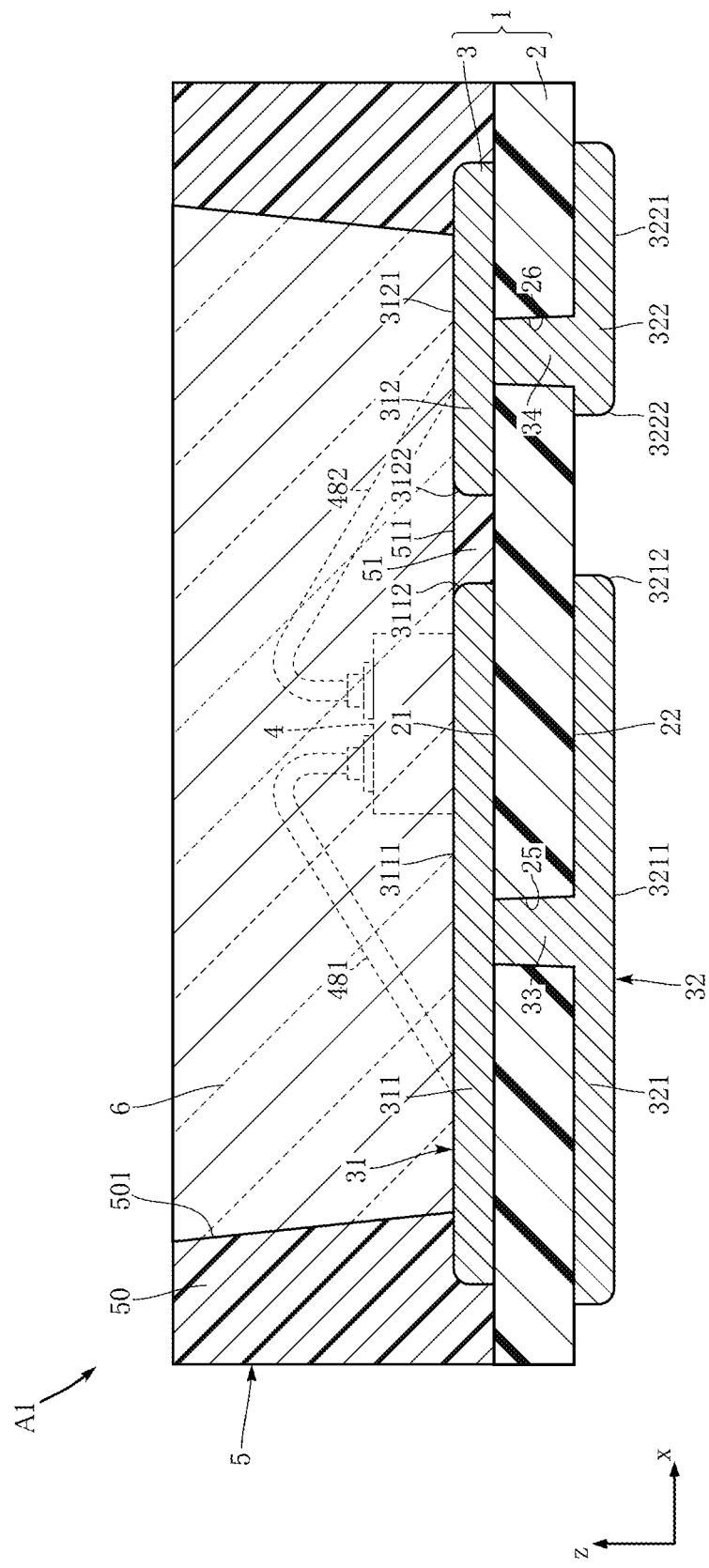
FIG. 4 is a sectional view taken along line IV-IV in FIG. 1.
Figure 5:
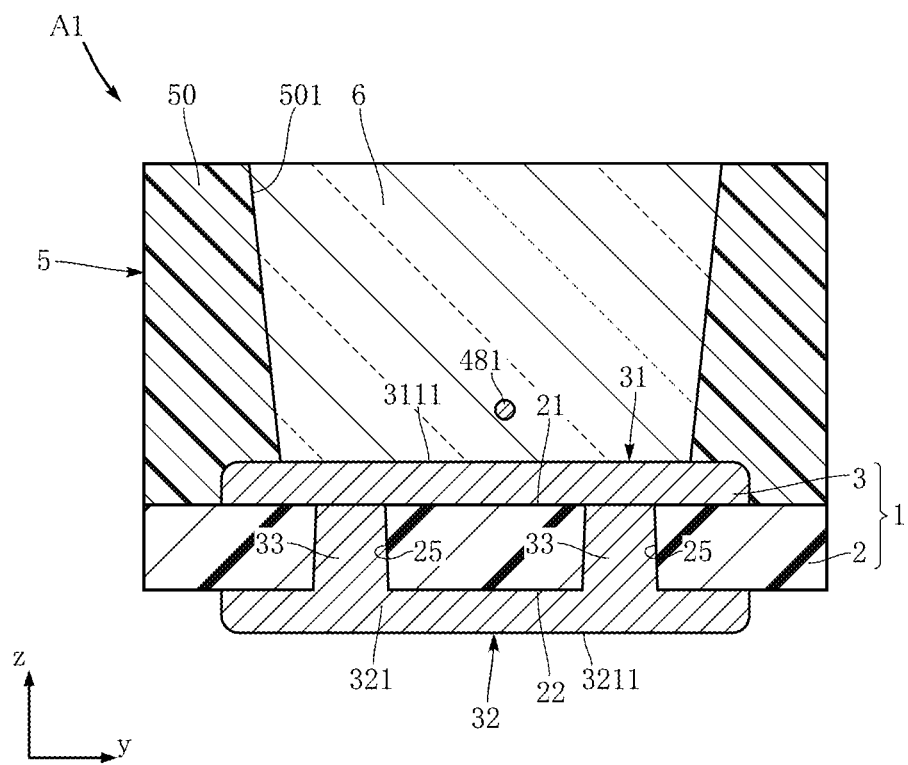
FIG. 5 is a sectional view taken along line V-V in FIG. 1.
Figure 6:
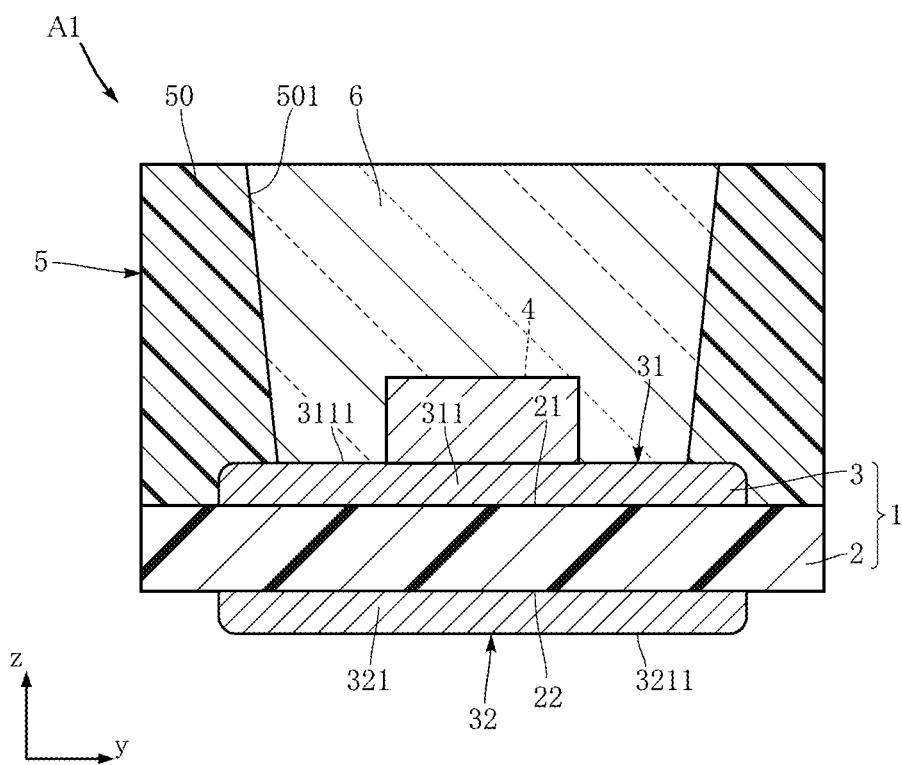
FIG. 6 is a sectional view taken along line VI-VI in FIG. 1.
Figure 7:
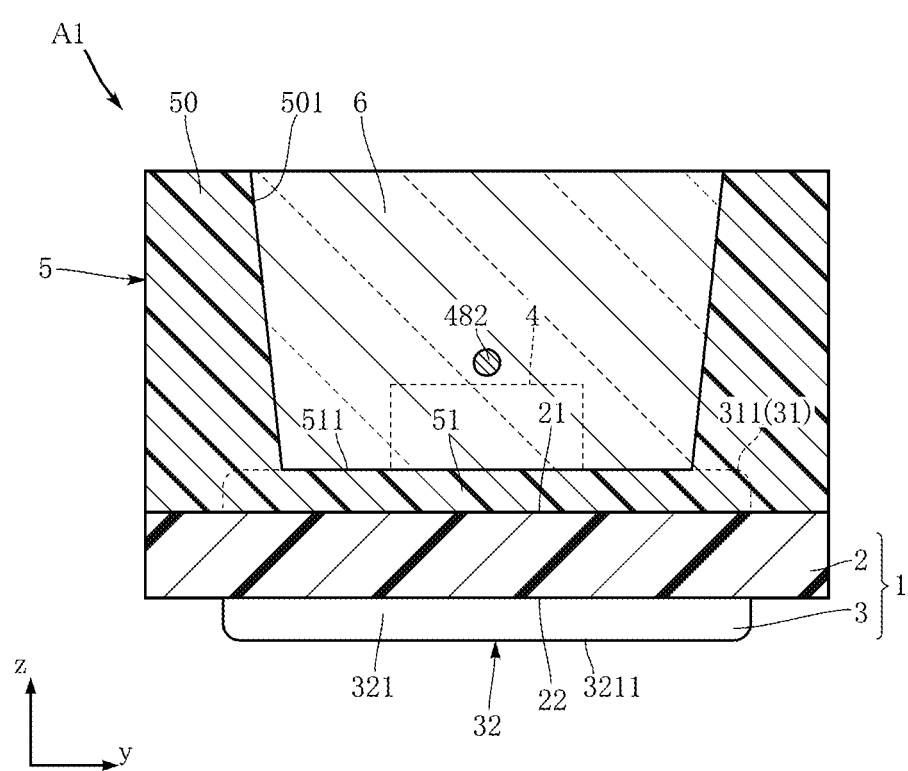
FIG. 7 is a sectional view taken along line VII-VII in FIG. 1.
Figure 8:
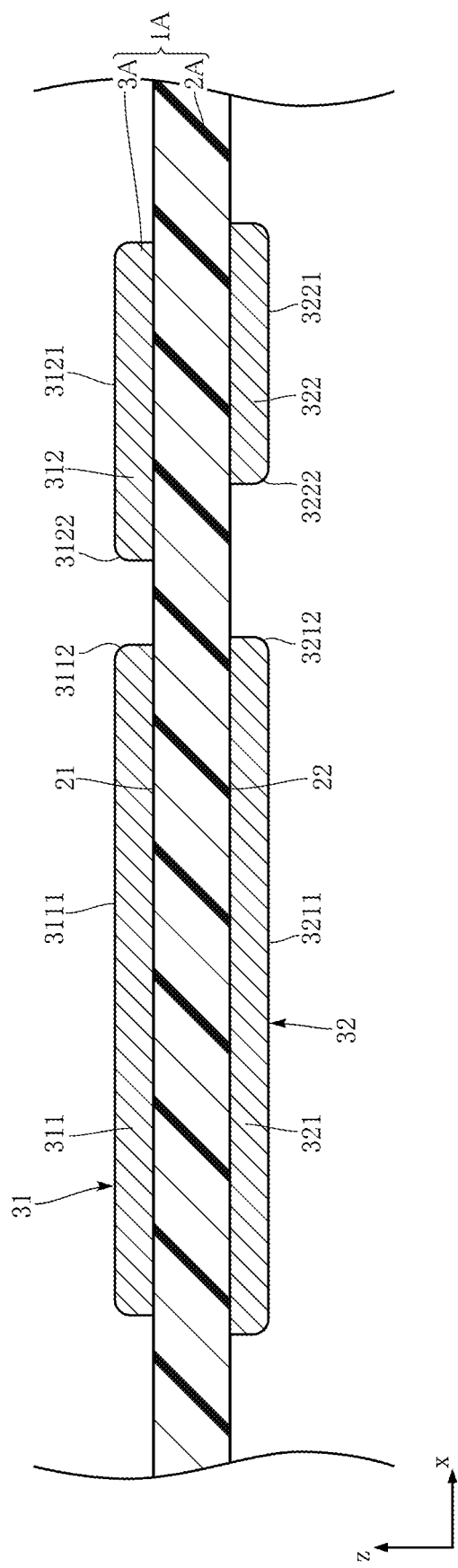
FIG. 8 is a sectional view showing a step of a method for manufacturing the semiconductor light-emitting device according to the first embodiment of the first aspect.
Figure 9:
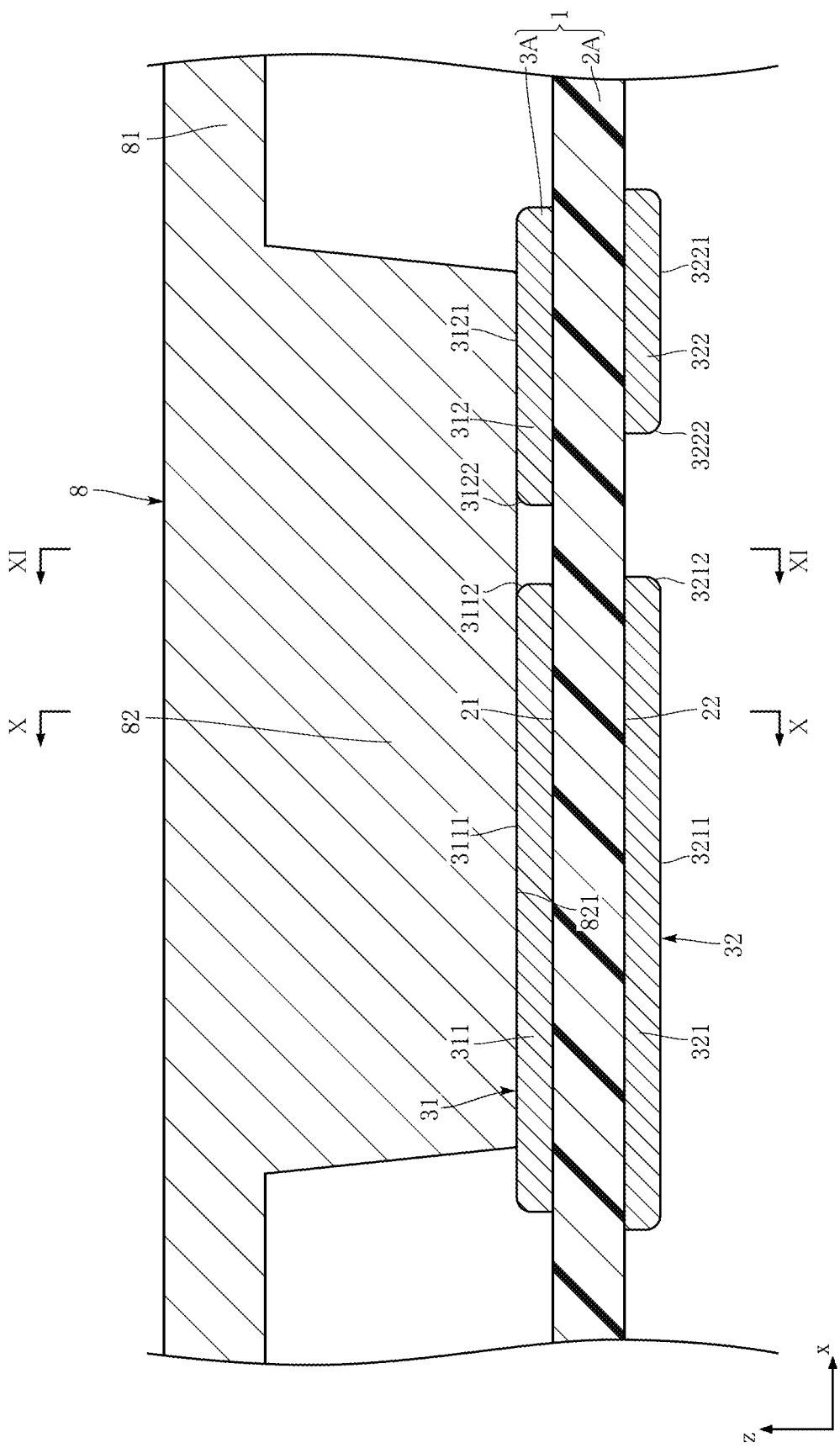
FIG. 9 is a sectional view showing a step of the method for manufacturing the semiconductor light-emitting device according to the first embodiment of the first aspect.
Figure 10:
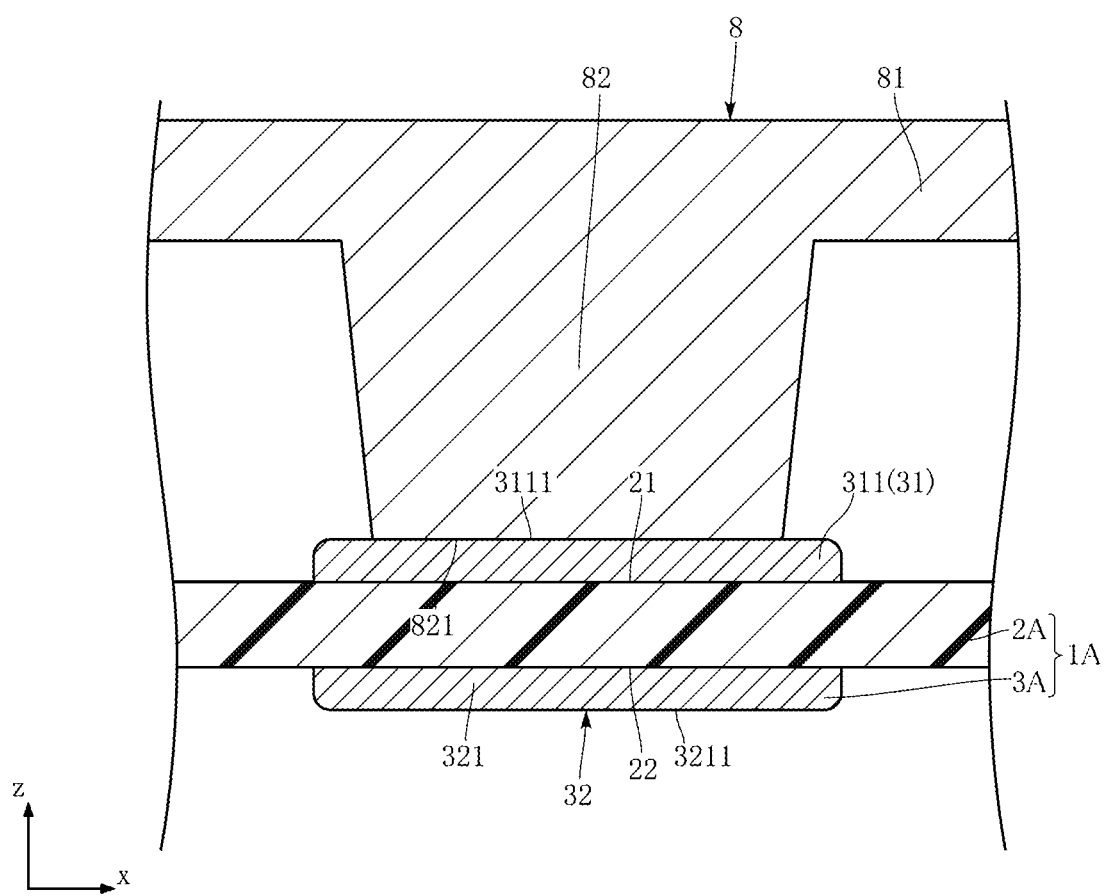
FIG. 10 is a sectional view taken along line X-X in FIG. 9.
Figure 11:
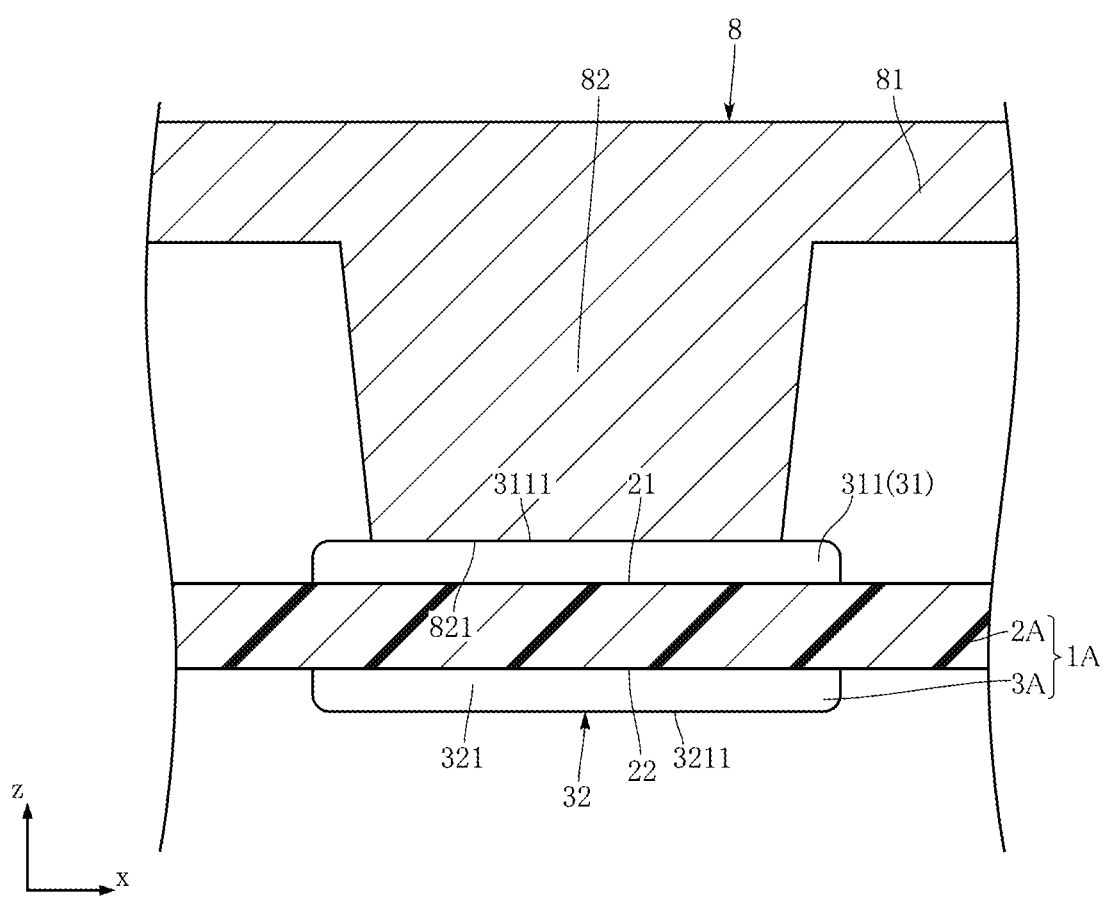
FIG. 11 is a sectional view taken along line XI-XI in FIG. 9.
Figure 12:
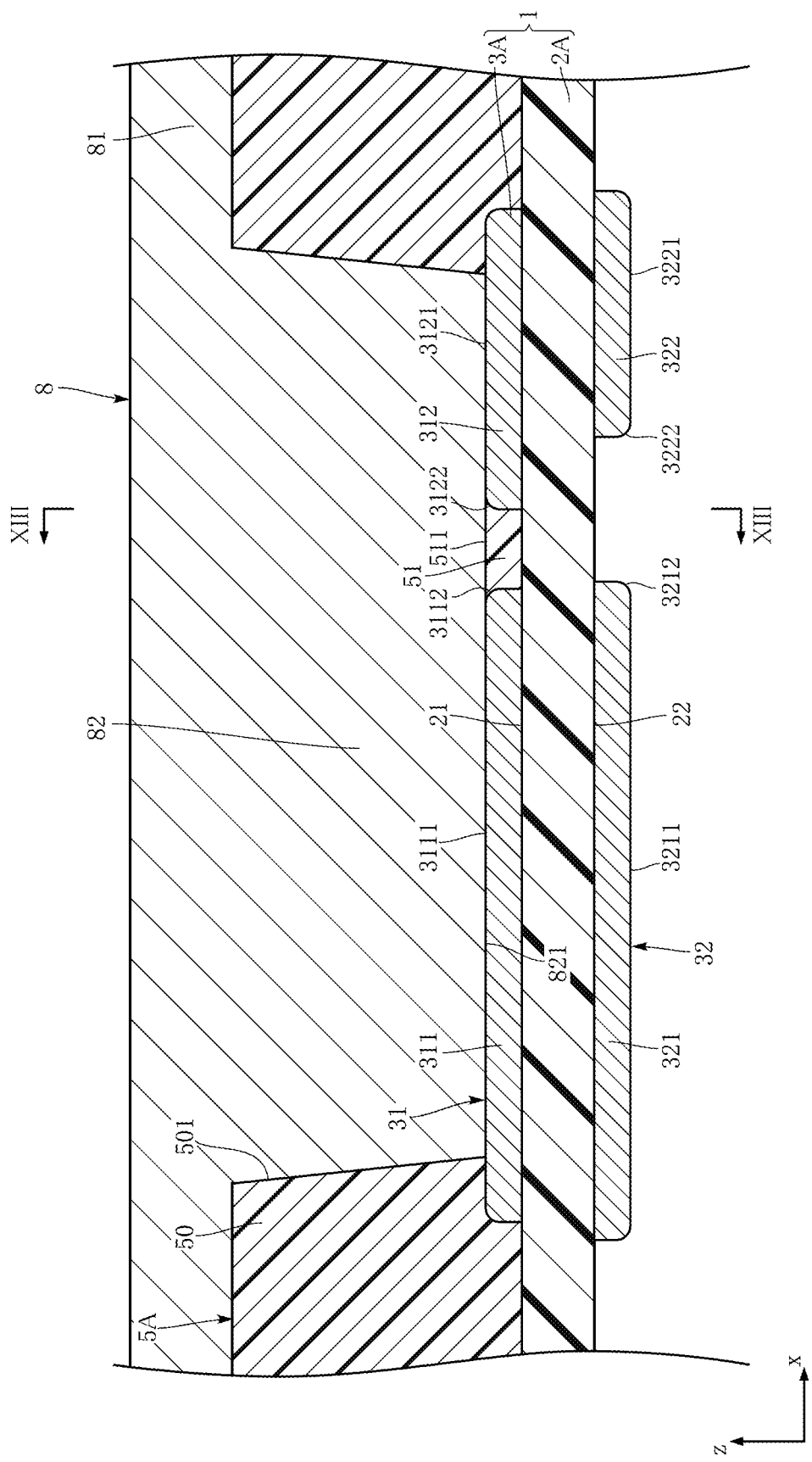
FIG. 12 is a sectional view showing a step of the method for manufacturing the semiconductor light-emitting device according to the first embodiment of the first aspect.
Figure 13:
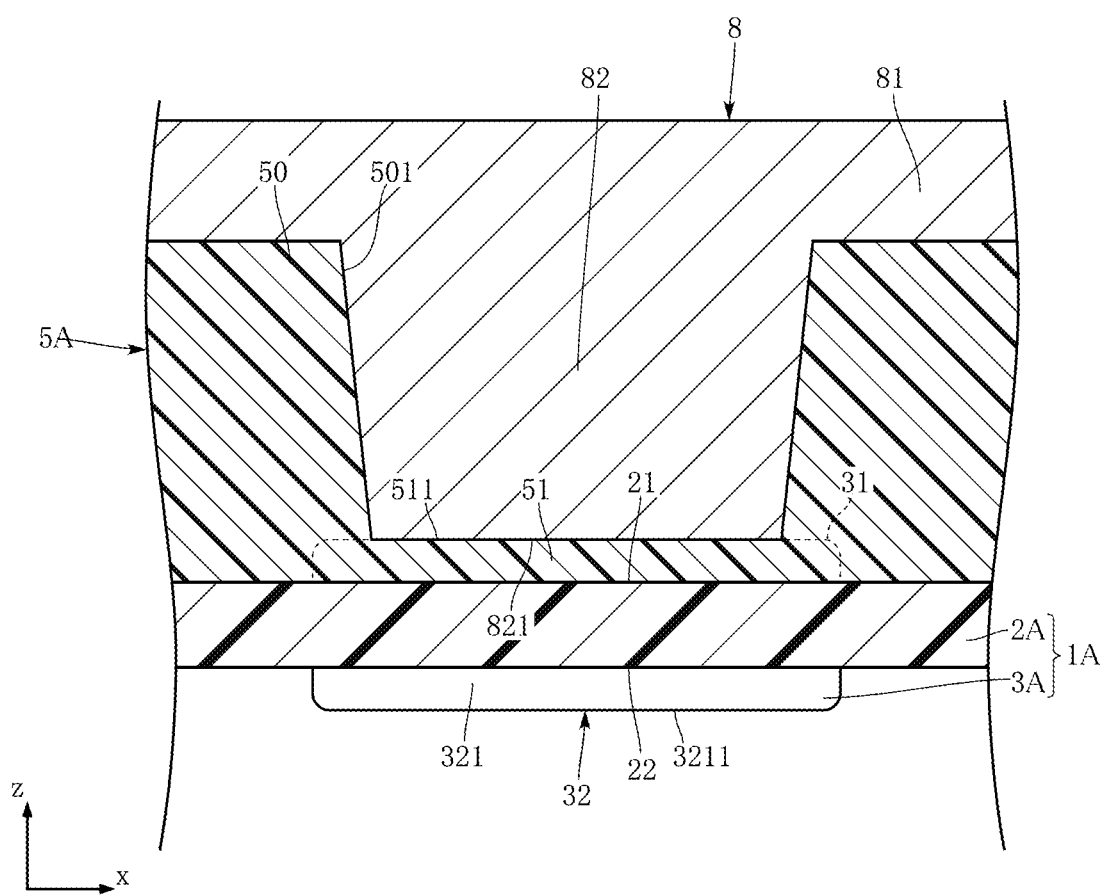
FIG. 13 is a sectional view taken along line XIII-XIII in FIG. 12.
Figure 14:
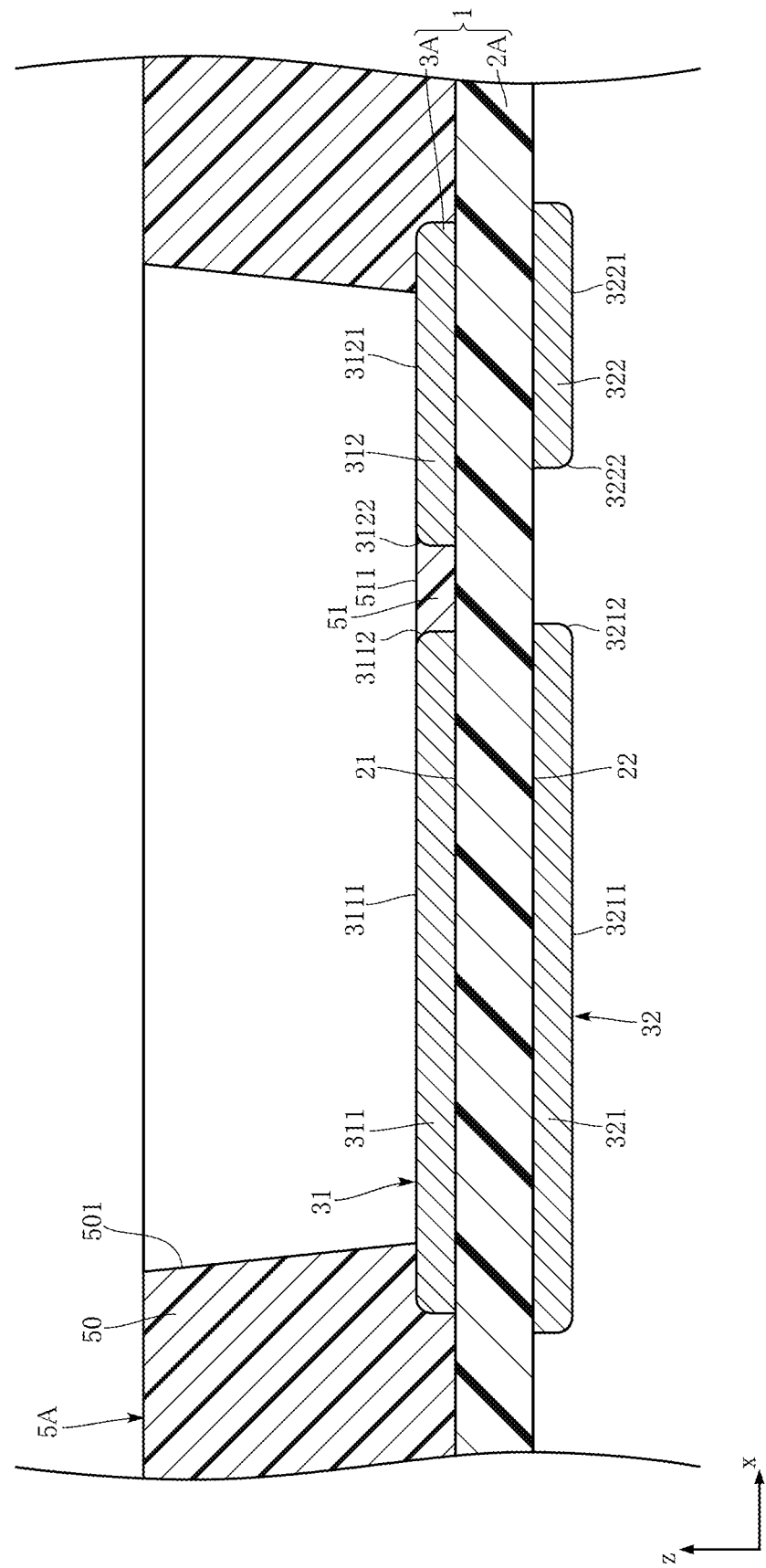
FIG. 14 is a sectional view showing a step of the method for manufacturing the semiconductor light-emitting device according to the first embodiment of the first aspect.
Figure 15:
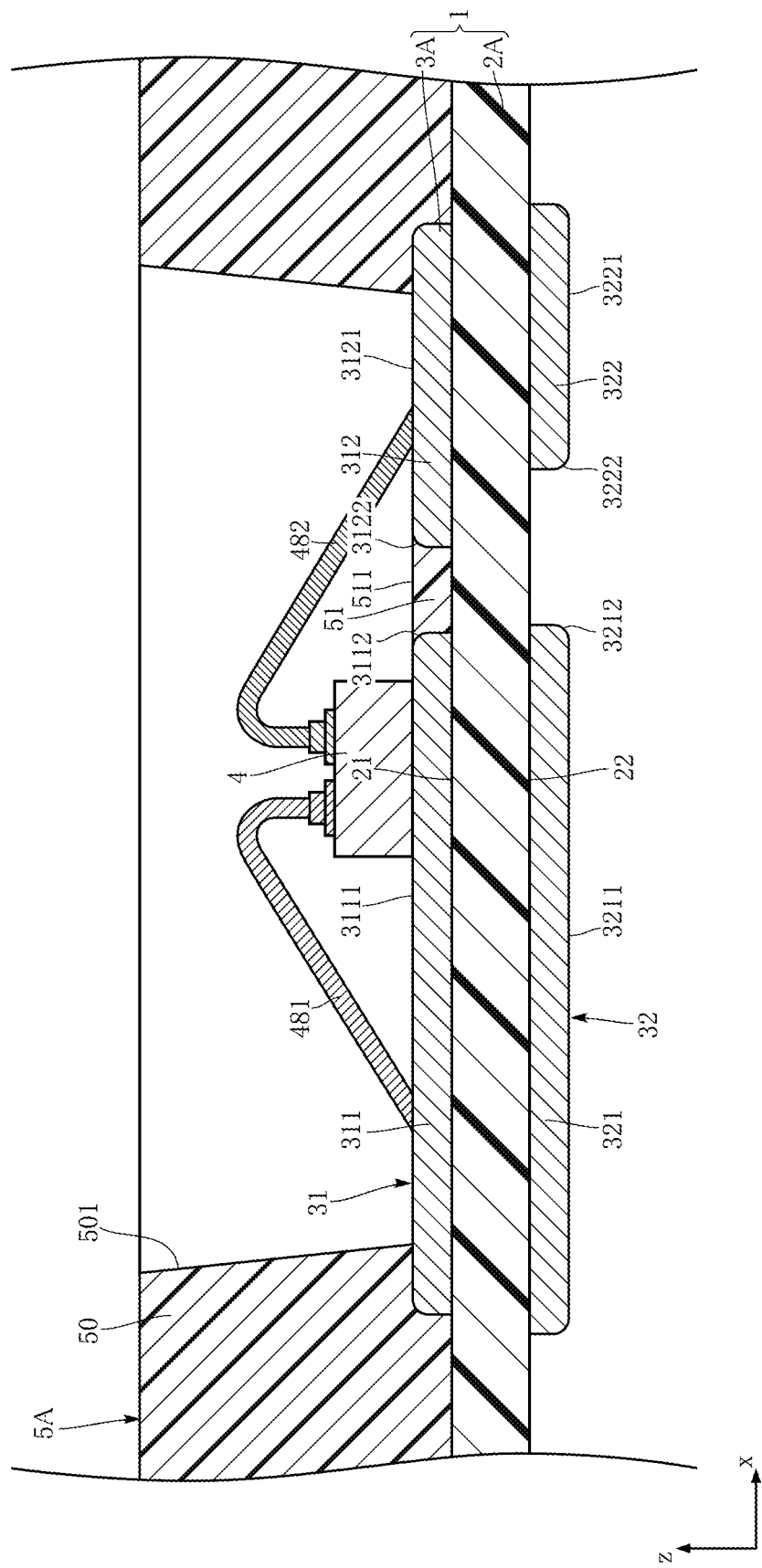
FIG. 15 is a sectional view showing a step of the method for manufacturing the semiconductor light-emitting device according to the first embodiment of the first aspect.

FIG. 1 is a plan view showing the semiconductor light-emitting device A1. FIG. 2 is a bottom view showing the semiconductor light-emitting device A1. FIG. 3 is a sectional view taken along line III-III in FIG. 1. FIG. 4 is a sectional view taken along line IV-IV in FIG. 1. FIG. 5 is a sectional view taken along line V-V in FIG. 1. FIG. 6 is a sectional view taken along line VI-VI in FIG. 1. FIG. 7 is a sectional view taken along line VII-VII in FIG. 1. FIG. 8 is a sectional view showing a step of a method for manufacturing the semiconductor light-emitting device A1. FIG. 9 is a sectional view showing a step of the method for manufacturing the semiconductor light-emitting device A1. FIG. 10 is a sectional view taken along line X-X in FIG. 9. FIG. 11 is a sectional view taken along line XI-XI in FIG. 9. FIG. 12 is a sectional view showing a step of the method for manufacturing the semiconductor light-emitting device A1. FIG. 13 is a sectional view taken along line XIII-XIII in FIG. 12. FIG. 14 is a sectional view showing a step of the method for manufacturing the semiconductor light-emitting device A1. FIG. 15 is a sectional view showing a step of the method for manufacturing the semiconductor light-emitting device A1. In FIG. 1, the resin member 6 is omitted.

As an example of the size of the semiconductor light-emitting device A1, the dimension in the x direction may be about 1.6 mm, the dimension in the y direction may be about 0.8 mm and the dimension in the z direction may be about 0.6 mm. The size and shape of the semiconductor light-emitting device A1 are not limited to the illustrated example and may be varied as appropriate.

The substrate 1 serves as a base of the semiconductor light-emitting device A1. The substrate 1 has a base member 2 and an electrically conductive part 3.

The base member 2 is made of an insulating material. The material for forming the base member 2 is not limited and may be glass epoxy resin, for example. The base member 2 has a front surface 21 and a back surface 22. As shown in FIGS. 3-7, the front surface 21 and the back surface 22 face opposite to each other in the z direction. In the illustrated example, the front surface 21 and the back surface 22 are flat surfaces perpendicular to the z direction. The shape of the base member 2 is not limited to the illustrated example and may be varied as appropriate. As shown in FIGS. 1 and 2, the base member 2 may be rectangular as viewed in the z direction. The thickness of the base member 2 is about 0.2 mm, for example.

The base member 2 is formed with conductive-part first through-holes 25 and conductive-part second through-holes 26. The conductive-part first through-holes 25 penetrate the base member 2 in the z direction. As shown in FIGS. 1 and 2, in the illustrated example, two conductive-part first through-holes 25 are provided as spaced apart from each other in the y direction. The conductive-part second through-holes 26 penetrate the base member 2 in the z direction. As shown in FIGS. 1 and 2, in the illustrated example, two conductive-part second through-holes 26 are provided as spaced apart from each other in the y direction. The two conductive-part second through-holes 26 are spaced apart from the two conductive-part first through-holes 25 in the x direction. The number, size and arrangement of the conductive-part first through-holes 25 and the conductive-part second through-holes 26 are not limited to the illustrated example and may be varied as appropriate.

The conductive part 3 is formed on the base member 2 and provides a conduction path to the semiconductor light-emitting element 4 and a portion for mounting the semiconductor light-emitting element 4. The conductive part 3 is made of an electrically conductive material and made of a metal such as Cu, Ni, Pd, Ti or Au, for example. In one configuration example, the conductive part 3 may include a base plating layer made of Ti and Cu, on which a Cu plating layer is formed by electroplating.

In the present embodiment, as shown in FIGS. 1-7, the conductive part 3 includes a front portion 31, a back portion 32, first connecting portions 33 and second connecting portions 34.

The front portion 31 is formed on the front surface 21 of the base member 2. In the illustrated example, the front portion 31 includes a front first portion 311, a front second portion 312, a first extension 313 and a second extension 314. The front portion 31 is about 40 μm in thickness, for example, but the present disclosure is not limited to this.

The front first portion 311 is the portion that is electrically connected to one of the electrodes of the semiconductor light-emitting element 4. The front second portion 312, which is spaced apart from the front first portion 311 in the x direction, is the portion to which the other one of the electrodes of the semiconductor light-emitting element 4 is electrically connected. The shape and size of the front first portion 311 and the front second portion 312 are not limited to the illustrated example and may be varied as appropriate. In the illustrated example, the front first portion 311 is larger than the front second portion 312. The front first portion 311 overlaps with the center of the base member 2 as viewed in the z direction. In the illustrated example, the front first portion 311 and the front second portion 312 are spaced apart from the edge of the base member 2.

As shown in FIG. 1 and FIGS. 3-7, the front first portion 311 has a front-portion first surface 3111 and a front-portion first inclined surface 3112. The front-portion first surface 3111 faces the side which the front surface 21 faces in the z direction and is a flat surface perpendicular to the z direction in the illustrated example. The front-portion first inclined surface 3112 is connected to the front-portion first surface 3111 and inclined so as to become more distant from the front-portion first surface 3111 in the x direction as approaching the front surface 21 in the z direction. In the illustrated example, the front-portion first inclined surface 3112 is a convexly curved surface. The front-portion first inclined surface 3112 is provided at a portion of the front first portion 311 that faces the front second portion 312 in the x direction.

As shown in FIG. 1 and FIGS. 3-7, the front second portion 312 has a front-portion second surface 3121 and a front-portion second inclined surface 3122. The front-portion second surface 3121 faces the side which the front surface 21 faces in the z direction and is a flat surface perpendicular to the z direction in the illustrated example. The front-portion second inclined surface 3122 is connected to the front-portion second surface 3121 and inclined so as to become more distant from the front-portion second surface 3121 in the x direction as approaching the front surface 21 in the z direction. In the illustrated example, the front-portion second inclined surface 3122 is a convexly curved surface. The front-portion second inclined surface 3122 is provided at a portion of the front second portion 312 that faces the front first portion 311 in the x direction.

As shown in FIG. 1, the first extension 313 is connected to the front first portion 311 and reaches the edge of the base member 2 as viewed in the z direction. In the illustrated example, two first extensions 313 connecting to the front first portion 311 from the opposite sides in the y direction are provided.

As shown in FIG. 1, the second extension 314 is connected to the front second portion 312 and reaches the edge of the base member 2 as viewed in the z direction. In the illustrated example, two second extensions 314 connecting to the front second portion 312 from the opposite sides in the y direction are provided.

The back portion 32 is formed on the back surface 22 of the base member 2. In the illustrated example, the back portion 32 includes a back first portion 321 and a back second portion 322. The back portion 32 is about 40 μm in thickness, for example. The surface layer of the back portion 32 may be plated with solder or Sn.

The back first portion 321 is the portion that is electrically connected to one of the electrodes of the semiconductor light-emitting element 4. The back second portion 322, which is spaced apart from the back first portion 321 in the x direction, is the portion to which the other one of the electrodes of the semiconductor light-emitting element 4 is electrically connected. The shape and size of the back first portion 321 and the back second portion 322 are not limited to the illustrated example and may be varied as appropriate. In the illustrated example, the back first portion 321 is larger than the back second portion 322. The back first portion 321 overlaps with the center of the base member 2 as viewed in the z direction. In the illustrated example, the back first portion 321 and the back second portion 322 are spaced apart from the edge of the base member 2. As viewed in the z direction, the back first portion 321 overlaps with the front first portion 311, and the back second portion 322 overlaps with the front second portion 312.

The first connecting portions 33 are formed in the conductive-part first through-holes 25 of the base member 2 and electrically connects the front first portion 311 and the back first portion 321. As shown in FIGS. 4 and 5, in the illustrated example, the first connecting portions 33 are formed integrally with the back first portion 321 by plating.

The second connecting portions 34 are formed in the conductive-part second through-holes 26 of the base member 2 and electrically connects the front second portion 312 and the back second portion 322. As shown in FIG. 4, in the illustrated example, the second connecting portions 34 are formed integrally with the back second portion 322 by plating.

The relative size, shape and positional relationship between the front first portion 311 and the front second portion 312 of the front portion 31 and the back first portion 321 and the back second portion 322 of the back portion 32 are not limited to the illustrated example and may be varied as appropriate. In the present embodiment, as shown in FIG. 3, the front first portion 311 and the back first portion 321 are offset from each other in the x direction, as viewed in the z direction. The front second portion 312 and the back second portion 322 are offset from each other in the x direction, as viewed in the z direction.

The semiconductor light-emitting element 4 is a light source element of the semiconductor light-emitting device A1. Examples of the semiconductor light-emitting element 4 include an LED chip, a semiconductor laser element and a VCSEL element, but the present disclosure is not limited to these examples. Hereinafter, the case where the semiconductor light-emitting element 4 is an LED chip is described as an example.

As shown in FIGS. 1, 3 and 6, the semiconductor light-emitting element 4 is mounted on the front first portion 311. In the illustrated example, the semiconductor light-emitting element 4 overlaps with the center of the base member 2, as viewed in the z direction. The semiconductor light-emitting element 4 may be rectangular as viewed in the z direction.

A first wire 481 and a second wire 482 are connected to the semiconductor light-emitting element 4. The first wire 481 is connected to one of the electrodes of the semiconductor light-emitting element 4 and the front first portion 311. The second wire 482 is connected to the other one of the electrodes of the semiconductor light-emitting element 4 and the front second portion 312. The material for the first wire 481 and the second wire 482 is Au, for example, but the present disclosure is not limited to this. The semiconductor light-emitting element 4 is a two-wire LED chip.

The resin member 5 covers a portion of the substrate 1. The resin forming the resin member 5 may be a thermosetting resin such as epoxy resin, but the present disclosure is not limited to this. It is preferable that the resin member 5 is made of a resin that is less likely to be deteriorated by the light from the semiconductor light-emitting element 4 than is the base member 2. In this example, the resin member 5 is made of white epoxy resin. The dimension of the resin member 5 in the z direction is about 0.4 mm, for example.

The resin member 5 has a frame-shaped portion 50 and a front-surface covering portion 51.

As shown in FIG. 1 and FIGS. 3-7, the frame-shaped portion 50 has a continuous rectangular shape as viewed in the z direction. As viewed in the z direction, the edge of the frame-shaped portion 50 and the edge of the base member 2 correspond to each other. The frame-shaped portion 50 surrounds the semiconductor light-emitting element 4 as viewed in the z direction. The frame-shaped portion 50 has a reflector 501. The reflector 501 is a surface that flanks the semiconductor light-emitting element 4 in the x direction and the y direction. The reflector 501 is inclined so as to become more distant from the semiconductor light-emitting element 4 in the x direction or the y direction as becoming more distant from the front surface 21 in the z direction. In the illustrated example, the frame-shaped portion 50 covers a portion of each of the front first portion 311 and the front second portion 312 of the front portion 31.

As shown in FIGS. 1, 3, 4 and 7, the front-surface covering portion 51 is connected to the frame-shaped portion 50 and covers a portion of the front surface 21 that is exposed from the front portion 31. In the present embodiment, the front-surface covering portion 51 covers the region of the front surface 21 that is flanked by the front first portion 311 and the front second portion 312 in the x direction. The front-surface covering portion 51 also covers the front-portion first inclined surface 3112 of the front first portion 311 and the front-portion second inclined surface 3122 of the front second portion 312. As shown in FIGS. 1 and 7, the front first portion 311 crosses over the region surrounded by the frame-shaped portion 50 in the y direction and connects the portions of the frame-shaped portion 50 that are mutually spaced apart in the y direction to each other.

The front-surface covering portion 51 has a front-surface covering-portion first surface 511. The front-surface covering-portion first surface 511 faces the side which the front surface 21 faces and is a flat surface perpendicular to the z direction in the illustrated example. The front-surface covering-portion first surface 511 is flush with the front-portion first surface 3111 and the front-portion second surface 3121.

As shown in FIGS. 3-7, the resin member 6 is loaded in the space surrounded by the frame-shaped portion 50 of the resin member 5 and covers a part of the front portion 31, the semiconductor light-emitting element 4, the first wire 481 and the second wire 482. The resin member 6 is made of a material that allows the light from the semiconductor light-emitting element 4 to pass through and is mainly composed of epoxy resin or silicone resin, for example. The resin member 6 main contain a fluorescent substance. For example, when the semiconductor light-emitting element 4 emits blue light, the resin member 6 may contain a fluorescent substance that emits yellow light when excited by blue light. In this case, white light is emitted from the semiconductor light-emitting device A1.

An example of a method for manufacturing the semiconductor light-emitting device A1 is described below with reference to FIGS. 8-15.

First, a substrate 1A is prepared, as shown in FIG. 8. The substrate 1A is a material capable of providing a plurality of substrates 1. Hereinafter, the case where a plurality of semiconductor light-emitting devices A1 are collectively manufactured is described, but the manufacturing method of the semiconductor light-emitting device A1 is not limited to this.

The substrate 1A has a base member 2A and a conductive part 3A. The base member 2A is to become the base member 2 described above and has a front surface 21 and a back surface 22. The conductive part 3A is to become the conductive part 3 described above and has a plurality of front portions 31 and back portions 32.

As shown in FIGS. 9-11, a mold 8 is pressed against the substrate 1A. The substrate 1A is supported from below (on the side opposite to the mold 8) by a support member (not shown). The mold 8 has a main part 81 and a projection 82. The main part 81 is a portion spaced apart from the substrate 1A in the z direction. The projection 82 is a portion projecting from the main part 81 in the z direction. The projection 82 has a contacting surface 821. The contacting surface 821 is at the end of the projection 82 in the z direction. The contacting surface 821 is a flat surface perpendicular to the z direction. The contacting surface 821 comes into contact with the front-portion first surface 3111 of the front first portion 311 and the front-portion second surface 3121 of the front second portion 312. A gap is formed between the contacting surface 821 and a part of the front surface 21 that is located between the front first portion 311 and the front second portion 312 in the x direction.

A thermosetting resin in a liquid state, for example, is loaded into the space between the substrate 1A and the mold 8. This resin material is then hardened to form the resin member 5A shown in FIGS. 12 and 13. The resin material loaded between the main part 81 and the substrate 1A forms a portion including the frame-shaped portion 50. The resin material loaded in the gap defined by the contacting surface 821, the front surface 21, the front first portion 311 and the front second portion 312 forms the front-surface covering portion 51.

After the resin material is hardened, the mold 8 is removed, as shown in FIG. 14. Next, as shown in FIG. 15, each of the semiconductor light-emitting element 4, the first wire 481 and the second wire 482 is bonded. Thereafter, a light-transmittable resin material is loaded into the space surrounded by the frame-shaped portion 50 by potting, for example, and then hardened, to provide the resin member 6 described above. Thereafter, the substrate 1A and the resin member 5A are cut appropriately to provide the semiconductor light-emitting device A1 described above.

The advantages of the semiconductor light-emitting device A1 and the method for manufacturing the semiconductor light-emitting device A1 are described below.

According to the present embodiment, as shown in FIGS. 1, 3, 4 and 7, the portion of the front surface 21 of the base member 2 that is exposed from the front portion 31 is covered with the front-surface covering portion 51. This reduces exposure of the base member 2 to the light from the semiconductor light-emitting element 4. Reducing the exposure of the base member 2 to the light from the semiconductor light-emitting element 4 may reduce deterioration of the base member 2. This allows for selecting a material that may be deteriorated by light as the material for the base member 2, which may lead to cost reduction.

Using, as the material for the resin member 5, a material that is less likely to be deteriorated by the light from the semiconductor light-emitting element 4 than is the base member 2 reduces deterioration by the light from the semiconductor light-emitting element 4.

The front-surface covering portion 51 crosses over the region surrounded by the frame-shaped portion 50 in the y direction and its opposite ends are connected to the frame-shaped portion 50. Thus, separation of the front-surface covering portion 51 from the front surface 21 is prevented.

Since the front-surface covering-portion first surface 511 is flush with the front-portion first surface 3111 and the front-portion second surface 3121, these surfaces form a large flat surface. This allows the light from the semiconductor light-emitting element 4 to be efficiently reflected in the z direction, which is advantageous for enhancing the brightness of the semiconductor light-emitting device A1.

Since the front-portion first inclined surface 3112 of the front first portion 311 and the front-portion second inclined surface 3122 of the front second portion 312 are covered with the front-surface covering portion 51, the front-surface covering portion 51 has curved surfaces conforming to the front-portion first inclined surface 3112 and the front-portion second inclined surface 3122. Such curved surfaces reduce stress concentration on the front-surface covering portion 51.

As shown in FIGS. 9-11, by bringing the contacting surface 821 of the projection 82 into contact with the front-portion first surface 3111 and the front-portion second surface 3121, a gap is formed between the front surface 21 and the contacting surface 821. This gap communicates with the gap between the main part 81 and the substrate 1. Thus, when a resin material is loaded into the gap between the main part 81 and the substrate 1, the resin material is also loaded into the gap between the front surface 21 and the contacting surface 821. Thus, the frame-shaped portion 50 and the front-surface covering portion 51 of the resin member 5 can be formed collectively. If the front-surface covering portion 51 and the frame-shaped portion 50 are formed in separate steps, it is difficult to form the frame-shaped portion 50 and the front-surface covering portion 51 completely integrally. In such a case, separation of the front-surface covering portion 51 may occur. According to the present embodiment, separation of the front-surface covering portion 51 is prevented.

FIGS. 16-34 show variations and other embodiments of the first aspect of the present disclosure. In these figures, the elements that are the same as or similar to the elements of the above first embodiment of the first aspect are denoted by the same reference signs as those in the above embodiment.

Figure 16:
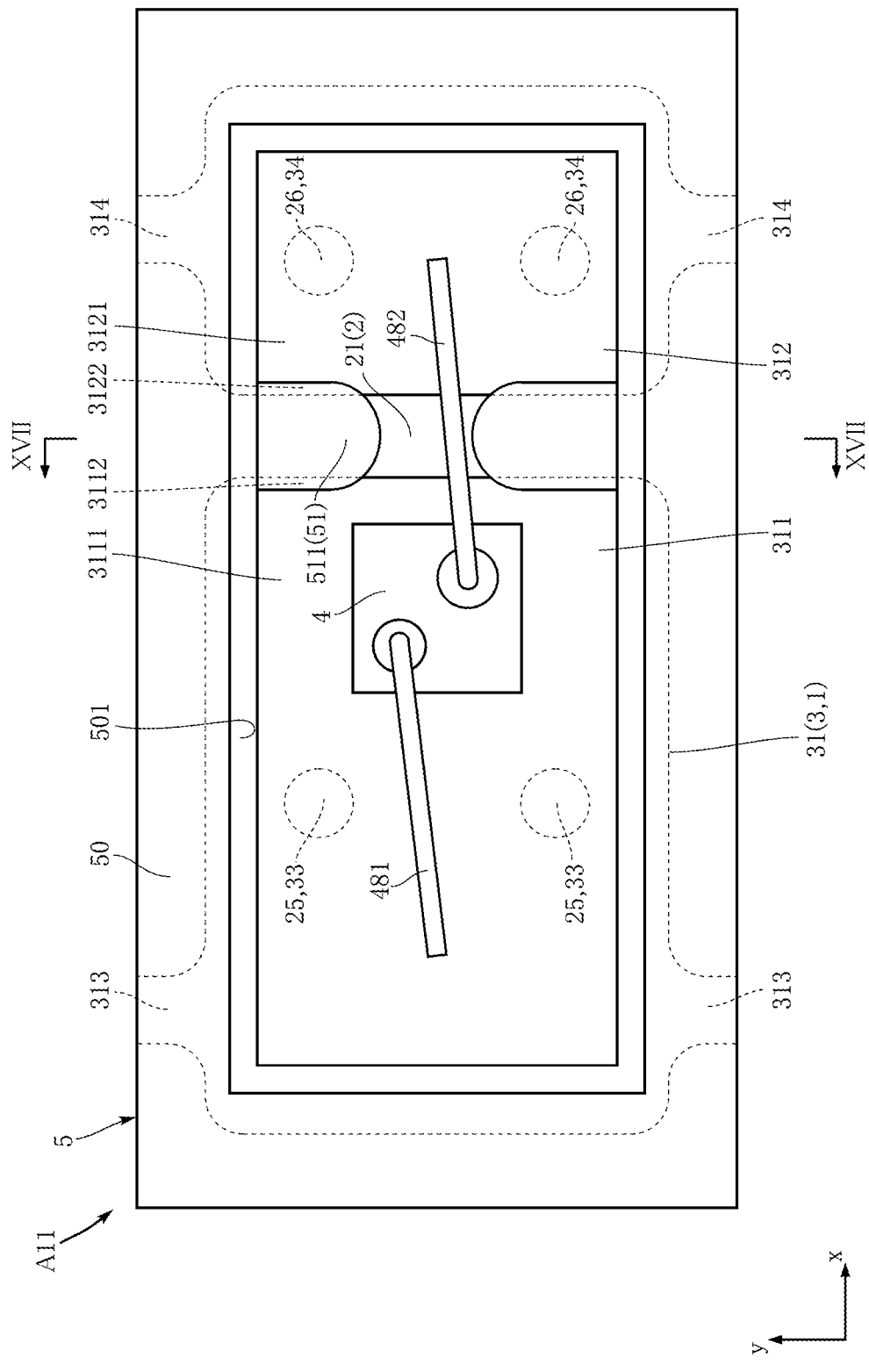
FIG. 16 is a plan view showing a first variation of the semiconductor light-emitting device according to the first embodiment of the first aspect.
Figure 17:
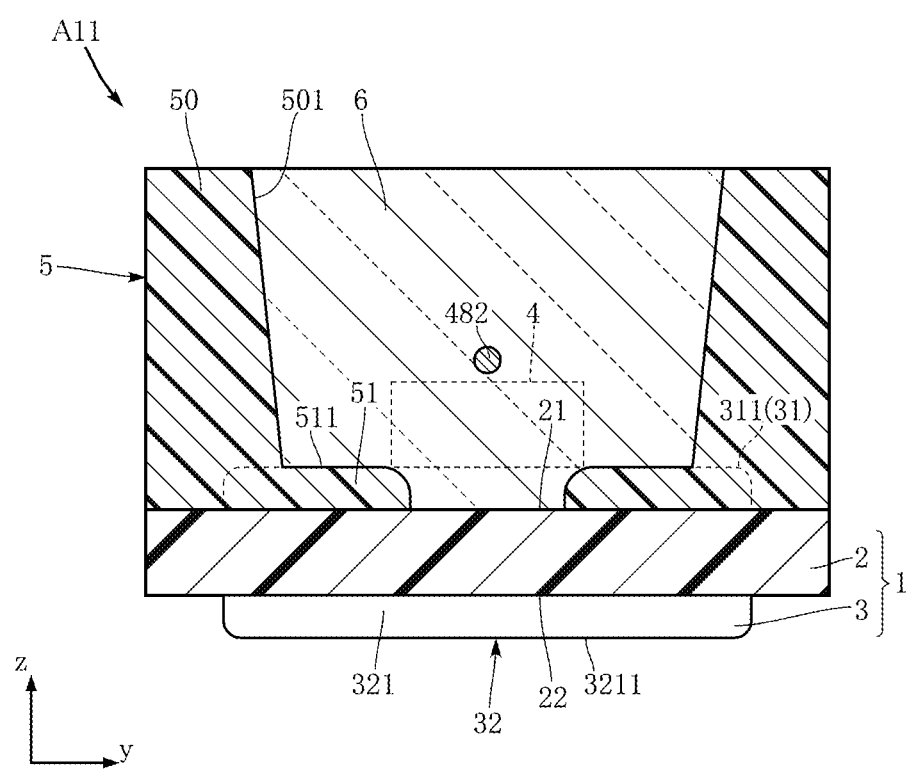
FIG. 17 is a sectional view taken along line XVII-XVII in FIG. 16.

FIGS. 16 and 17 show a first variation of the semiconductor light-emitting device A1. FIG. 16 is a plan view showing the semiconductor light-emitting device A11 of this variation. FIG. 17 is a sectional view taken along line XVII-XVII in FIG. 16.

The semiconductor light-emitting device A11 differs from the semiconductor light-emitting device A1 in configuration of the front-surface covering portion 51. The front-surface covering portion 51 of this variation has a shape broken in the middle in the y direction. More specifically, the front-surface covering portion 51 is broken at or near the middle in the y direction and divided into two portions. However, each part of the front-surface covering portion 51 is connected to the frame-shaped portion 50. Such a front-surface covering portion 51 may be formed due to the conditions for loading the resin material shown in FIGS. 12 and 13.

This variation also reduces exposure of the base member 2 to the light from the semiconductor light-emitting element 4. As will be understood from this variation, the front-surface covering portion 51 of the present disclosure is not limited to the configuration covering the entirety of the portion of the front surface 21 that is exposed from the front portion 31, and may cover only a part of the portion of the front surface 21 that is exposed from the front portion 31.

Figure 18:
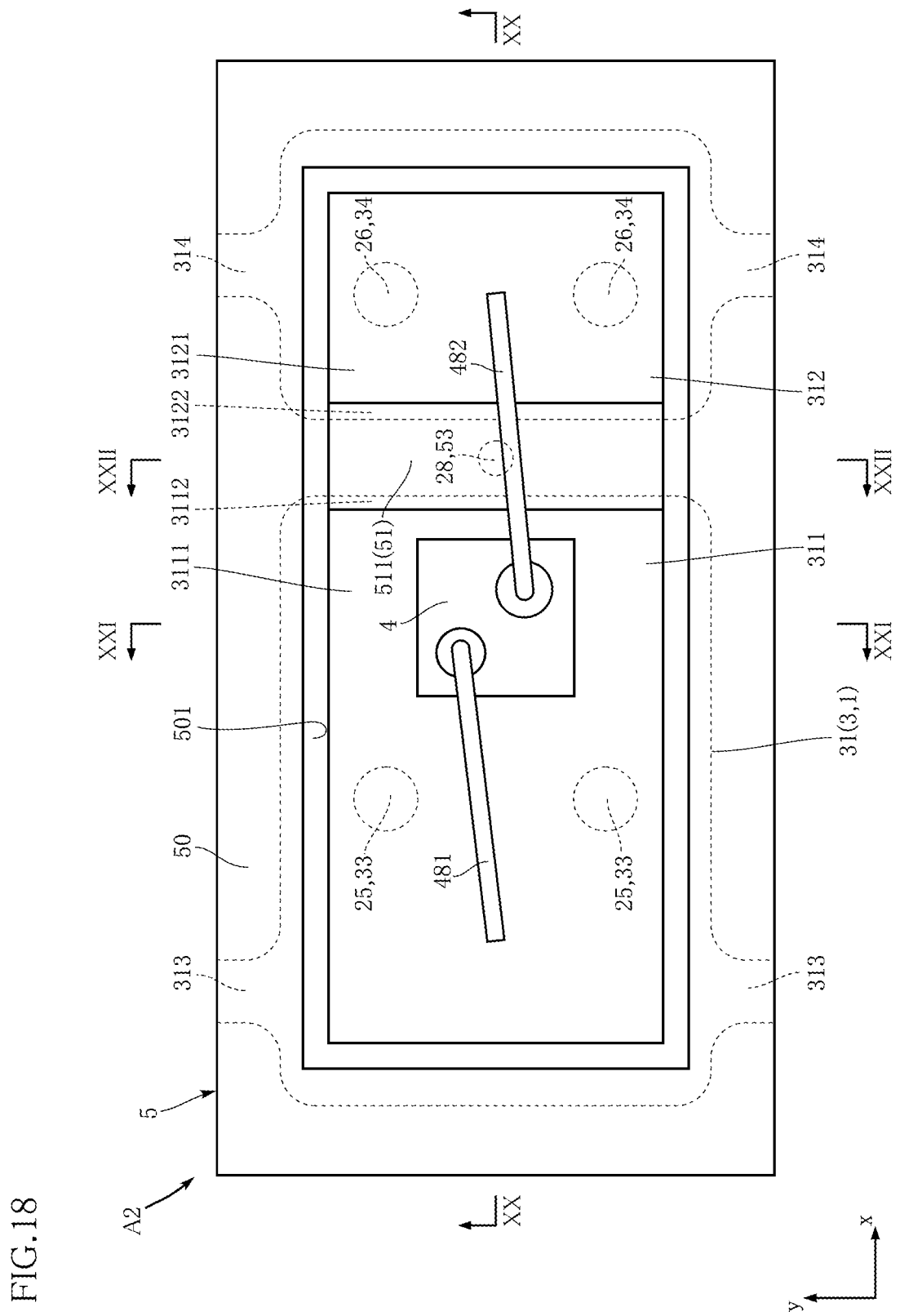
FIG. 18 is a plan view showing a semiconductor light-emitting device according to a second embodiment of the first aspect.
Figure 19:
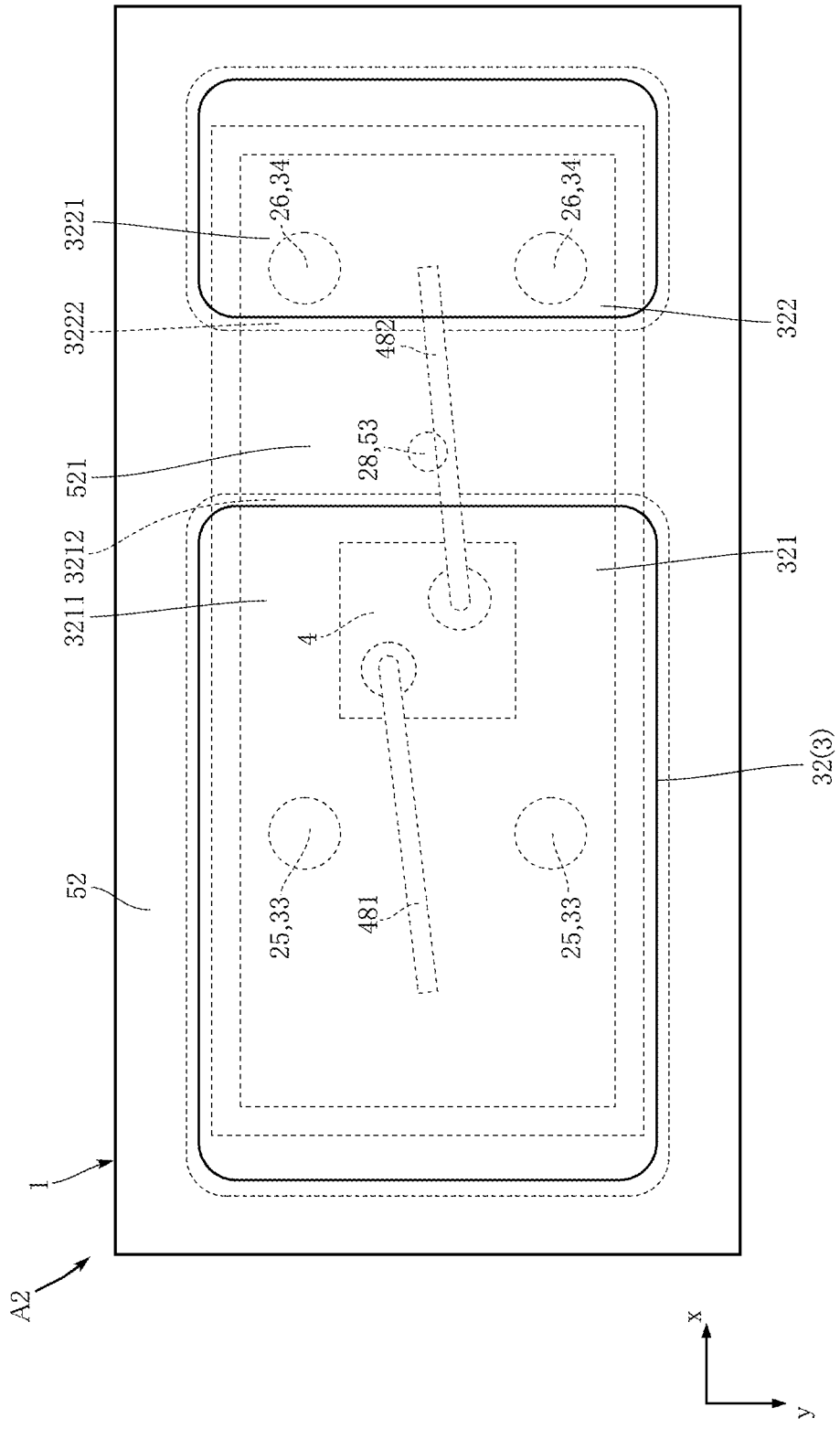
FIG. 19 is a bottom view showing a semiconductor light-emitting device according to the second embodiment of the first aspect.
Figure 20:
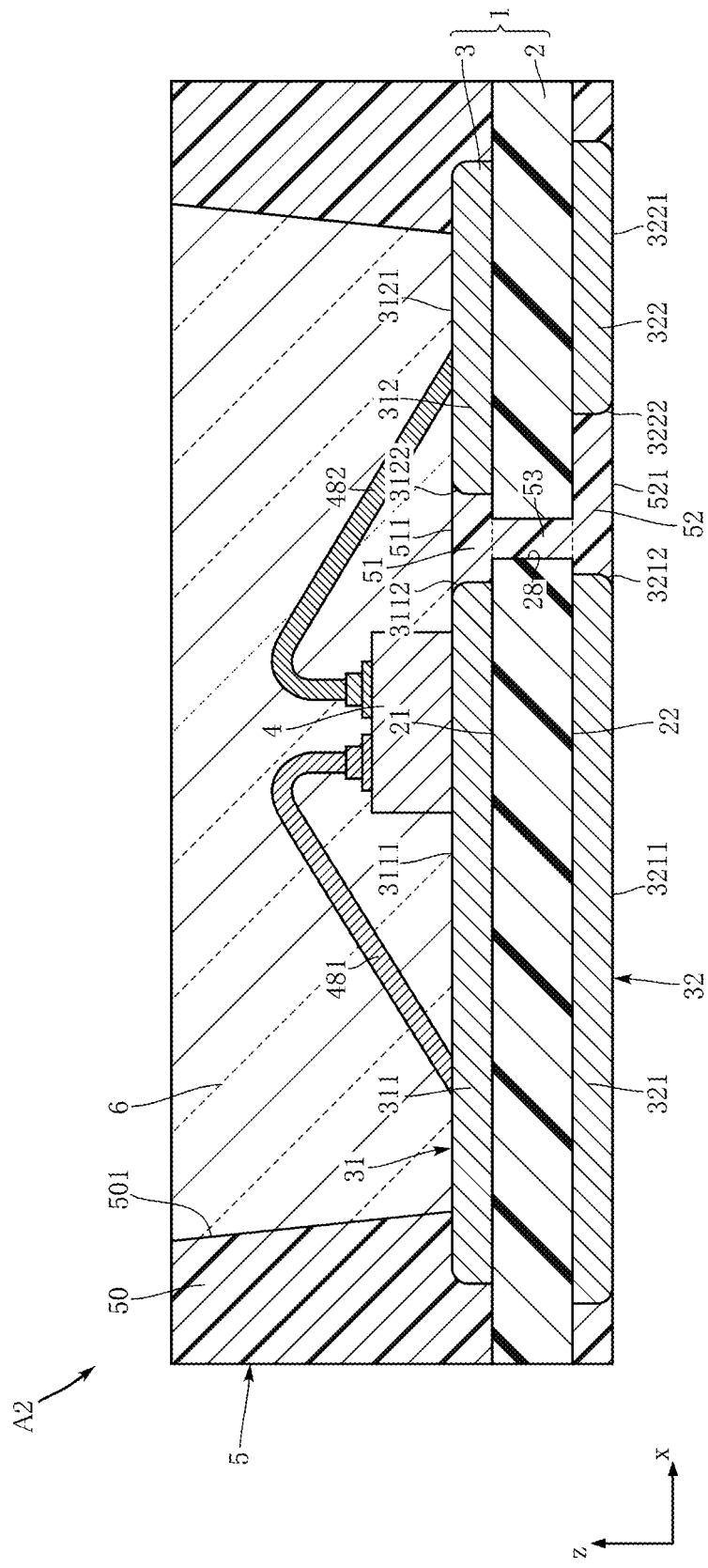
FIG. 20 is a sectional view taken along line XX-XX in FIG. 18.
Figure 21:
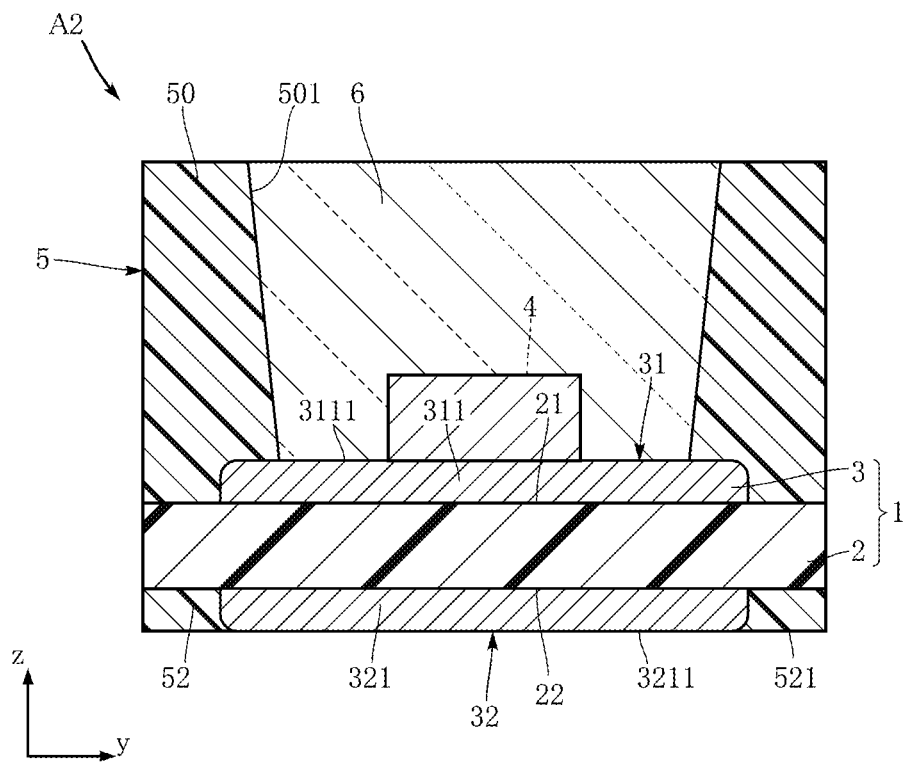
FIG. 21 is a sectional view taken along line XXI-XXI in FIG. 18.
Figure 22:
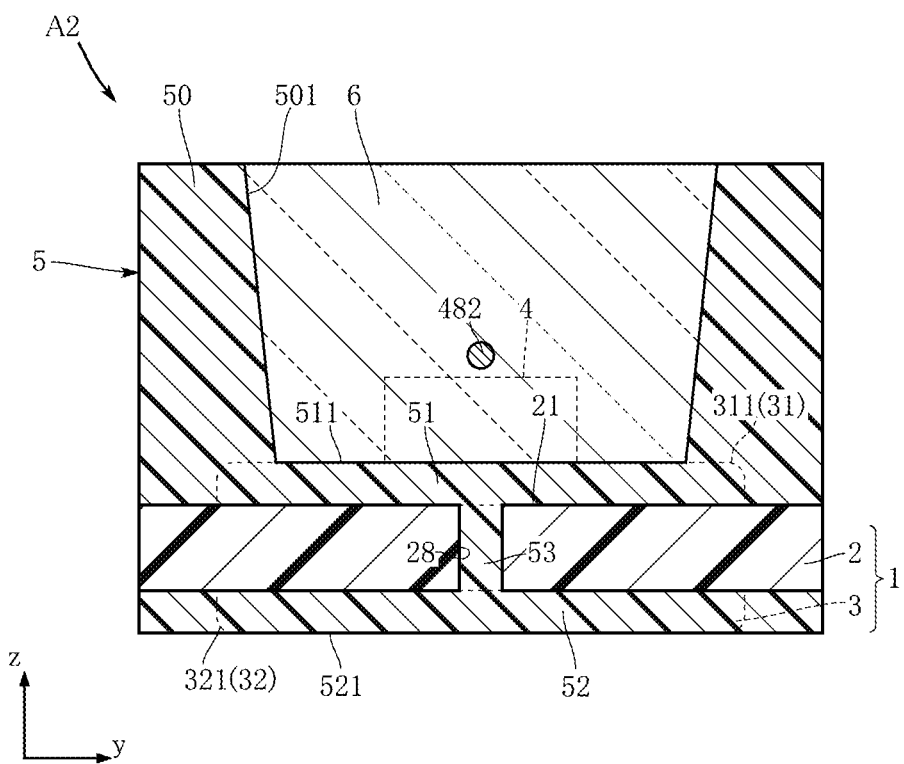
FIG. 22 is a sectional view taken along line XXII-XXII in FIG. 18.
Figure 23:
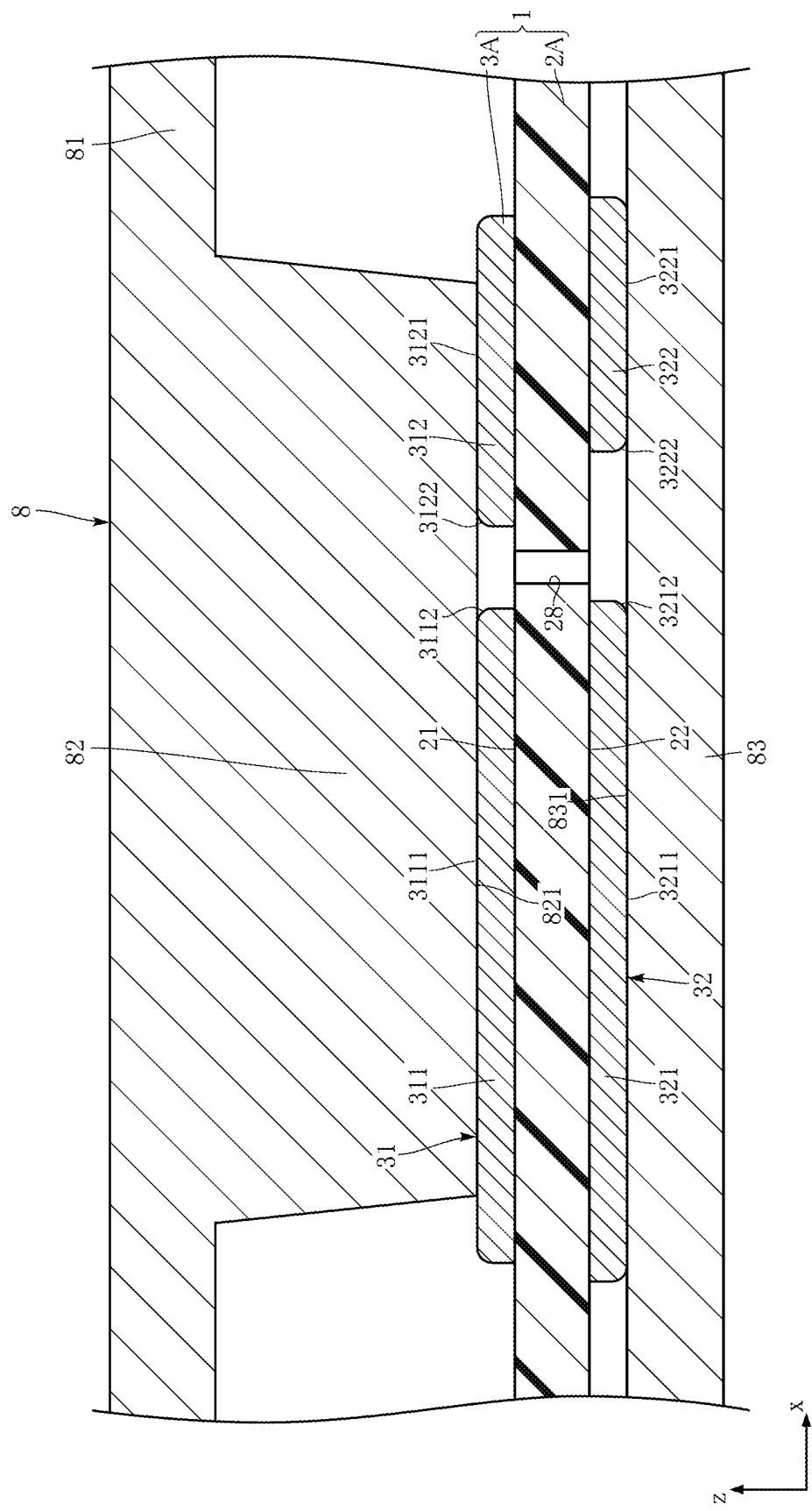
FIG. 23 is a sectional view showing a step of a method for manufacturing a semiconductor light-emitting device according to the second embodiment of the first aspect.

FIGS. 18-23 show a semiconductor light-emitting device A2 according to a second embodiment of the first aspect of the present disclosure. FIG. 18 is a plan view showing the semiconductor light-emitting device A2. FIG. 19 is a bottom view showing the semiconductor light-emitting device A2. FIG. 20 is a sectional view taken along line XX-XX in FIG. 18. FIG. 21 is a sectional view taken along line XXI-XXI in FIG. 18. FIG. 22 is a sectional view taken along line XXII-XXII in FIG. 18. FIG. 23 is a sectional view showing a step of a method for manufacturing the semiconductor light-emitting device A2.

In the second embodiment of the first aspect, the base member 2 has a resin member through-hole 28. The resin member through-hole 28 penetrates the base member 2 and overlaps with the front-surface covering portion 51 as viewed in the z direction.

The resin member 5 includes a front-surface covering portion 51, a back-surface covering portion 52 and a connecting portion 53. The back-surface covering portion 52 covers a portion of the back surface 22 of the base member 2 that is exposed from the back portion 32. The back-surface covering portion 52 has a back-surface covering-portion first surface 521. The back-surface covering-portion first surface 521 faces the side which the back surface 22 faces and is a flat surface perpendicular to the z direction in the illustrated example. The back-surface covering-portion first surface 521 is flush with a back-portion first surface 3211 and a back-portion second surface 3221. The back-surface covering portion 52 covers a back-portion first inclined surface 3212 of the back first portion 321 and a back-portion second inclined surface 3222 of the back second portion 322.

The connecting portion 53 is formed in the resin member through-hole 28 of the base member 2 and penetrates the base member 2. The connecting portion 53 is connected to the back-surface covering portion 52. In the illustrated example, the connecting portion 53 is connected to the front-surface covering portion 51. Unlike the illustrated example, the connecting portion 53 may be connected to the frame-shaped portion 50.

As shown in FIG. 23, in manufacturing the semiconductor light-emitting device A2, a secondary part 83 of the mold 8 is pressed against the back surface 22 side of the base member 2A. The secondary part 83 has a contacting surface 831. The contacting surface 831 is a flat surface perpendicular to the z direction. The contacting surface 831 comes into contact with the back-portion first surface 3211 of the back first portion 321 and the back-portion second surface 3221 of the back second portion 322. A gap is formed between the contacting surface 831 and a portion of the back surface 22 that is exposed from the back portion 32. The resin material loaded between the main part 81 or the projection 82 and the substrate 1 is loaded into the gap between the secondary part 83 and the back surface 22 through the resin member through-hole 28. By hardening the resin material, the resin member 5 of the semiconductor light-emitting device A2 is obtained.

According to the second embodiment of the first aspect again, exposure of the base member 2 to the light from the semiconductor light-emitting element 4 is reduced. According to the second embodiment of the first aspect, the front-surface covering portion 51 is connected to the back-surface covering portion 52 via the connecting portion 53. With such an arrangement, the front-surface covering portion 51 along with the frame-shaped portion 50 and the base member 2 prevent each other's separation from the base member 2.

Figure 24:
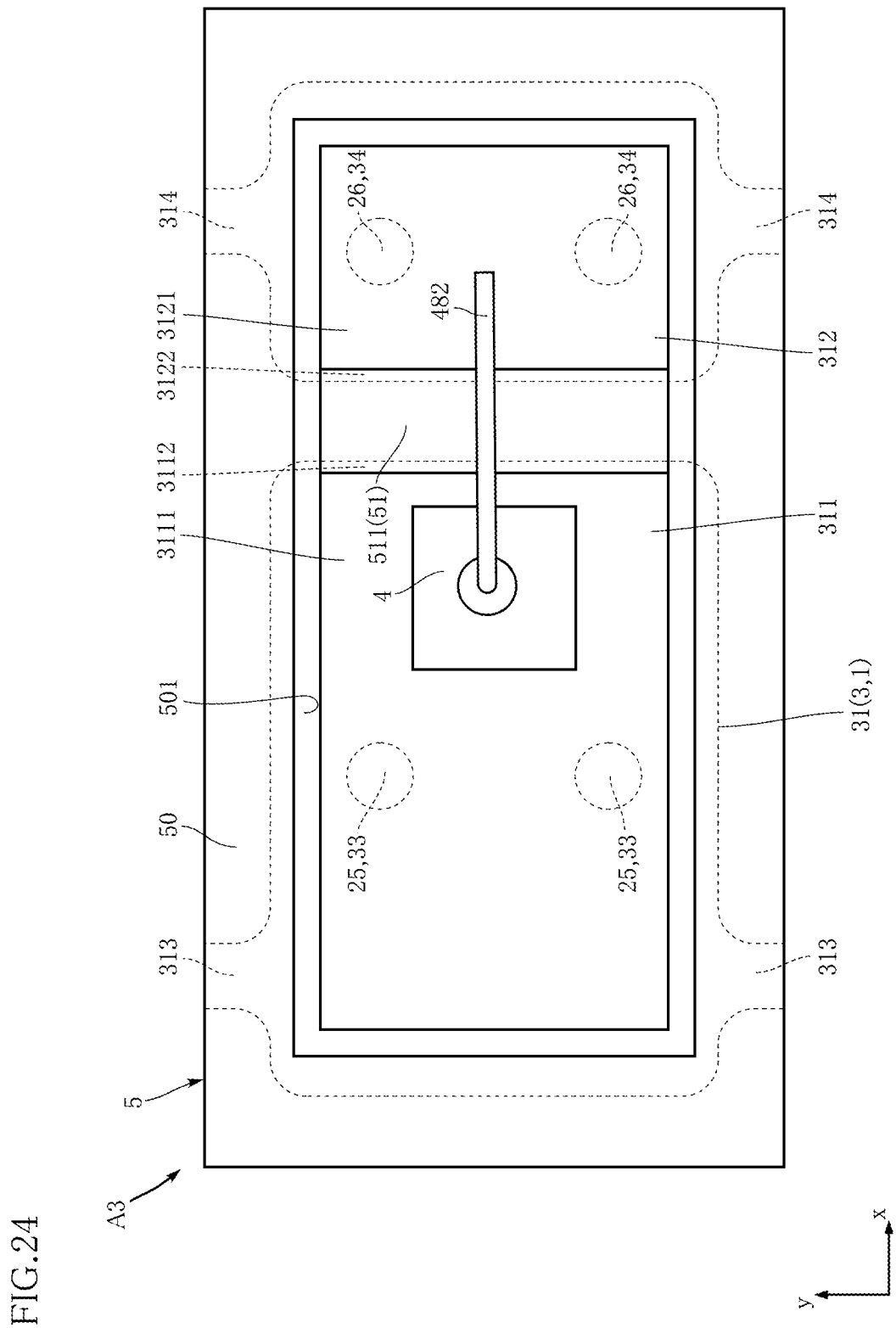
FIG. 24 is a plan view showing a semiconductor light-emitting device according to a third embodiment of the first aspect.

FIG. 24 is a plan view showing a semiconductor light-emitting device A3 according to a third embodiment based on the first aspect. The semiconductor light-emitting device A3 differs from the foregoing embodiments in configuration of the semiconductor light-emitting element 4. To the semiconductor light-emitting element 4 according to the third embodiment of the first aspect, the second wire 482 is connected, but the first wire 481 is not connected. The semiconductor light-emitting element 4 has an electrode (not shown) facing the front first portion 311, and this electrode is electrically bonded to the front-portion first surface 3111. The semiconductor light-emitting element 4 is a one-wire LED chip. In this case, the semiconductor light-emitting element 4 is formed with electrodes on its opposite sides in the z direction. One of the electrodes, to which the second wire 482 is bonded, is electrically connected to the front second portion 312. The other one of the electrodes is electrically bonded to the front-portion first surface 3111 of the front portion 31. This electrical bonding is performed using a conductive bonding material such as Ag paste, for example.

According to the third embodiment of the first aspect again, exposure of the base member 2 to the light from the semiconductor light-emitting element 4 is reduced.

Figure 25:
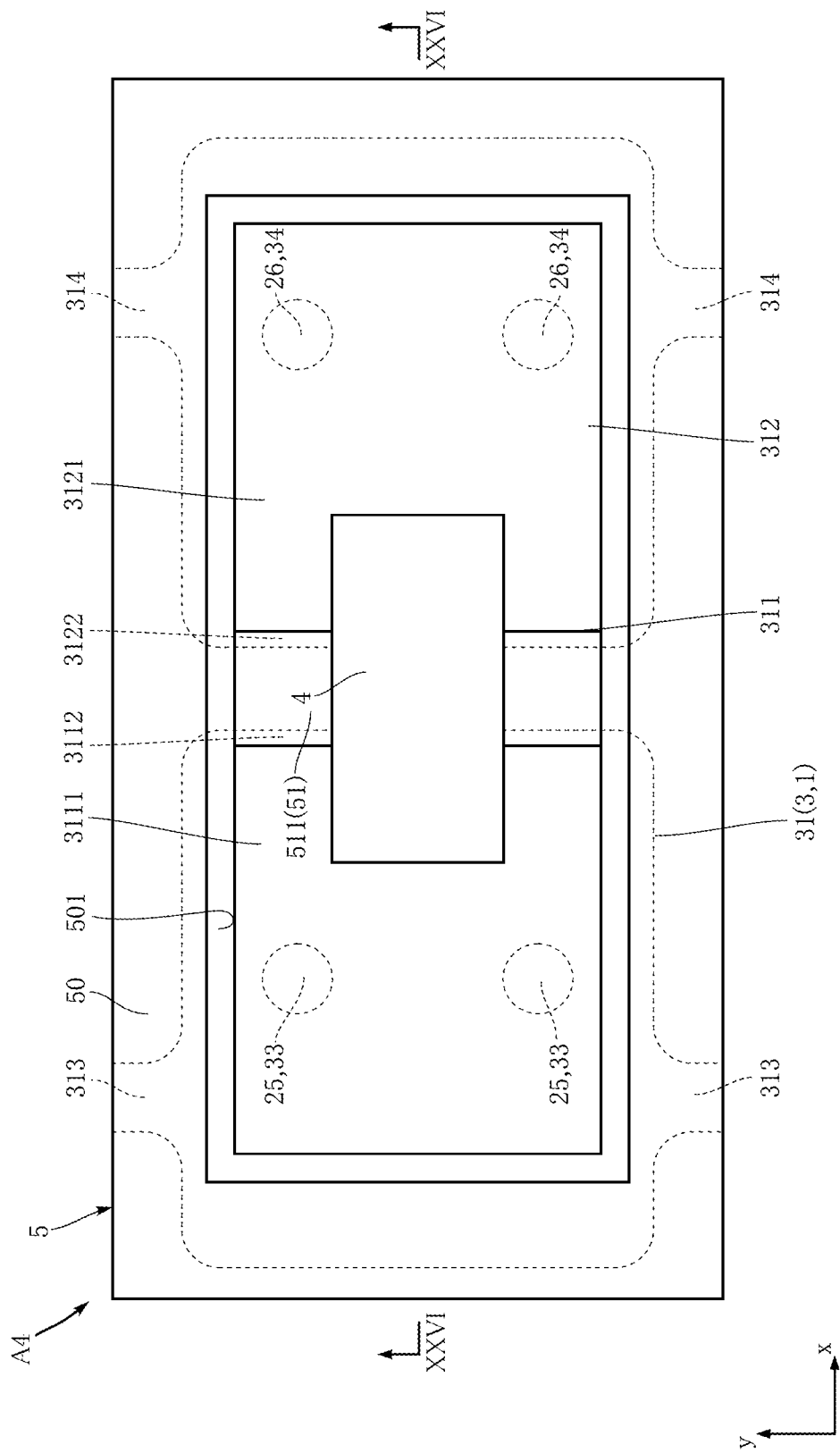
FIG. 25 is a plan view showing a semiconductor light-emitting device according to a fourth embodiment of the first aspect.
Figure 26:
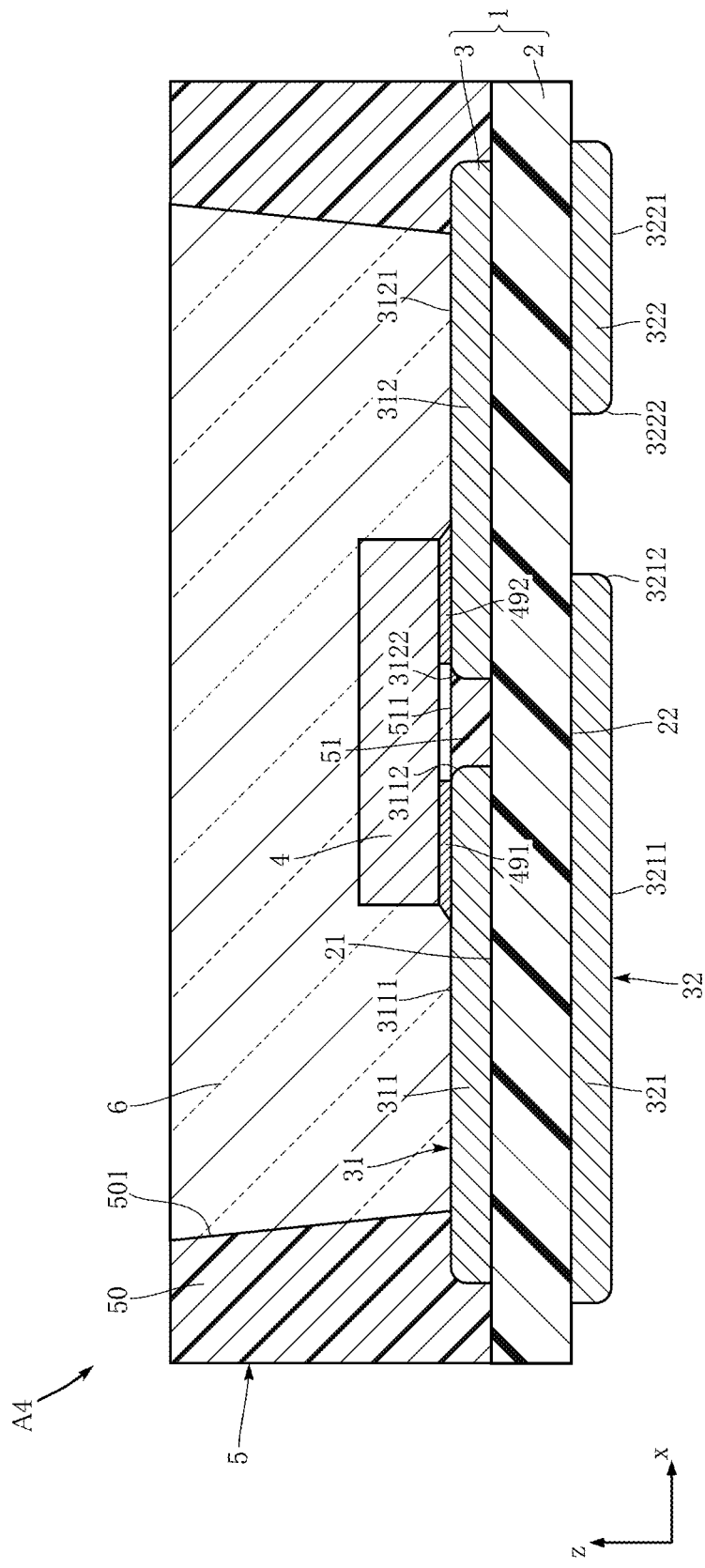
FIG. 26 is a sectional view taken along line XXVI-XXVI in FIG. 25.

FIGS. 25 and 26 show a semiconductor light-emitting device A4 according to a fourth embodiment of the first aspect. FIG. 25 is a plan view showing the semiconductor light-emitting device A4. FIG. 26 is a sectional view taken along line XXVI-XXVI in FIG. 25.

The semiconductor light-emitting element 4 according to the fourth embodiment of the first aspect is a flip-chip LED chip. One of the electrodes of the semiconductor light-emitting element 4 is electrically bonded to the front first portion 311 with a first conductive bonding material 491. The other one of the electrodes of the semiconductor light-emitting element 4 is electrically bonded to the front second portion 312 with a second conductive bonding material 492. The first conductive bonding material 491 and the second conductive bonding material 492 are solder or Ag paste, for example.

According to the fourth embodiment of the first aspect again, exposure of the base member 2 to the light from the semiconductor light-emitting element 4 is reduced. As will be understood from the semiconductor light-emitting device A3 and the semiconductor light-emitting device A4, the specific configuration of the semiconductor light-emitting element 4 according to the present disclosure is not limited in any way and may be selected in combination with various implementations of other structural elements.

Figure 27:
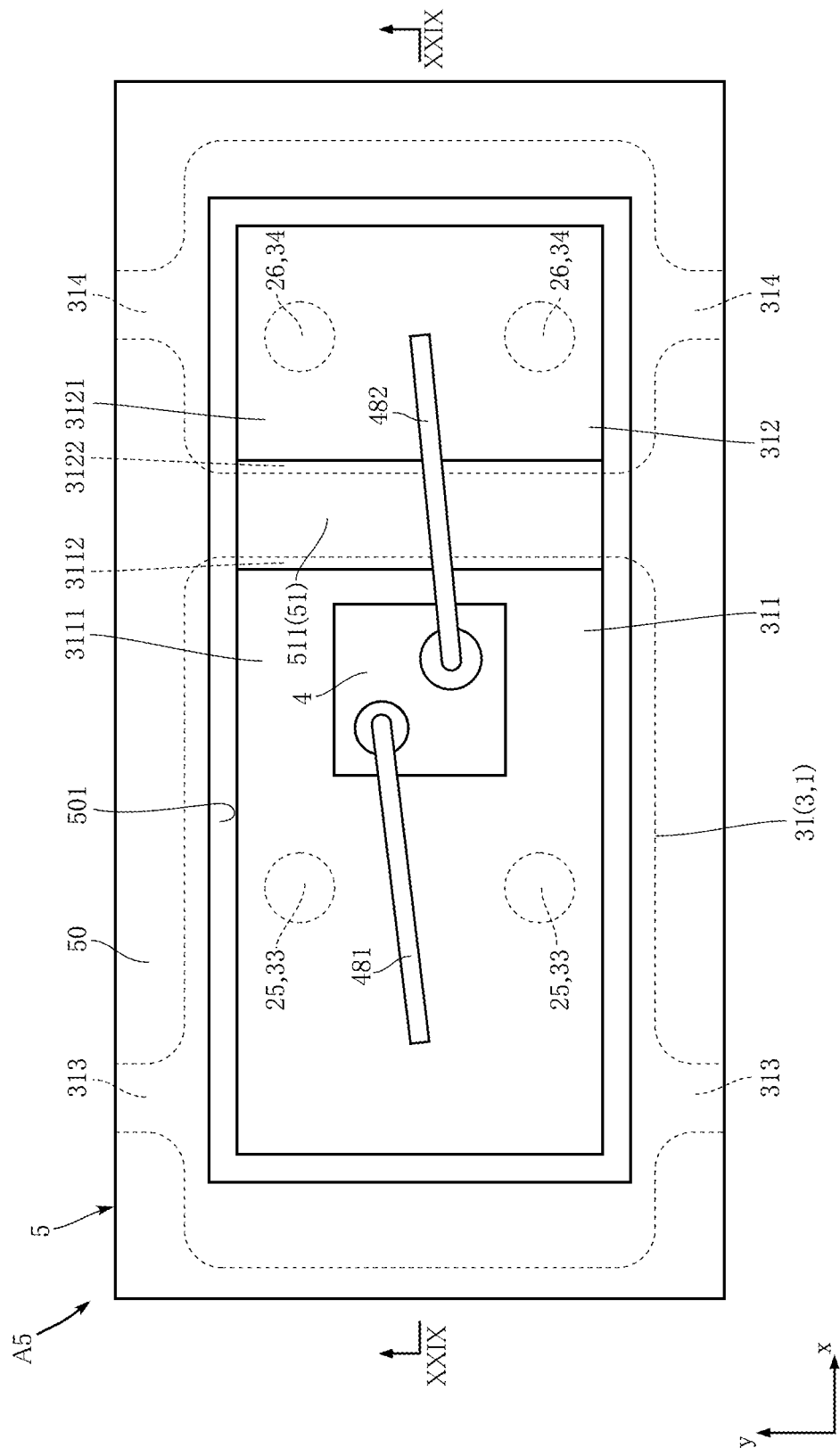
FIG. 27 is a plan view showing a semiconductor light-emitting device according to a fifth embodiment of the first aspect.
Figure 28:
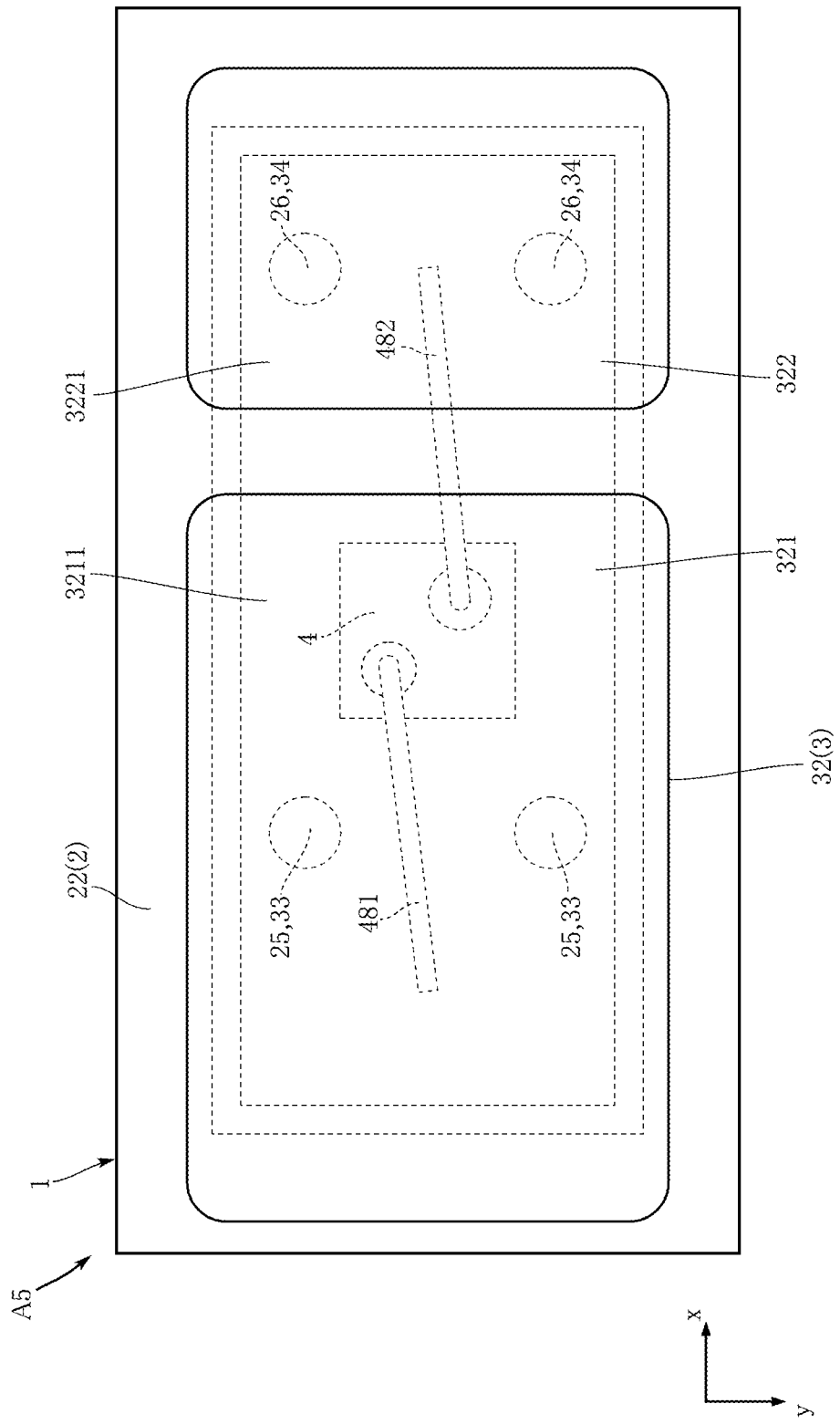
FIG. 28 is a bottom view showing a semiconductor light-emitting device according to a fifth embodiment of the first aspect.
Figure 29:
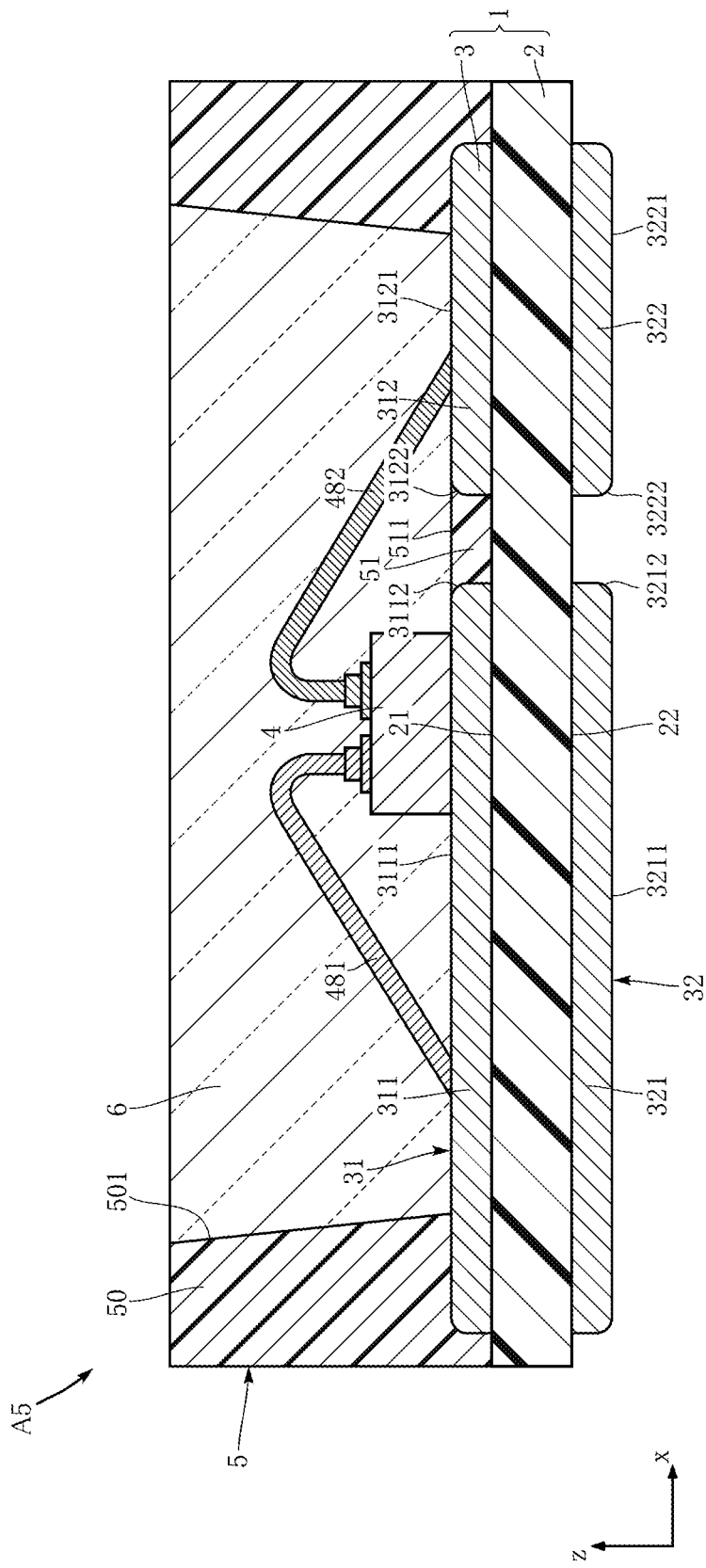
FIG. 29 is a sectional view taken along line XXIX-XXIX in FIG. 27.

FIGS. 27-29 show a semiconductor light-emitting device A5 according to a fifth embodiment of the first aspect. FIG. 27 is a plan view showing the semiconductor light-emitting device A5. FIG. 28 is a bottom view showing the semiconductor light-emitting device A5. FIG. 29 is a sectional view taken along line XXIX-XXIX in FIG. 27. In the fifth embodiment of the first aspect, the front first portion 311 and the back first portion 321 are the same in size, shape and position as viewed in the z direction. Also, the front second portion 312 and the back second portion 322 are the same in size, shape and position as viewed in the z direction.

According to the fifth embodiment of the first aspect again, exposure of the base member 2 to the light from the semiconductor light-emitting element 4 is reduced. Also, as will be understood from the present embodiment described above, the size, shape and arrangement of the front portion 31 and the back portion 32 as viewed in the z direction are not limited to the illustrated examples and may be varied as appropriate. Also, the configuration of the front portion 31 and the back portion 32 of the semiconductor light-emitting device A5 may be appropriately employed in any of the foregoing embodiments.

Figure 30:
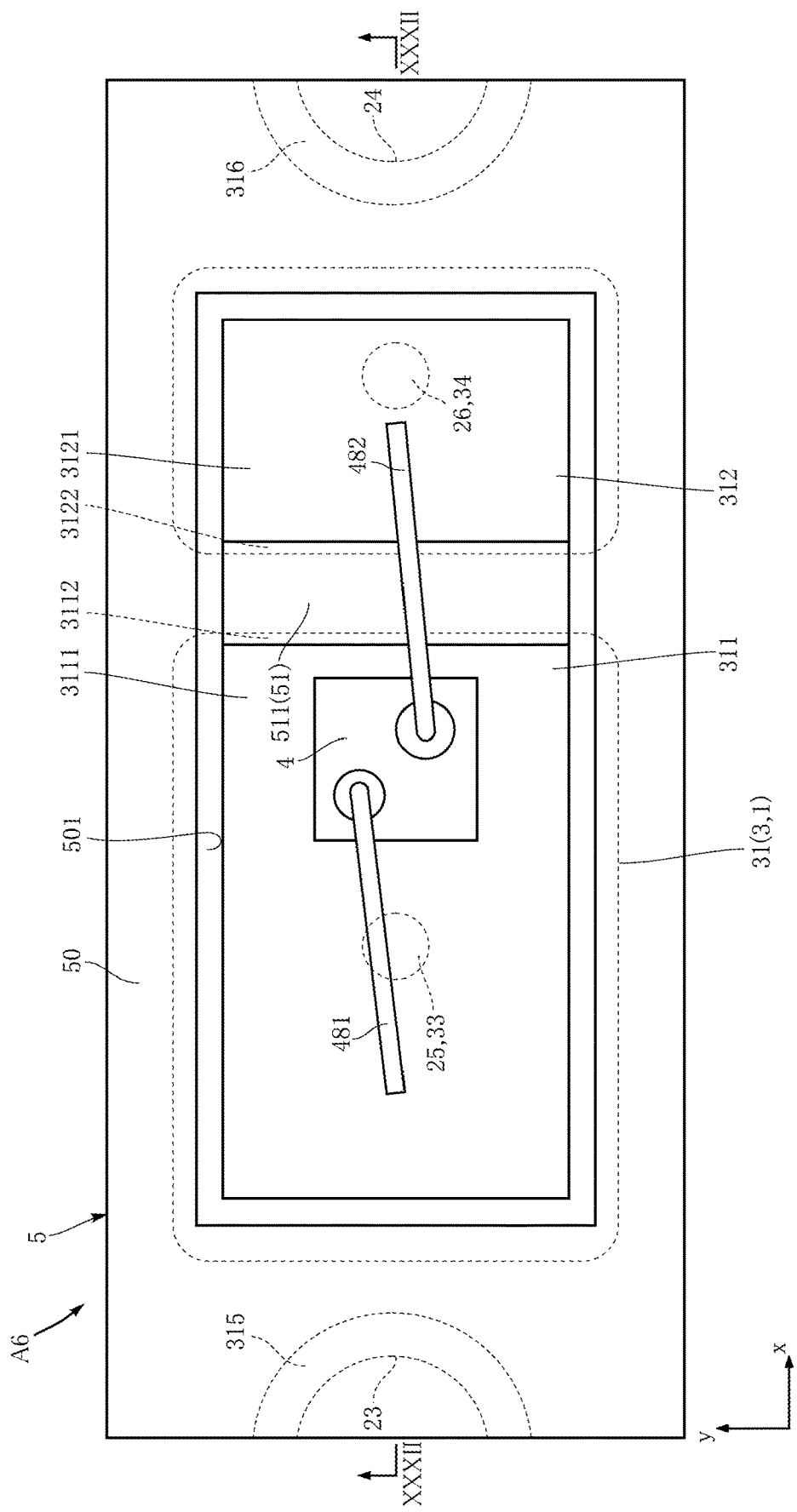
FIG. 30 is a plan view showing a semiconductor light-emitting device according to a sixth embodiment of the first aspect.
Figure 31:
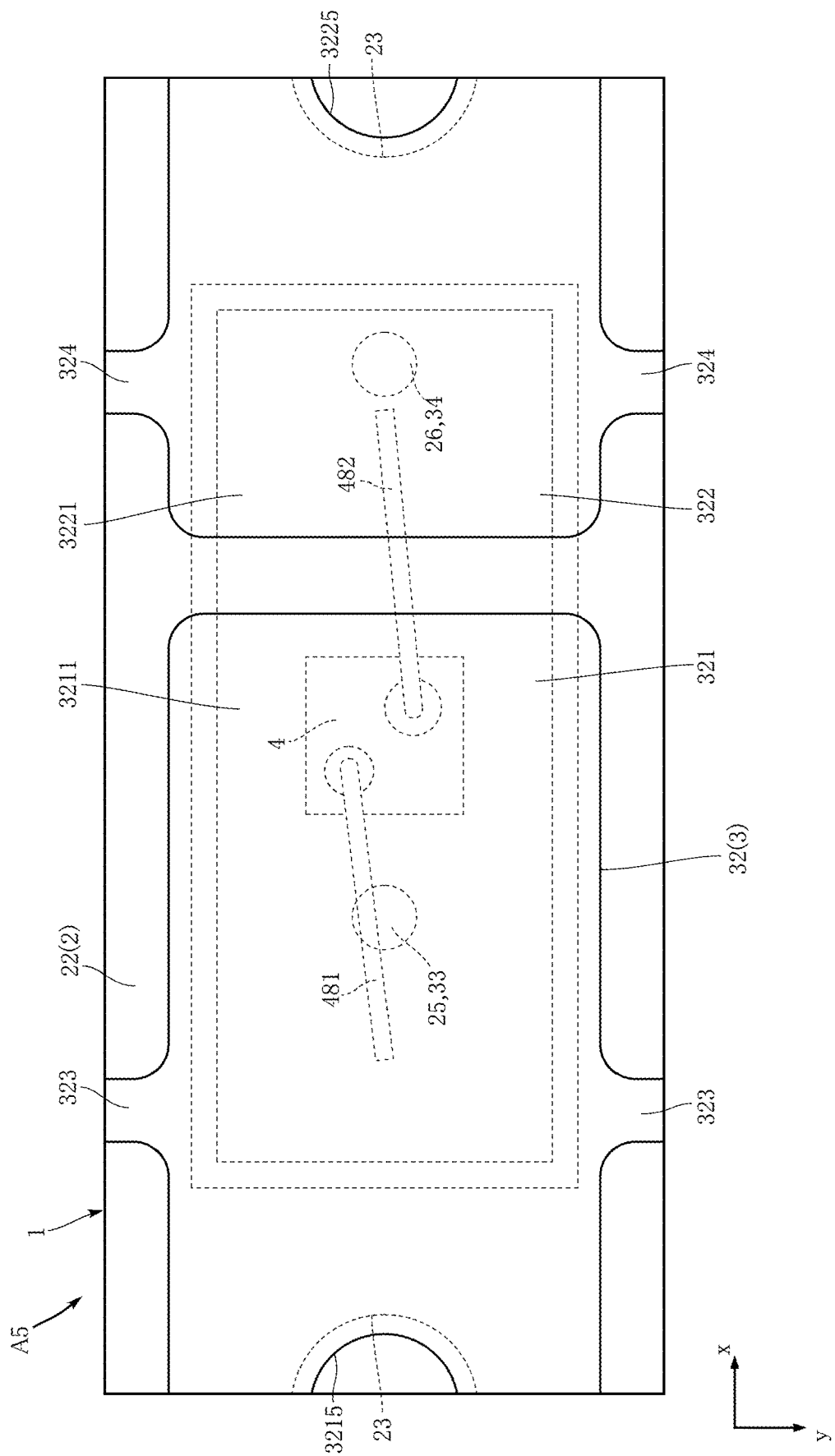
FIG. 31 is a bottom view showing a semiconductor light-emitting device according to the sixth embodiment of the first aspect.
Figure 32:
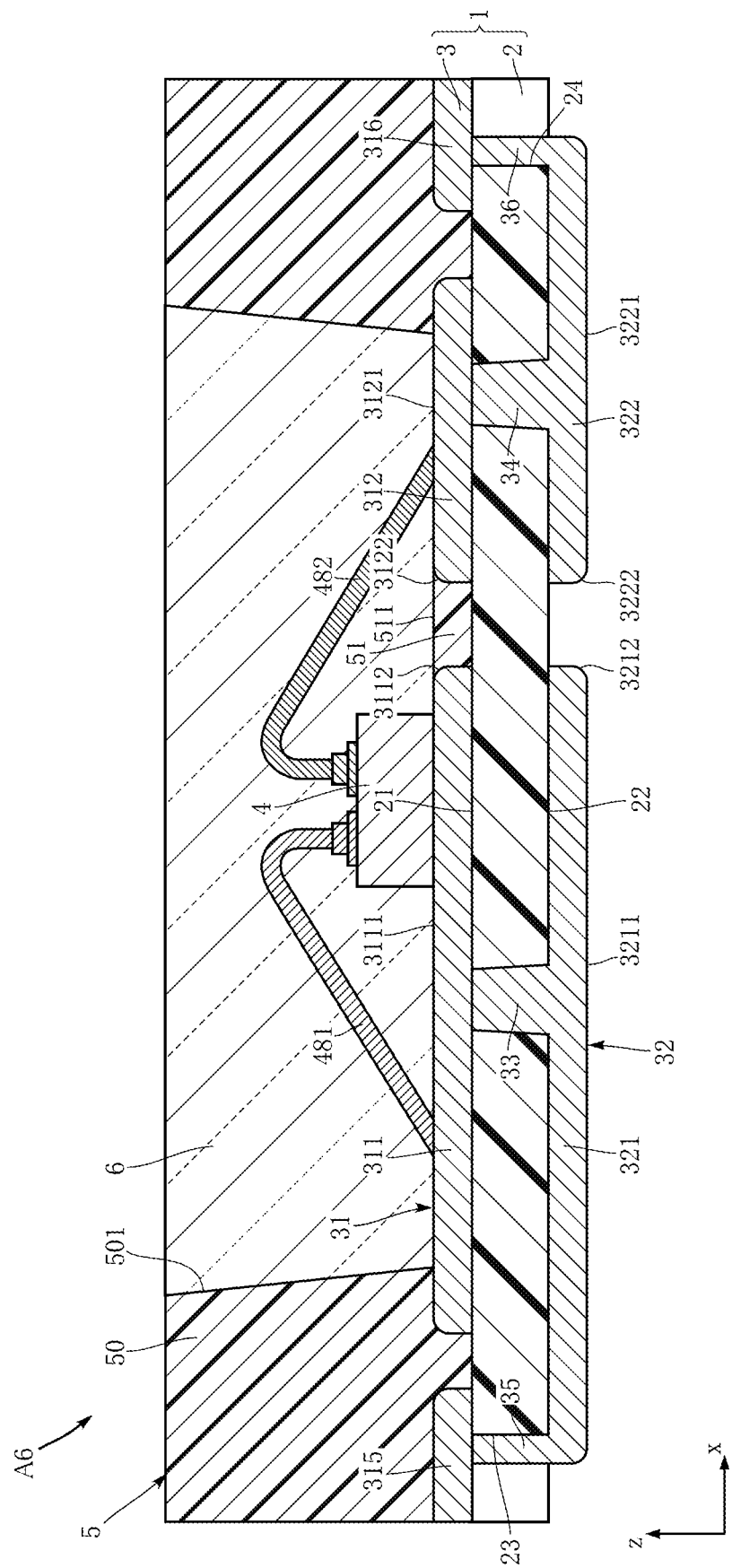
FIG. 32 is a sectional view taken along line XXXII-XXXII in FIG. 30.

FIGS. 30-32 show a semiconductor light-emitting device A6 according to a sixth embodiment of the first aspect. FIG. 30 is a plan view showing a semiconductor light-emitting device A6. FIG. 31 is a bottom view showing the semiconductor light-emitting device A6. FIG. 32 is a sectional view taken along line XXXII-XXXII in FIG. 30.

The base member 2 of the sixth embodiment of the first aspect has a first groove 23 and a second groove 24. The first groove 23 is provided at one end of the base member 2 in the x direction and recessed inward in the x direction. The first groove 23 reaches the front surface 21 and the back surface 22 in the z direction. The specific shape of the first groove 23 is not particularly limited. In the illustrated example, the first groove 23 is generally semicircular. The second groove 24 is provided at the other end of the base member 2 in the x direction and recessed inward in the x direction. The second groove 24 reaches the front surface 21 and the back surface 22 in the z direction. The specific shape of the second groove 24 is not particularly limited. In the illustrated example, the second groove 24 is generally semicircular.

The conductive part 3 according to the sixth embodiment of the first aspect has a front portion 31, a back portion 32, a first connecting portion 33, a second connecting portion 34, a third connecting portion 35 and a fourth connecting portion 36.

The front portion 31 of the sixth embodiment of the first aspect has a front first portion 311, a front second portion 312, a front third portion 315 and a front fourth portion 316. The front portion 31 does not have the first extension 313 and the second extension 314 of the foregoing embodiments. That is, each of the front first portion 311 and the front second portion 312 is spaced apart from the edge of the base member 2 as viewed in the z direction.

The front third portion 315 is provided along one end of the front surface 21 of the base member 2 in the x direction. The front third portion 315 is spaced apart from the front first portion 311 in the x direction. The front third portion 315 closes the first groove 23 from the front surface 21 side in the z direction. The shape of the front third portion 315 is not particularly limited. In the illustrated example, the front third portion 315 is generally semicircular. In the illustrated example, the entirety of the front third portion 315 is covered with the resin member 5. Unlike this, only a part of the front third portion 315 may be covered with the resin member 5, or the entirety of the front third portion 315 may be exposed from the resin member 5.

The front fourth portion 316 is provided along the other end of the front surface 21 of the base member 2 in the x direction. The front fourth portion 316 is spaced apart from the front second portion 312 in the x direction. The front fourth portion 316 closes the second groove 24 from the front surface 21 side in the z direction. The shape of the front fourth portion 316 is not particularly limited. In the illustrated example, the front fourth portion 316 is generally semicircular. In the illustrated example, the entirety of the front fourth portion 316 is covered with the resin member 5. Unlike this, only a part of the front fourth portion 316 may be covered with the resin member 5, or the entirety of the front fourth portion 316 may be exposed from the resin member 5.

The back portion 32 of the sixth embodiment of the first aspect has a back first portion 321, a back second portion 322, a first extension 323 and a second extension 324.

The back first portion 321 of the sixth embodiment of the first aspect reaches one end of the back surface 22 of the base member 2 in the x direction. The back first portion 321 has a recess 3215. The recess 3215 has a shape conforming to the first groove 23 of the base member 2 as viewed in the z direction.

The back second portion 322 of the sixth embodiment of the first aspect reaches the other end of the back surface 22 of the base member 2 in the x direction. The back second portion 322 has a recess 3225. The recess 3225 has a shape conforming to the second groove 24 of the base member 2 as viewed in the z direction.

The first extension 323 is connected to the back first portion 321 and reaches the edge of the base member 2 as viewed in the z direction. In the illustrated example, two first extensions 323 connecting to the back first portion 321 from opposite sides in the y direction are provided.

The second extension 324 is connected to the back second portion 322 and reaches the edge of the base member 2 as viewed in the z direction. In the illustrated example, two second extensions 324 connecting to the back second portion 322 from the opposite sides in the y direction are provided.

The third connecting portion 35 is formed in the first groove 23 of the base member 2 and electrically connects the front third portion 315 and the back first portion 321. In the illustrated example, the third connecting portion 35 is formed integrally with the back first portion 321 by plating. In the illustrated example, the third connecting portion 35 is in the form of a film covering the inner surface of the first groove 23. The present disclosure is not limited to this, and the third connecting portion 35 may fill the entirety of the first groove 23.

The fourth connecting portion 36 is formed in the second groove 24 of the base member 2 and electrically connects the front fourth portion 316 and the back second portion 322. In the illustrated example, the fourth connecting portion 36 is formed integrally with the back second portion 322 by plating. In the illustrated example, the fourth connecting portion 36 is in the form of a film covering the inner surface of the second groove 24. The present disclosure is not limited to this, and the fourth connecting portion 36 may fill the entirety of the second groove 24.

According to the sixth embodiment of the first aspect again, exposure of the base member 2 to the light from the semiconductor light-emitting element 4 is reduced. Also, the provision of the third connecting portion 35 and the fourth connecting portion 36 provides an advantage that a solder fillet is easily formed in mounting the semiconductor light-emitting device A6 to e.g. a circuit board using solder.

The front third portion 315 and the third connecting portion 35 are electrically connected to the front first portion 311 via the back first portion 321 and the first connecting portion 33. Thus, it is not necessary to connect the front first portion 311 and the front third portion 315. Moreover, the front first portion 311 is spaced apart from the outer edge of the base member 2 as viewed in the z direction. With such an arrangement, even when the bonding material for bonding the semiconductor light-emitting element 4 to the front first portion 311 spreads easily over the front first portion 311, undesirable spreading of the bonding material to e.g. the front third portion 315 is prevented.

Since the back portion 32 has the first extension 323 and the second extension 324, in forming the conductive part 3 by plating during the manufacturing process of the semiconductor light-emitting device A6, the first extension 323 and the second extension 324 can be used to establish electrical connection to the outside which is necessary for electroplating.

Figure 33:
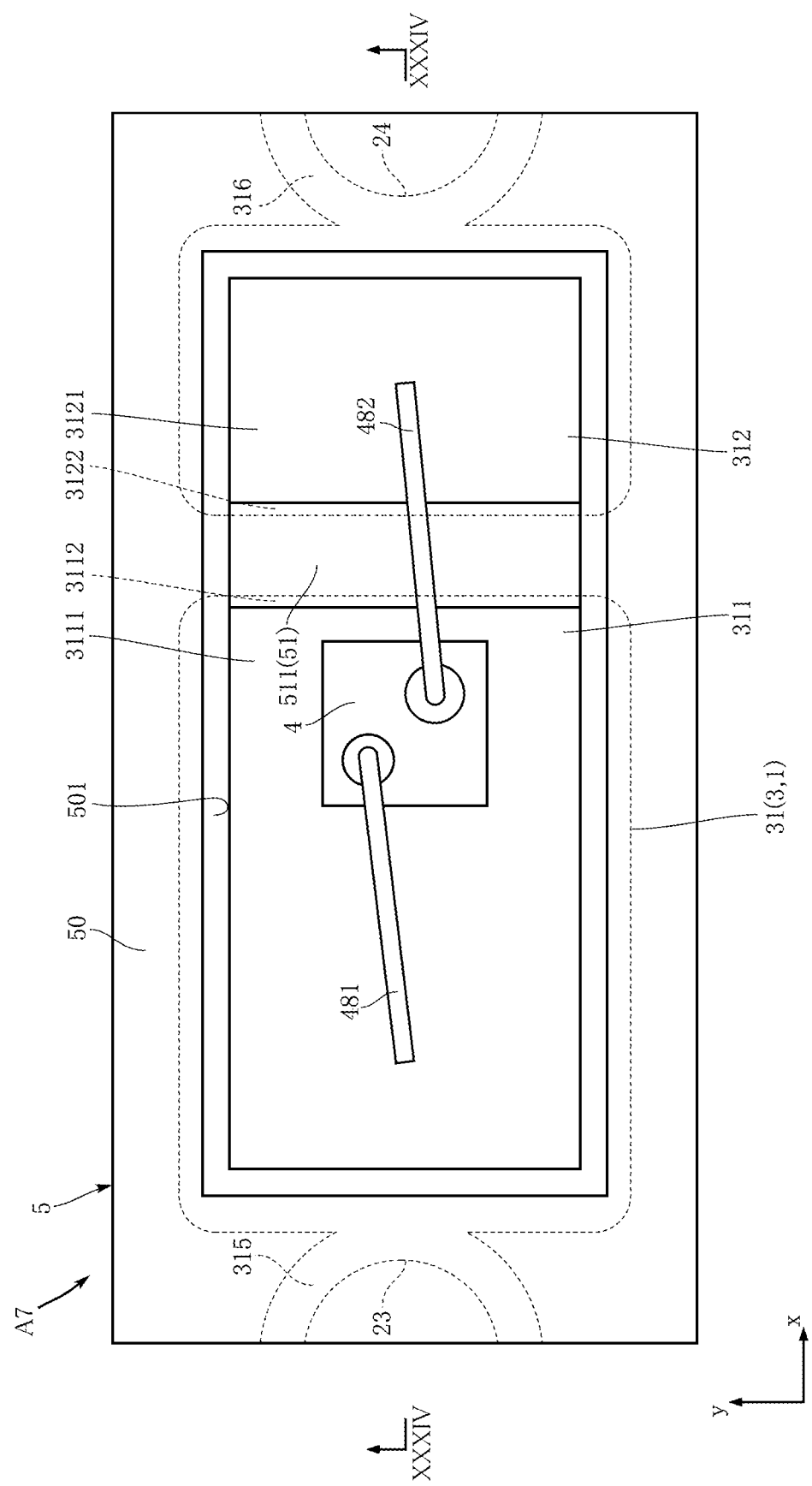
FIG. 33 is a plan view showing a semiconductor light-emitting device according to a seventh embodiment of the first aspect.
Figure 34:
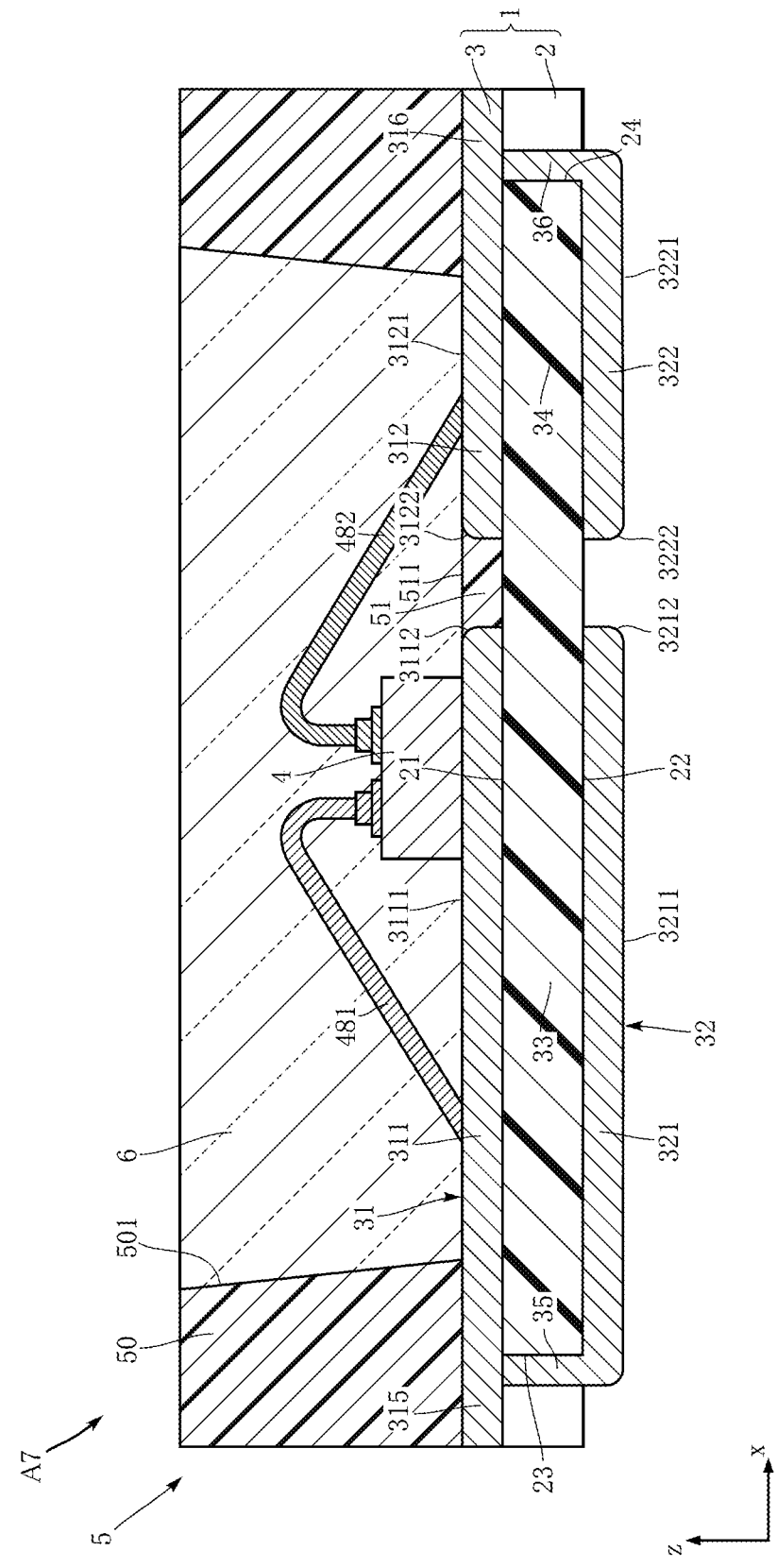
FIG. 34 is a sectional view taken along line XXXIV-XXXIV in FIG. 33.

FIGS. 33 and 34 show a semiconductor light-emitting device A7 according to a seventh embodiment of the first aspect. FIG. 33 is a plan view showing the semiconductor light-emitting device A7. FIG. 34 is a sectional view taken along line XXXIV-XXXIV in FIG. 33.

In the seventh embodiment of the first aspect, the first groove 23 and the second groove 24 of the semiconductor light-emitting device A6 described above are formed in the base member 2, the front portion 31 of the conductive part 3 has the front third portion 315 and the front fourth portion 316, and the conductive part 3 has the third connecting portion 35 and the fourth connecting portion 36.

The conductive part 3 of the seventh embodiment of the first aspect does not have the first connecting portion 33 and the second connecting portion 34 of the foregoing embodiments. Moreover, in the seventh embodiment of the first aspect, the front first portion 311 and the front third portion 315 are connected to each other, and the front second portion 312 and the front fourth portion 316 are connected to each other.

According to the seventh embodiment of the first aspect again, exposure of the base member 2 to the light from the semiconductor light-emitting element 4 is reduced. In the seventh embodiment of the first aspect, the front first portion 311 is electrically connected to the back first portion 321 via the front third portion 315 and the third connecting portion 35. The front second portion 312 is connected to the back second portion 322 via the front fourth portion 316 and the fourth connecting portion 36. With such a configuration, in mounting the semiconductor light-emitting device A7 to e.g. a circuit board, a solder fillet can be formed at the third connecting portion 35 and the fourth connecting portion 36, while the back first portion 321 and the back second portion 322 can be used as mounting electrodes.

The semiconductor light-emitting device and the method for manufacturing the semiconductor light-emitting device based on the first aspect of the present disclosure are not limited to the foregoing embodiments. The configuration of the semiconductor light-emitting device according to the first aspect of the present disclosure and the method for manufacturing the semiconductor light-emitting device may be varied in design in many ways. The semiconductor light-emitting device and the method for manufacturing the semiconductor light-emitting device according to the first aspect of the present disclosure may be defined as in the following clauses 1A-19A.

Clause 1A. A semiconductor light-emitting device comprising:
 a substrate having a base member and a conductive part;
 a semiconductor light-emitting element supported on the substrate; and
 a resin member covering at least a portion of the substrate, wherein
 the base member has a front surface and a back surface that face opposite to each other in a thickness direction,
 the conductive part includes a front portion formed on the front surface,
 the semiconductor light-emitting element is mounted on the front portion, and
 the resin member includes a frame-shaped portion surrounding the semiconductor light-emitting element as viewed in the thickness direction, and a front-surface covering portion connected to the frame-shaped portion and covering a portion of the front surface of the base member that is exposed from the front portion.

Clause 2A. The semiconductor light-emitting device according to clause 1A, wherein the front portion includes a front first portion and a front second portion that are spaced apart from each other in a first direction perpendicular to the thickness direction, and the front-surface covering portion is positioned between the front first portion and the front second portion.

Clause 3A. The semiconductor light-emitting device according to clause 2A, wherein the front first portion has a front-portion first surface that faces a side which the front surface faces,
 the front second portion has a front-portion second surface that faces the side which the front surface faces, and
 the front-surface covering portion has a front-surface covering-portion first surface that is flush with the front-portion first surface and the front-portion second surface.

Clause 4A. The semiconductor light-emitting device according to clause 3A, wherein the front first portion has a front-portion first inclined surface that is connected to the front-portion first surface and inclined so as to become more distant from the front-portion first surface in the first direction as approaching the front surface in the thickness direction, and
 the front-portion first inclined surface is covered with the front-surface covering portion.

Clause 5A. The semiconductor light-emitting device according to clause 4A, wherein the front second portion has a front-portion second inclined surface that is connected to the front-portion second surface and inclined so as to become more distant from the front-portion second surface in the first direction as approaching the front surface in the thickness direction, and
 the front-portion second inclined surface is covered with the front-surface covering portion.

Clause 6A. The semiconductor light-emitting device according to clause 2A or 3A, wherein the front-surface covering portion crosses over a region surrounded, as viewed in the thickness direction, by the frame-shaped portion in a second direction perpendicular to the first direction.

Clause 7A. The semiconductor light-emitting device according to any of clauses 2A-6A, wherein the conductive part includes a back portion formed on the back surface.

Clause 8A. The semiconductor light-emitting device according to clause 7A, wherein the back portion includes a back first portion electrically connected to the front first portion and a back second portion electrically connected to the front second portion.

Clause 9A. The semiconductor light-emitting device according to clause 8A, wherein the resin member includes a back-surface covering portion covering a portion of the back surface that is exposed from the back portion.

Clause 10A. The semiconductor light-emitting device according to clause 9A, wherein the base member has a resin member through-hole penetrating in the thickness direction, and the resin member includes a connecting portion formed in the resin member through-hole and connecting the front-surface covering portion and the back-surface covering portion.

Clause 11A. The semiconductor light-emitting device according to clause 9A or 10A, wherein the back first portion has a back-portion first surface that faces a side which the back surface faces, the back second portion has a back-portion second surface that faces the side which the back surface faces, and the back-surface covering portion has a back-surface covering-portion first surface that is flush with the back-portion first surface and the back-portion second surface.

Clause 12A. The semiconductor light-emitting device according to clause 11A, wherein the back first portion has a back-portion first inclined surface that is connected to the back-portion first surface and inclined so as to become more distant from the back-portion first surface in the first direction as approaching the back surface in the thickness direction, and the back-portion first inclined surface is covered with the back-surface covering portion.

Clause 13A. The semiconductor light-emitting device according to clause 12A, wherein the back second portion has a back-portion second inclined surface that is connected to the back-portion second surface and inclined so as to become more distant from the back-portion second surface in the first direction as approaching the back surface in the thickness direction, and the back-portion second inclined surface is covered with the back-surface covering portion.

Clause 14A. The semiconductor light-emitting device according to any of clauses 2A-13A, wherein the semiconductor light-emitting element is mounted on the front first portion.

Clause 15A. The semiconductor light-emitting device according to clause 14A, further comprising a wire connected to the semiconductor light-emitting element and the front second portion.

Clause 16A. The semiconductor light-emitting device according to clause 15A, further comprising a wire connected to the semiconductor light-emitting element and the front first portion.

Clause 17A. The semiconductor light-emitting device according to any of clauses 2A-13A, wherein the semiconductor light-emitting element is electrically bonded to the front first portion and the front second portion.

Clause 18A. The semiconductor light-emitting device according to clauses 1A-16A, further comprising a light-transmittable resin member loaded in a space surrounded by the frame-shaped portion and covering the semiconductor light-emitting element, the resin member allowing light from the semiconductor light-emitting element to pass therethrough.

Clause 19A. A method for manufacturing a semiconductor light-emitting device, the method comprising the steps of:

preparing a substrate including a base member and a conductive front portion formed on a front surface of the base member, the front portion including a front first portion and a front second portion;

loading a resin material into a space defined by the substrate and a mold, with an end surface of a projection of the mold held in contact with the front first portion and the front second portion, with a gap formed between the end surface of the projection and the front surface, hardening the resin material to form a resin member including a frame-shaped portion and a front-surface covering portion; and mounting a semiconductor light-emitting element in a region surrounded by the frame-shaped portion, wherein the front-surface covering portion covers a portion of the front surface of the base member that is exposed from the front portion, the front-surface covering portion being connected to the frame-shaped portion.

Figure 35:
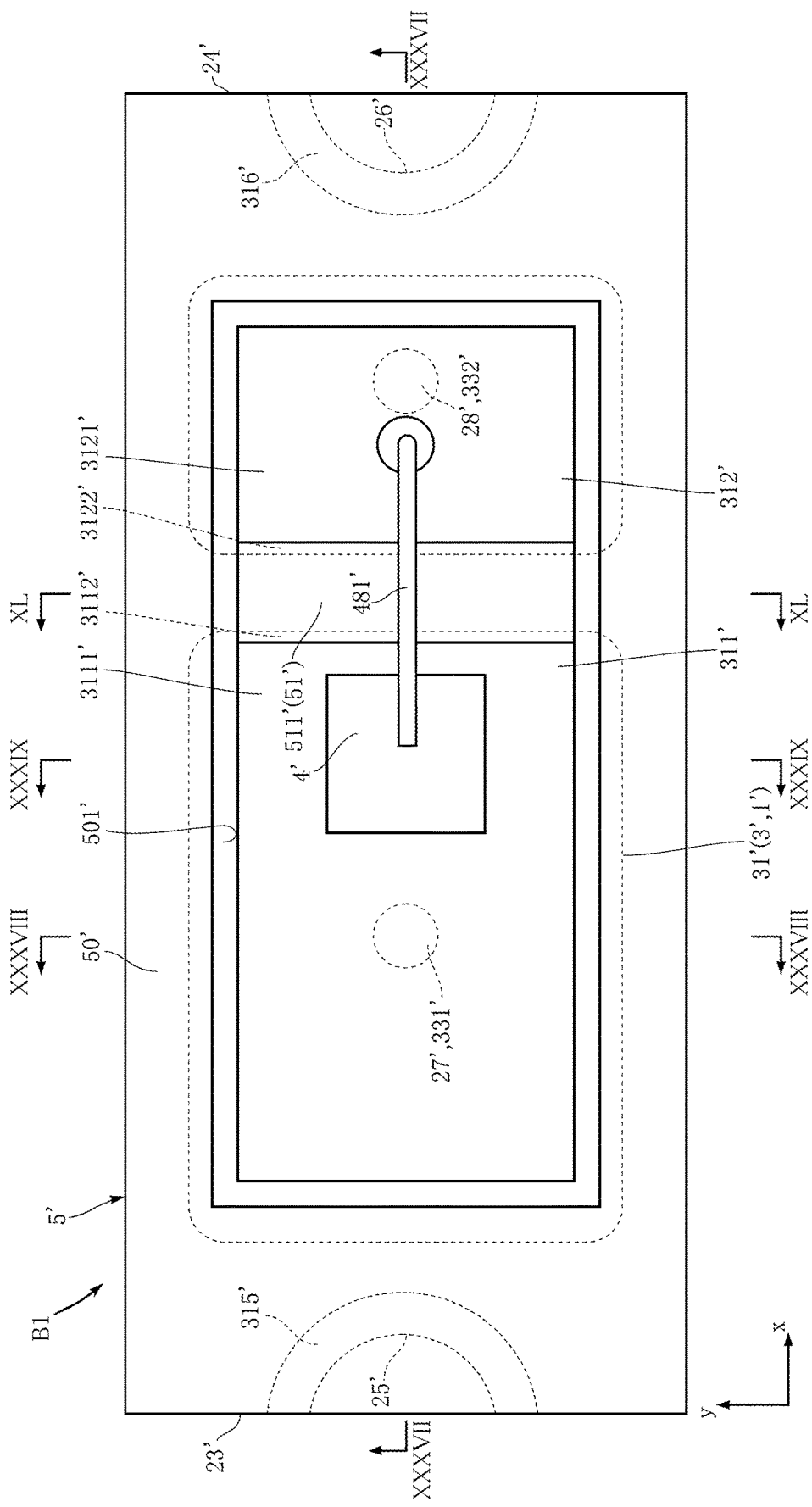
FIG. 35 is a plan view showing a semiconductor light-emitting device according to a first embodiment based on a second aspect.

Next, a semiconductor light-emitting element according to a second aspect of the present disclosure and a method for manufacturing the semiconductor light-emitting device are described. FIGS. 35-40 show a semiconductor light-emitting device according to a first embodiment of the second aspect of the present disclosure. The semiconductor light-emitting device B1 illustrated in the figure includes a substrate 1', a semiconductor light-emitting element 4', a resin member 5' and a light-transmittable resin member 6'. In FIG. 35, the resin member 6' is omitted. FIG. 41-45 are the views for describing the method for manufacturing the semiconductor light-emitting device B1.

Figure 36:
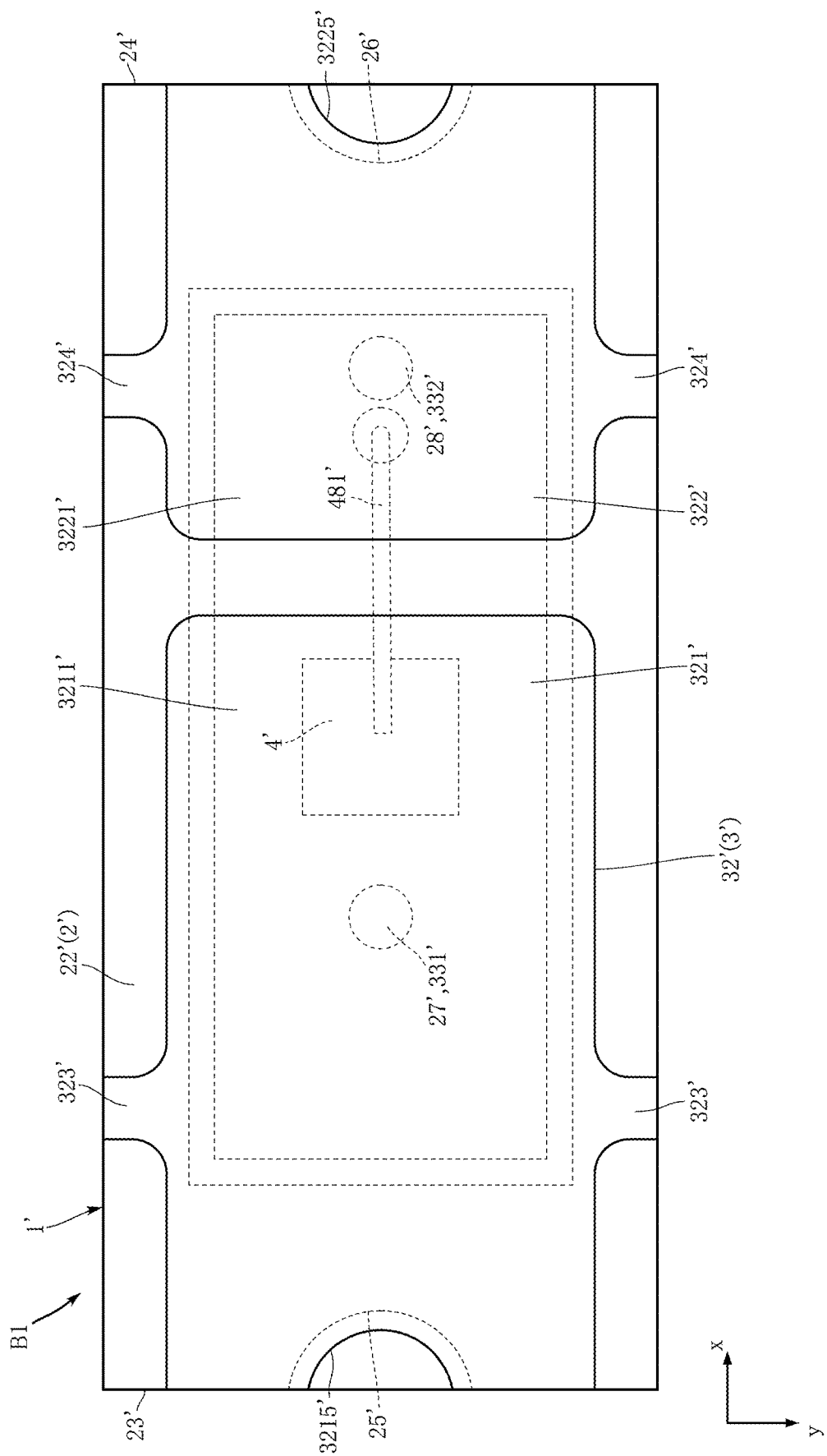
FIG. 36 is a bottom view showing the semiconductor light-emitting device according to the first embodiment based on the second aspect.
Figure 37:
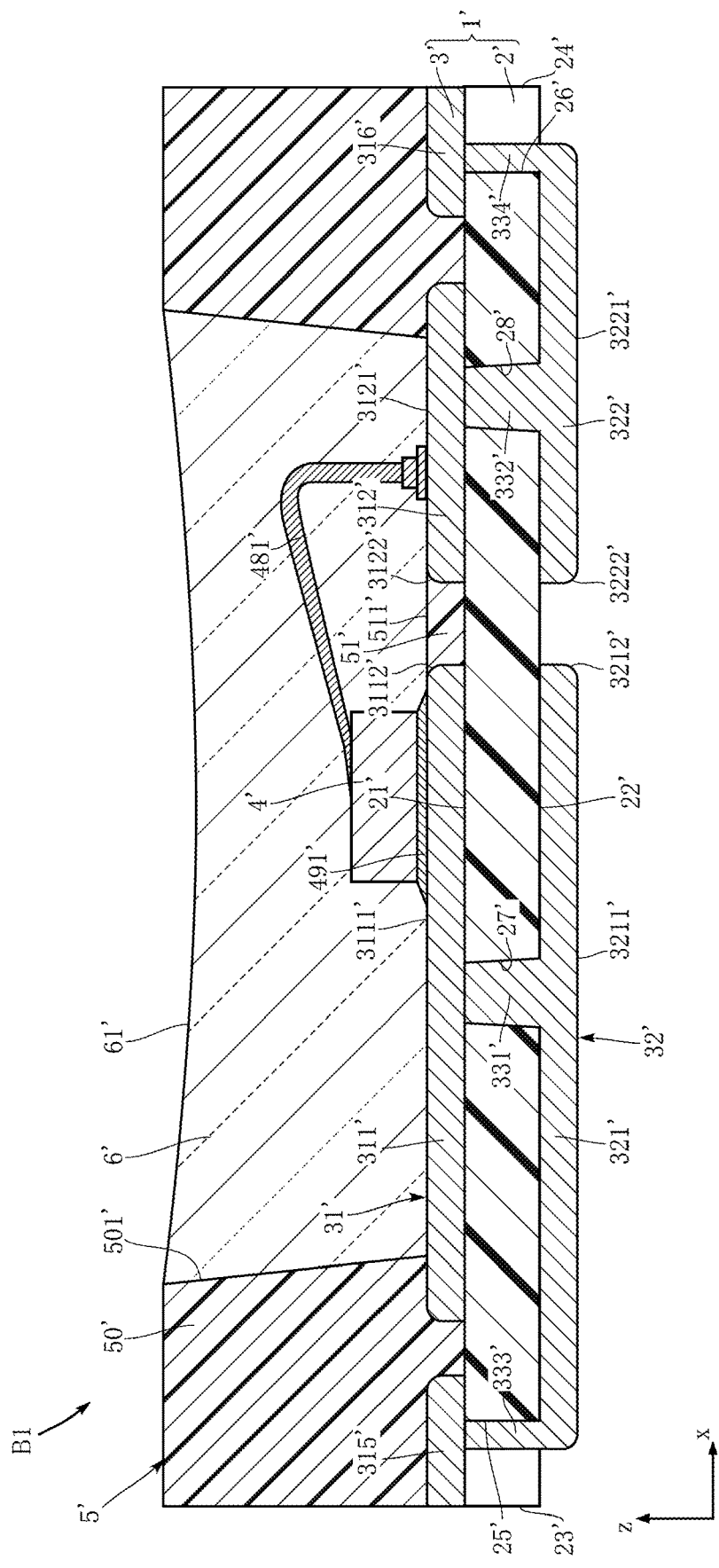
FIG. 37 is a sectional view taken along line XXXVII-XXXVII in FIG. 35.
Figure 38:
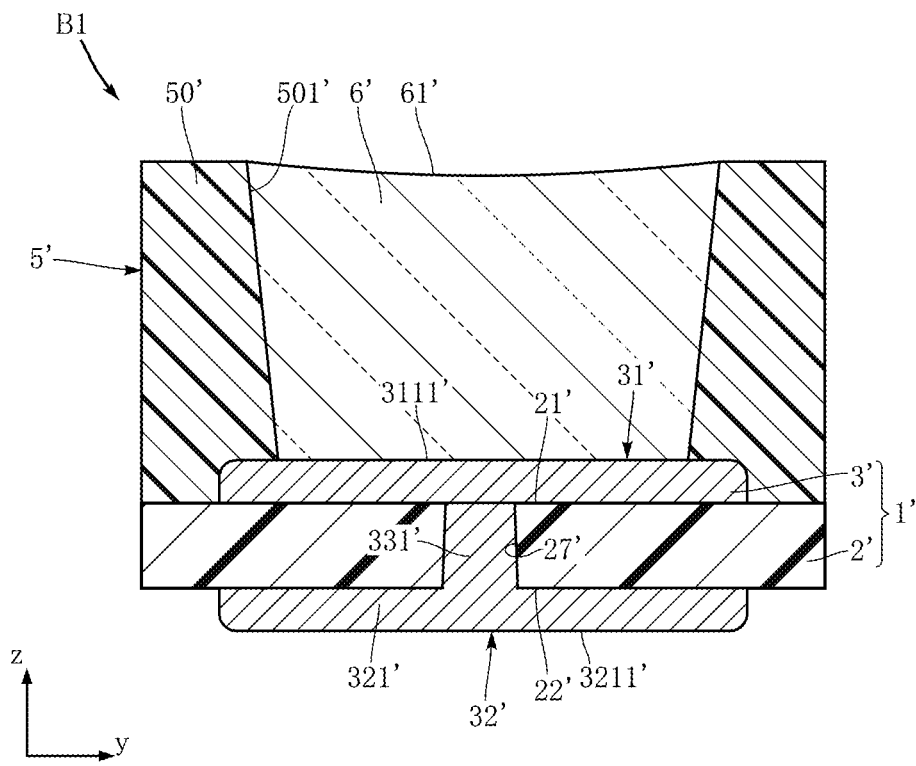
FIG. 38 is a sectional view taken along line XXXVIII-XXXVIII in FIG. 35.
Figure 39:
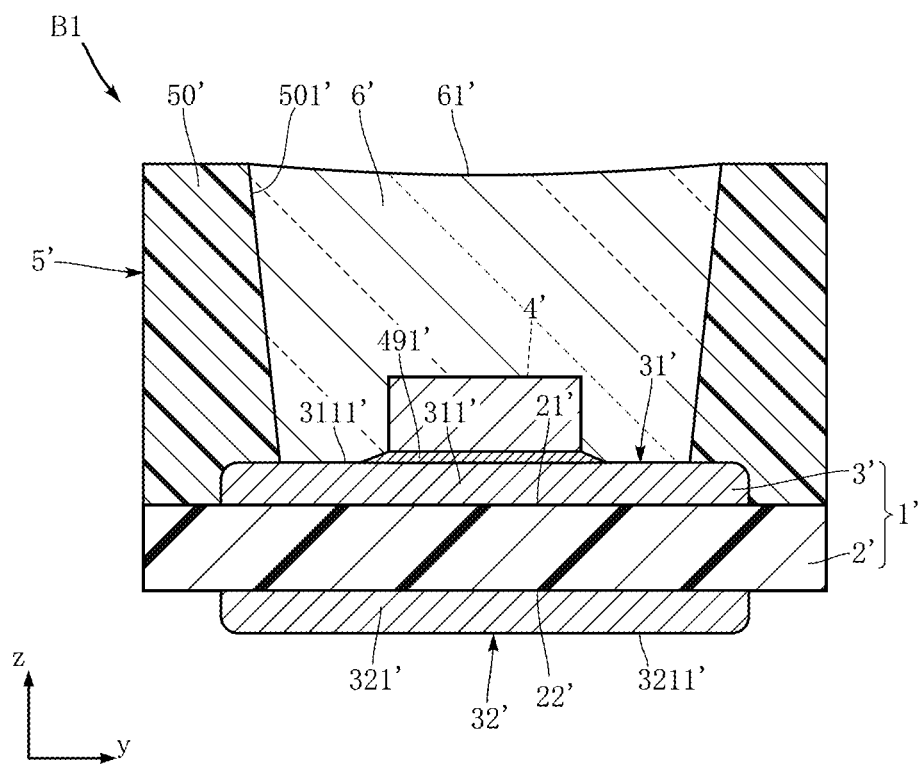
FIG. 39 is a sectional view taken along line XXXIX-XXXIX in FIG. 35.
Figure 40:
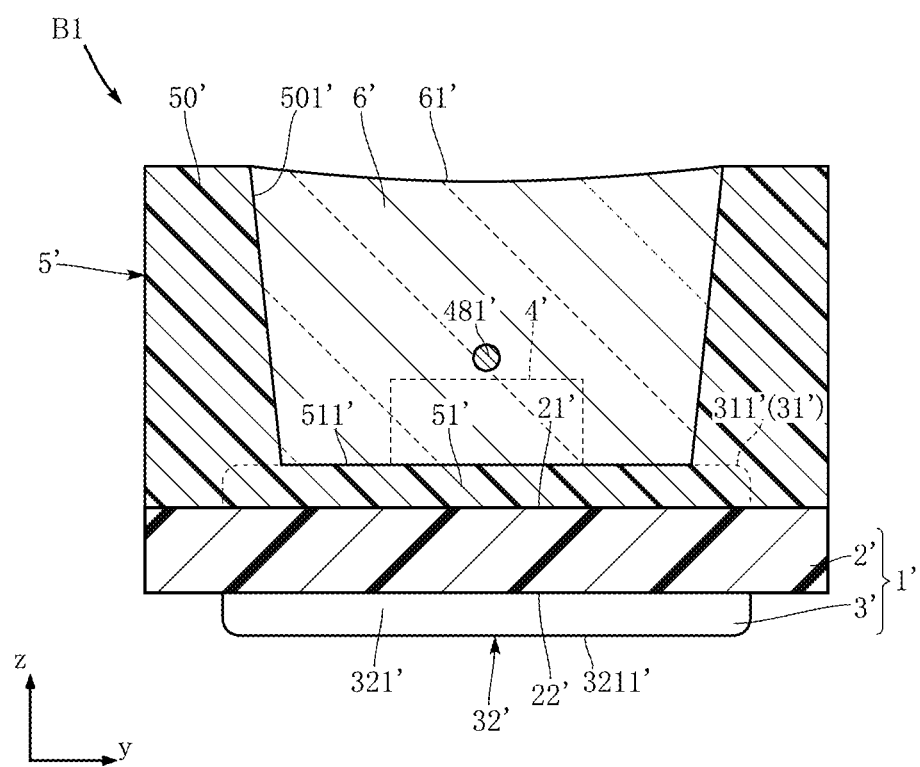
FIG. 40 is a sectional view taken along line XL-XL in FIG. 35.
Figure 41:
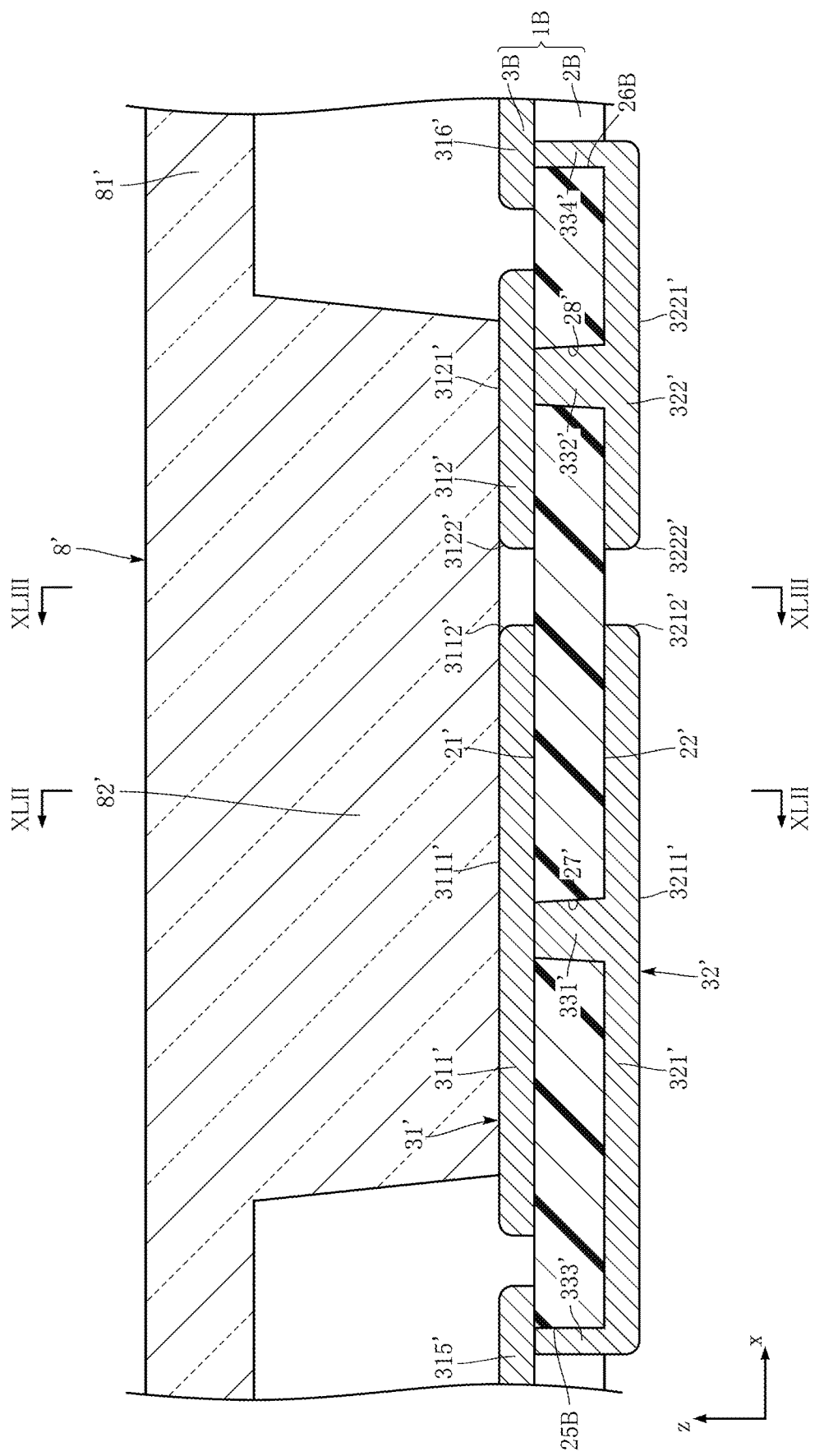
FIG. 41 is a sectional view showing a step of a method for manufacturing the semiconductor light-emitting device according to the first embodiment based on the second aspect.
Figure 42:
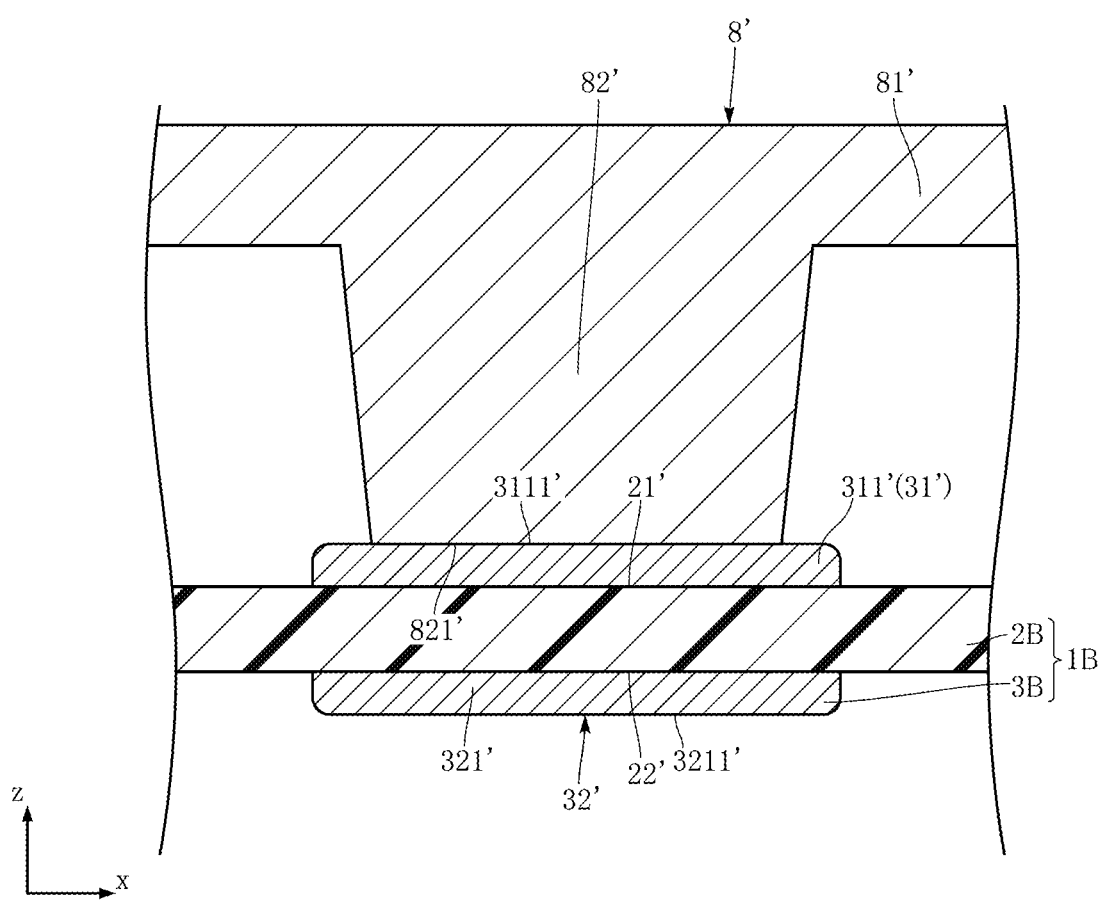
FIG. 42 is a sectional view taken along line XLII-XLII in FIG. 41.
Figure 43:
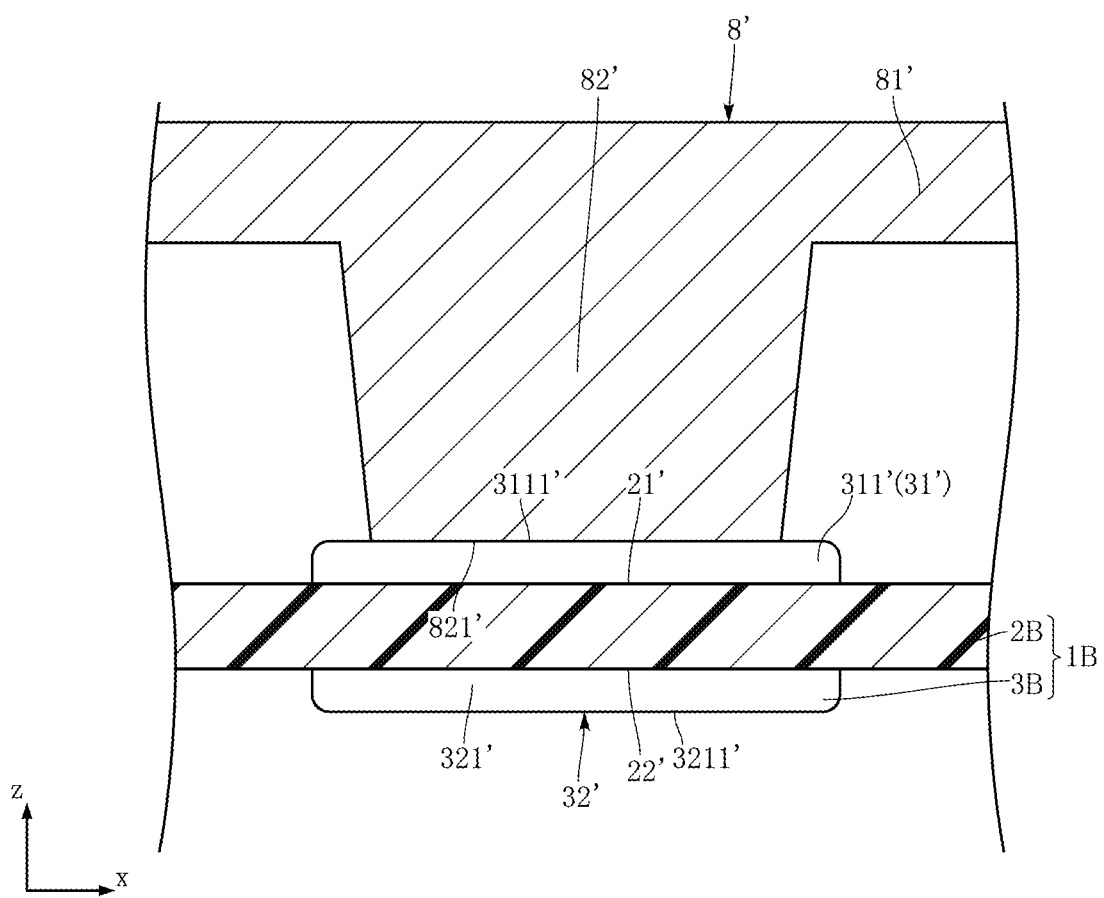
FIG. 43 is a sectional view taken along line XLIII-XLIII in FIG. 41.
Figure 44:
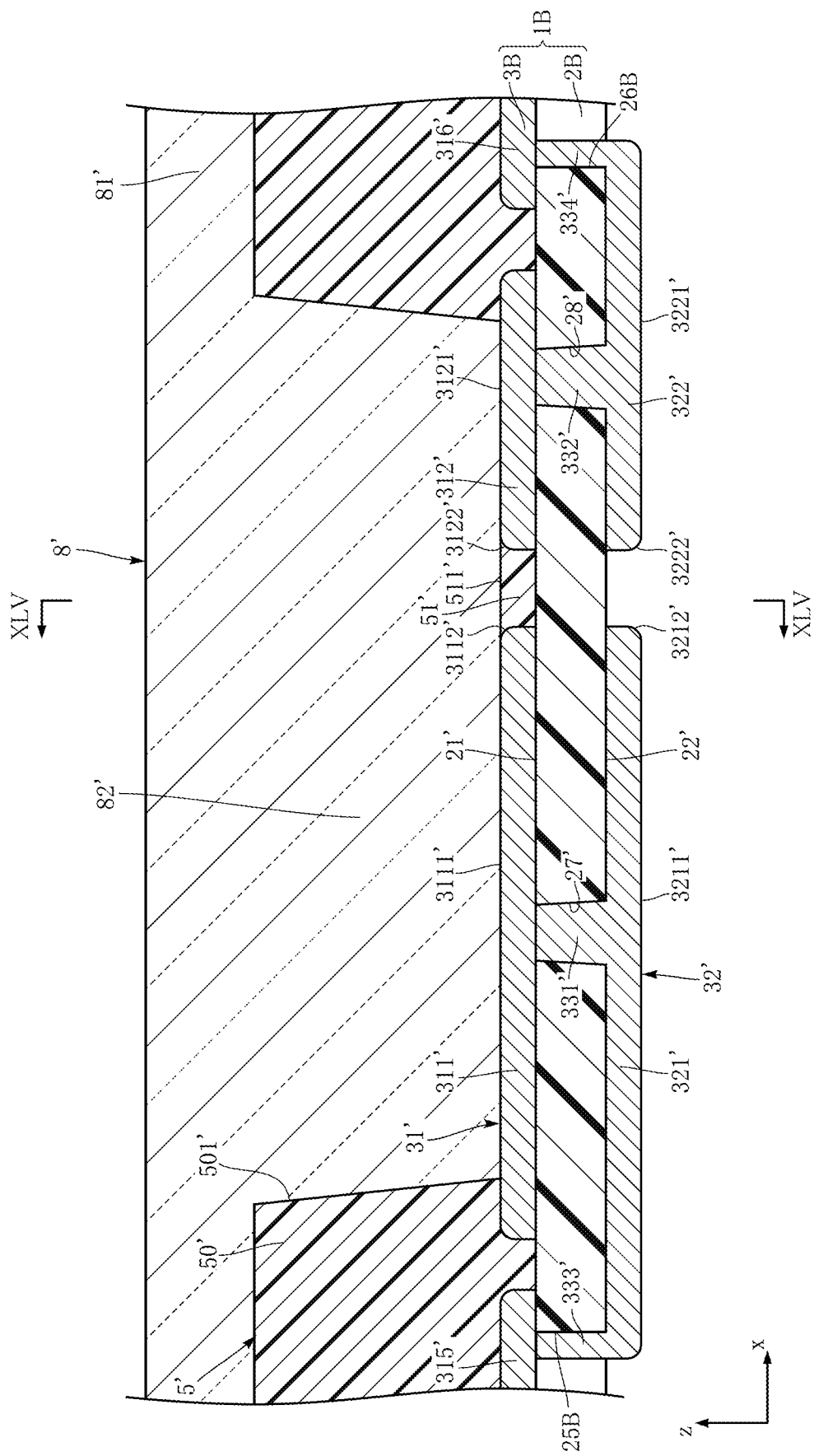
FIG. 44 is a sectional view showing a step of the method for manufacturing the semiconductor light-emitting device according to the first embodiment based on the second aspect.
Figure 45:
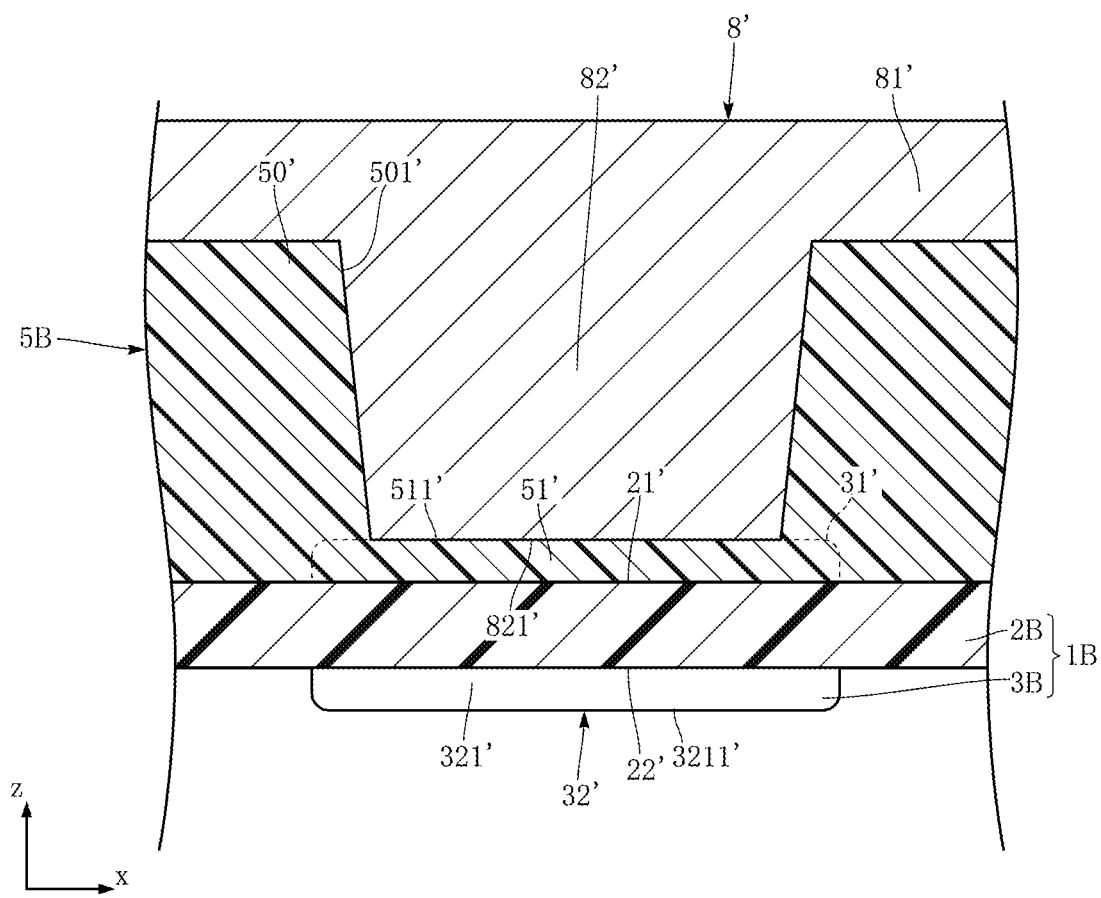
FIG. 45 is a sectional view taken along line XLV-XLV in FIG. 44.

FIG. 35 is a plan view showing the semiconductor light-emitting device B1. FIG. 36 is a bottom view showing the semiconductor light-emitting device B1. FIG. 37 is a sectional view taken along line XXXVII-XXXVII in FIG. 35. FIG. 38 is a sectional view taken along line XXXVIII-XXXVIII in FIG. 35. FIG. 39 is a sectional view taken along line XXXIX-XXXIX in FIG. 35. FIG. 40 is a sectional view taken along line XL-XL in FIG. 35. FIG. 41 is a sectional view showing a step of a method for manufacturing the semiconductor light-emitting device B1. FIG. 42 is a sectional view taken along line XLII-XLII in FIG. 41. FIG. 43 is a sectional view taken along line XLIII-XLIII in FIG. 41. FIG. 44 is a sectional view showing a step of the method for manufacturing the semiconductor light-emitting device B1. FIG. 45 is a sectional view taken along line XLV-XLV in FIG. 44.

As an example of the size of the semiconductor light-emitting device A1, the dimension in the x direction may be about 1.6 mm, the dimension in the y direction may be about 0.8 mm and the dimension in the z direction may be about 0.6 mm. The size and shape of the semiconductor light-emitting device B1 are not limited to this example and may be varied as appropriate.

The substrate 1' serves as a base of the semiconductor light-emitting device B1. The substrate 1' includes a base member 2' and an electrically conductive part 3'.

The base member 2' is made of an insulating material. The material for forming the base member 2' is not limited and may be glass epoxy resin, for example. The base member 2' has a front surface 21', a back surface 22', a first side surface 23' and a second side surface 24'. As shown in FIGS. 37-40, the front surface 21' and the back surface 22' face opposite to each other in the z direction. In the illustrated example, the front surface 21' and the back surface 22' are flat surfaces perpendicular to the z direction. The first side surface 23' connects the front surface 21' and the back surface 22' on one side in the x direction and is perpendicular to the x direction in the illustrated example. The second side surface 24' connects the front surface 21' and the back surface 22' on the other side in the x direction and is perpendicular to the x direction in the illustrated example. The shape of the base member 2' is not particularly limited and may be rectangular as viewed in the z direction as shown in FIGS. 35 and 36. The thickness of the base member 2' is about 0.2 mm, for example.

In the present embodiment, the base member 2' is formed with a first groove 25', a second groove 26', a first through-hole 27' and a second through-hole 28'. The first groove 25' is recessed from the first side surface and extends to reach the front surface 21' and the back surface 22'. The shape of the first groove 25' is not particularly limited and semicircular in cross section in the illustrated example. The second groove 26' is recessed from the second side surface 24' and extends to reach the front surface 21' and the back surface 22'. The shape of the second groove 26' is not particularly limited and semicircular in cross section in the illustrated example.

The first through-hole 27' penetrates the base member 2' in the z direction. As shown in FIGS. 35 and 36, a single first through-hole 27' is provided in the illustrated example. A second through-hole 28' penetrates the base member 2' in the z direction. As shown in FIGS. 35 and 36, a single second through-hole 28' is provided in the illustrated example. The second through-hole 28' is spaced apart from the first through-hole 27' in the x direction. The number, size and arrangement of the first through-hole 27' and the second through-hole 28' are not limited to the illustrated example and may be varied as appropriate.

The conductive part 3' is formed on the base member 2' and provides a conduction path to the semiconductor light-emitting element 4' and a portion for mounting the semiconductor light-emitting element 4'. The conductive part 3 is made of an electrically conductive material and made of a metal such as Cu, Ni, Pd, Ti or Au, for example. As an example, the conductive part 3' may be provided by forming, by electroplating, a Cu plating layer on a base plating layer of Ti and Cu formed on the base member 2'.

In the present embodiment, the conductive part 3' includes a front portion 31', a back portion 32' and a connecting portion 33', as shown in FIGS. 35-40.

The front portion 31' is formed on the front surface 21' of the base member 21'. The front portion 31' has a front first portion 311', a front second portion 312', a front third portion 315' and a front fourth portion 316'. The front portion 31' is about 40 μm in thickness, for example, but the present disclosure is not limited to this.

The front first portion 311' is the portion that is electrically connected to one of the electrodes of the semiconductor light-emitting element 4'. The front second portion 312', which is spaced apart from the front first portion 311' in the x direction, is the portion to which the other one of the electrodes of the semiconductor light-emitting element 4' is electrically connected. The shape and size of the front first portion 311' and the front second portion 312' are not particularly limited. In the illustrated example, the front first portion 311' and the front second portion 312' are rectangular. The front first portion 311' is larger than the front second portion 312'. The front first portion 311' overlaps with the center of the base member 2' as viewed in the z direction. In the illustrated example, the front first portion 311' and the front second portion 312' are spaced apart from the edge of the base member 2'.

As shown in FIG. 35 and FIGS. 37-40, the front first portion 311' has a front-portion first surface 3111' and a front-portion first inclined surface 3112'. The front-portion first surface 3111' faces the side which the front surface 21' faces in the z direction and is a flat surface perpendicular to the z direction in the illustrated example. The front-portion first inclined surface 3112' is connected to the front-portion first surface 3111' and inclined so as to become more distant from the front-portion first surface 3111' in the x direction as approaching the front surface 21' in the z direction. In the illustrated example, the front-portion first inclined surface 3112' is a convexly curved surface. The front-portion first inclined surface 3112' is provided at a portion of the front first portion 311' that faces the front second portion 312' in the x direction.

As shown in FIG. 35 and FIGS. 37-40, the front second portion 312' has a front-portion second surface 3121' and a front-portion second inclined surface 3122'. The front-portion second surface 3121' faces the side which the front surface 21' faces in the z direction and is a flat surface perpendicular to the z direction in the illustrated example. The front-portion second inclined surface 3122' is connected to the front-portion second surface 3121' and inclined so as to become more distant from the front-portion second surface 3121' in the x direction as approaching the front surface 21' in the z direction. In the illustrated example, the front-portion second inclined surface 3122' is a convexly curved surface. The front-portion second inclined surface 3122' is provided at a portion of the front second portion 312' that faces the front first portion 311' in the x direction.

The front third portion 315' is provided along an end edge of the front surface 21' of the base member 2' that adjoins the first side surface 23'. The front third portion 315' is spaced apart from the front first portion 311' in the x direction. The front third portion 315' closes the first groove 25' from the front surface 21' side in the z direction. The shape of the front third portion 315' is not particularly limited and is generally semicircular in the illustrated example. In the illustrated example, the entirety of the front third portion 315' is covered with the resin member 5'. Unlike this, only a part of the front third portion 315' may be covered with the resin member 5', or the entirety of the front third portion 315' may be exposed from the resin member 5'.

The front fourth portion 316' is provided along an end edge of the front surface 21' of the base member 2' that adjoins the second side surface 24'. The front fourth portion 316' is spaced apart from the front second portion 312' in the x direction. The front fourth portion 316' closes the second groove 26' from the front surface 21' side in the z direction. The shape of the front fourth portion 316' is not particularly limited and is generally semicircular in the illustrated example. In the illustrated example, the entirety of the front fourth portion 316' is covered with the resin member 5'. Unlike this, only a part of the front fourth portion 316' may be covered with the resin member 5', or the entirety of the front fourth portion 316' may be exposed from the resin member 5.

The back portion 32' is formed on the back surface 22' of the base member 2'. In the illustrated example, the back portion 32' has a back first portion 321', a back second portion 322', a first extension 323' and a second extension 324'. The thickness of the back portion 32' is not particularly limited and may be about 40 μm, for example. The surface layer of the back portion 32' may be plated with solder or Sn.

The back first portion 321' is the portion that is electrically connected to one of the electrodes of the semiconductor light-emitting element 4'. The back second portion 322', which is spaced apart from the back first portion 321' in the x direction, is the portion to which the other one of the electrodes of the semiconductor light-emitting element 4' is electrically connected. The shape and size of the back first portion 321' and the back second portion 322' are not particularly limited. In the illustrated example, the back first portion 321' is larger than the back second portion 322'. The back first portion 321' overlaps with the center of the base member 2' as viewed in the z direction.

In the illustrated example, the back first portion 321' reaches the end edge of the back surface 22' on the first side surface 23' side. As viewed in the z direction, the back first portion 321' overlaps with the front first portion 311'. The back first portion 321' has a recess 3215'. The recess 3215' has a shape conforming to the first groove 25' of the base member 2' as viewed in the z direction.

The back second portion 322' reaches the end edge of the back surface 22' on the second side surface 24' side. The back second portion 322' has a recess 3225'. The recess 3225' has a shape conforming to the second groove 26' of the base member 2' as viewed in the z direction. The back second portion 322' overlaps with the front second portion 312'.

The first extension 323' is connected to the back first portion 321' and reaches an edge in the y direction of the base member 2' as viewed in the z direction. In the illustrated example, two first extensions 323' connecting to the back first portion 321' from the opposite sides in the y direction are provided.

The second extension 324' is connected to the back second portion 322' and reaches the edge of the base member 2' as viewed in the z direction. In the illustrated example, two second extensions 324' connecting to the back second portion 322' from the opposite sides in the y direction are provided.

The connecting portion 33' includes portions connecting the front portion 31' and the back portion 32' to each other. The connecting portion 33' of the present embodiment includes a first through-hole connecting portion 331', a second through-hole connecting portion 332', a first groove connecting portion 333' and a second groove connecting portion 334'.

The first through-hole connecting portion 331' is formed in the first through-hole 27' of the base member 2' and electrically connects the front first portion 311' and the back first portion 321'. As shown in FIGS. 37 and 38, in the illustrated example, the first through-hole connecting portion 331' is formed integrally with the back first portion 321' by plating. The first through-hole connecting portion 331' is loaded in the first through-hole 27' and fills the first through-hole 27'.

The second through-hole connecting portion 332' is formed in the second through-hole 28' of the base member 2' and electrically connects the front second portion 312' and the back second portion 322'. As shown in FIG. 37, in the illustrated example, the second through-hole connecting portion 332' is formed integrally with the back second portion 322' by plating. The second through-hole connecting portion 332' is loaded in the second through-hole 28' and fills the second through-hole 28'.

The semiconductor light-emitting element 4' is a light source element of the semiconductor light-emitting device B1. Examples of the semiconductor light-emitting element 4' include an LED chip, a semiconductor laser element and a VCSEL element, but the present disclosure is not limited to these examples. Hereinafter, the case where the semiconductor light-emitting element 4' is an LED chip is described as an example.

As shown in FIGS. 35, 37 and 39, the semiconductor light-emitting element 4' is mounted on the front first portion 311'. In the illustrated example, the semiconductor light-emitting element 4' overlaps with the center of the base member 2', as viewed in the z direction. The semiconductor light-emitting element 4' may be rectangular as viewed in the z direction. The semiconductor light-emitting element 4' of the present embodiment is a one-wire LED chip.

The electrode formed on the lower surface of the semiconductor light-emitting element 4' is bonded to the front-portion first surface 3111' of the front first portion 311' with a conductive bonding material 491'. The conductive bonding material 491' is solder or Ag paste, for example, but other materials that are conductive and capable of bonding the semiconductor light-emitting element 4' to the front-portion first surface 3111' may be used.

A first wire 481' is connected to the semiconductor light-emitting element 4'. The first wire 481' is connected to the electrode formed on the upper surface of the semiconductor light-emitting element 4' and to the front second portion 312'. The material for the first wire 481' is not limited and may be Au, for example.

The resin member 5' covers a portion of the substrate 1'. The resin forming the resin member 5' may be a thermosetting resin such as epoxy resin. It is preferable that the resin member 5' is made of a material that is less likely to be deteriorated by the light from the semiconductor light-emitting element 4' than is the base member 2'. In this example, the resin member 5' is made of white epoxy resin. The dimension of the resin member 5' in the z direction is not particularly limited and about 0.4 mm, for example.

The resin member 5' has a frame-shaped portion 50' and a front-surface covering portion 51'.

As shown in FIG. 35, the frame-shaped portion 50' has a continuous rectangular shape as viewed in the z direction. As viewed in the z direction, the edge of the frame-shaped portion 50' and the edge of the base member 2' correspond to each other. The frame-shaped portion 50' surrounds the semiconductor light-emitting element 4' as viewed in the z direction. The frame-shaped portion 50' has a reflector 501'. As shown in FIGS. 37 and 39, the reflector 501' is a surface that flanks the semiconductor light-emitting element 4' in the x direction and the y direction. The reflector 501' is inclined so as to become more distant from the semiconductor light-emitting element 4' in the x direction or the y direction as becoming more distant from the front surface 21' in the z direction. In the illustrated example, the frame-shaped portion 50' covers a portion of each of the front first portion 311' and the front second portion 312' of the front portion 31'.

As shown in FIGS. 35, 37 and 40, the front-surface covering portion 51' is connected to the frame-shaped portion 50' and covers a portion of the front surface 21' that is exposed from the front portion 31'. In the present embodiment, the front-surface covering portion 51' covers the exposed region of the front surface 21' that is flanked by the front first portion 311' and the front second portion 312' in the x direction. In the illustrated example, the front-surface covering portion 51' also covers the front-portion first inclined surface 3112' of the front first portion 311' and the front-portion second inclined surface 3122' of the front second portion 312'. As shown in FIGS. 35 and 40, the front first portion 311' extends over the region surrounded by the frame-shaped portion 50' along the y direction. The frame-shaped portion 50' includes two portions spaced apart from each other in the y direction, and the front first portion 311' connects these two portions to each other.

The front-surface covering portion 51' has a front-surface covering-portion first surface 511'. The front-surface covering-portion first surface 511' faces the side which the front surface 21' faces and is a flat surface perpendicular to the z direction in the illustrated example. The front-surface covering-portion first surface 511' is flush with the front-portion first surface 3111' and the front-portion second surface 3121'.

As shown in FIGS. 37-40, the resin member 6' is loaded in the space surrounded by the frame-shaped portion 50' of the resin member 5' and covers a part of the front portion 31', the semiconductor light-emitting element 4', the first wire 481'. The resin member 6' is made of a material that allows the light from the semiconductor light-emitting element 4' to pass through and is mainly composed of epoxy resin or silicone resin, for example. The resin member 6' main contain a fluorescent substance. For example, when the semiconductor light-emitting element 4' emits blue light, the resin member 6' may contain a fluorescent substance that emits yellow light when excited by blue light. In this case, white light is emitted from the semiconductor light-emitting device B1.

The resin member 6' has a surface 61'. In the illustrated example, the surface 61' is curved downward in the z direction. The resin member 6' having such a shape can be formed by dropping a liquid resin material into a region surrounded by the frame-shaped portion 50' and then hardening the resin material, for example.

An example of a method for manufacturing the semiconductor light-emitting device B1 is described below with reference to FIGS. 41-45.

First, a substrate 1B is prepared. The substrate 1B is a material capable of providing a plurality of substrates 1'. Hereinafter, the case where a plurality of semiconductor light-emitting devices B1 are collectively manufactured is described, but the manufacturing method of the semiconductor light-emitting device B1 is not limited to this.

As shown in FIG. 41, the substrate 1B has a base member 2B and an electrically conductive part 3B. The base member 2B is to become the base member 2' described above and has a front surface 21' and a back surface 22'. The conductive part 3B is to become the conductive part 3' described above and has a plurality of front portions 31' and back portions 32'. The base member 2B is formed with a first-groove through-hole 25B and a second-groove through-hole 26B. The first-groove through-hole 25B and the second-groove through-hole 26B are to become the first groove 25' and the second groove 26', respectively, by being cut in a step described later. The first-groove through-hole 25B and the second-groove through-hole 26B may be circular in cross section.

Next, a mold 8' is pressed against the substrate 1B. The substrate 1B is supported from below in the figure in the z direction by a support member (not shown). The mold 8' has a main part 81' and a projection 82'. The main part 81' is a portion spaced apart from the substrate 1B in the z direction. The projection 82' is a portion projecting from the main part 81' in the z direction. The projection 82' has a contacting surface 821'. The contacting surface 821' is at the end of the projection 82' in the z direction. The contacting surface 821' is a flat surface perpendicular to the z direction. The contacting surface 821' comes into contact with the front-portion first surface 3111' of the front first portion 311' and the front-portion second surface 3121' of the front second portion 312'. A gap is formed between the contacting surface 821' and a part of the front surface 21' that is located between the front first portion 311' and the front second portion 312' in the x direction.

Next, a thermosetting resin in a liquid state, for example, is loaded into the space between the substrate 1B and the mold 8'. This resin material is then hardened to form the resin member 5B shown in FIGS. 44 and 45. The resin material loaded between the main part 81' and the substrate 1B forms a portion including the frame-shaped portion 50'. The resin material loaded in the gap defined by the contacting surface 821', the front surface 21', the front first portion 311' and the front second portion 312' forms the front-surface covering portion 51'.

Next, the mold 8' is removed, and the semiconductor light-emitting element 4' and the first wire 481' are bonded. Thereafter, a light-transmittable resin material is loaded into the space surrounded by the frame-shaped portion 50' by potting, for example, and then hardened, to provide the resin member 6'. Thereafter, the substrate 1B and the resin member 5B are cut appropriately to provide the semiconductor light-emitting device B1 described above.

The advantages of the semiconductor light-emitting device B1 are described below.

According to the present embodiment, the conductive part 3' has the first groove connecting portion 333' along the first groove 25'. This allows a solder fillet to be formed when the semiconductor light-emitting device B1 is mounted to a circuit board, for example. This improves the mounting strength of the semiconductor light-emitting device B1 while also making it easier to visually check the proper formation of solder. The front first portion 311' and the first groove connecting portion 333' are spaced apart from each other on the front surface 21' while being electrically connected to each other via the first through-hole connecting portion 331' and the back first portion 321'. This prevents the material for the conductive bonding material 491', which is used for bonding the semiconductor light-emitting element 4' to the front first portion 311', from spreading to the first groove connecting portion 333'. This allows for proper mounting of the semiconductor light-emitting element 4' and proper mounting of the semiconductor light-emitting device B1.

The conductive part 3' has the second groove connecting portion 334' along the second groove 26'. Thus, a solder fillet can be formed on each side of the semiconductor light-emitting device B1 in the x direction. This is advantageous for improving the mounting strength of the semiconductor light-emitting device B1 and visually checking the proper formation of solder. Moreover, even when the material for the conductive bonding material 491' spreads to the front second portion 312' in mounting the semiconductor light-emitting element 4', the material is prevented from reaching the second groove connecting portion 334'.

According to the present embodiment, as shown in FIGS. 35, 37 and 40, the portion of the front surface 21' of the base member 2' that is exposed from the front portion 31' is covered with the front-surface covering portion 51'. Such an arrangement reduces exposure of the base member 2' to the light from the semiconductor light-emitting element 4', so that deterioration of the base member 2' is reduced. Also, materials that can be deteriorated due to light can be selected as the material for the base member 2', which leads to cost reduction.

Using, as the material for the resin member 5', a material that is less likely to be deteriorated by the light from the semiconductor light-emitting element 4' than is the base member 2' reduces deterioration by the light from the semiconductor light-emitting element 4'.

The front-surface covering portion 51' crosses over the region surrounded by the frame-shaped portion 50' in the y direction and its opposite ends are connected to the frame-shaped portion 50'. Thus, separation of the front-surface covering portion 51' from the front surface 21' is prevented.

Since the front-surface covering-portion first surface 511' is flush with the front-portion first surface 3111' and the front-portion second surface 3121', these surfaces form a large flat surface. This allows the light from the semiconductor light-emitting element 4' to be efficiently reflected in the z direction, which is advantageous for enhancing the brightness of the semiconductor light-emitting device B1.

Since the front-portion first inclined surface 3112' of the front first portion 311' and the front-portion second inclined surface 3122' of the front second portion 312' are covered with the front-surface covering portion 51', the front-surface covering portion 51' has curved surfaces conforming to the front-portion first inclined surface 3112' and the front-portion second inclined surface 3122'. Such curved surfaces reduce stress concentration on the front-surface covering portion 51'.

FIGS. 46-54 show variations and other embodiments of the second aspect of the present disclosure. In these figures, the elements that are the same as or similar to the elements in the above embodiment are denoted by the same reference signs as those in the above embodiment.

Figure 46:
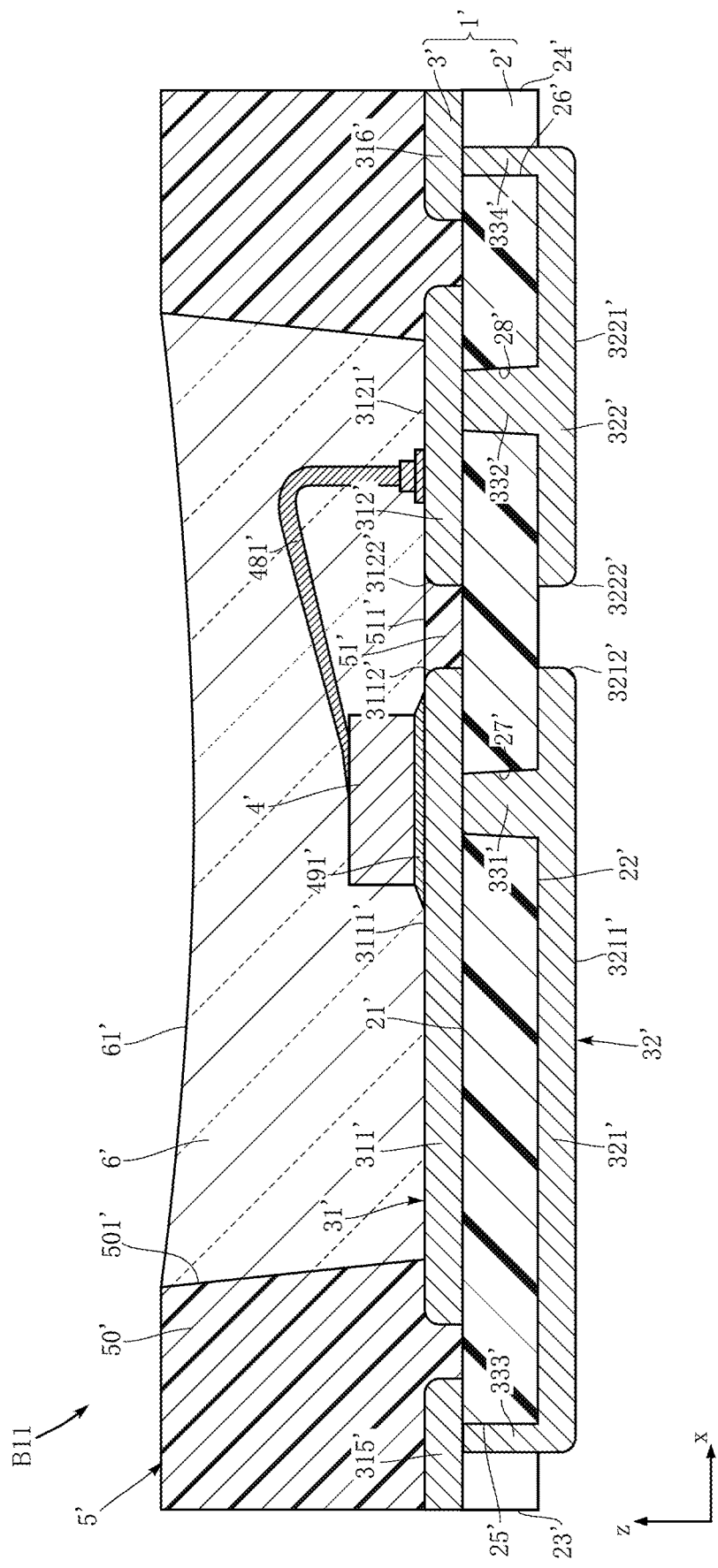
FIG. 46 is a sectional view showing a first variation of the semiconductor light-emitting device according to the first embodiment based on the second aspect.

FIG. 46 is a sectional view showing a first variation of the semiconductor light-emitting device B1. The semiconductor light-emitting device B11 shown in the figure differs from the semiconductor light-emitting device B1 in position of the first through-hole 27' and the first through-hole connecting portion 331'.

In this variation, the first through-hole 27' and the first through-hole connecting portion 331' are at a position overlapping with the semiconductor light-emitting element 4' as viewed in the z direction. In other words, the first through-hole connecting portion 331' is located directly below the semiconductor light-emitting element 4'.

This variation also allows for proper mounting of the semiconductor light-emitting element 4' and proper mounting of the semiconductor light-emitting device B11. Arranging the first through-hole connecting portion 331' directly below the semiconductor light-emitting element 4' enhances heat dissipation from the semiconductor light-emitting element 4'. As will be understood from this variation, the positions of the first through-hole connecting portion 331' and the second through-hole connecting portion 332' may be varied as appropriate. A plurality of first through-hole connecting portions 331' and second through-hole connecting portions 332' may be provided.

Figure 47:
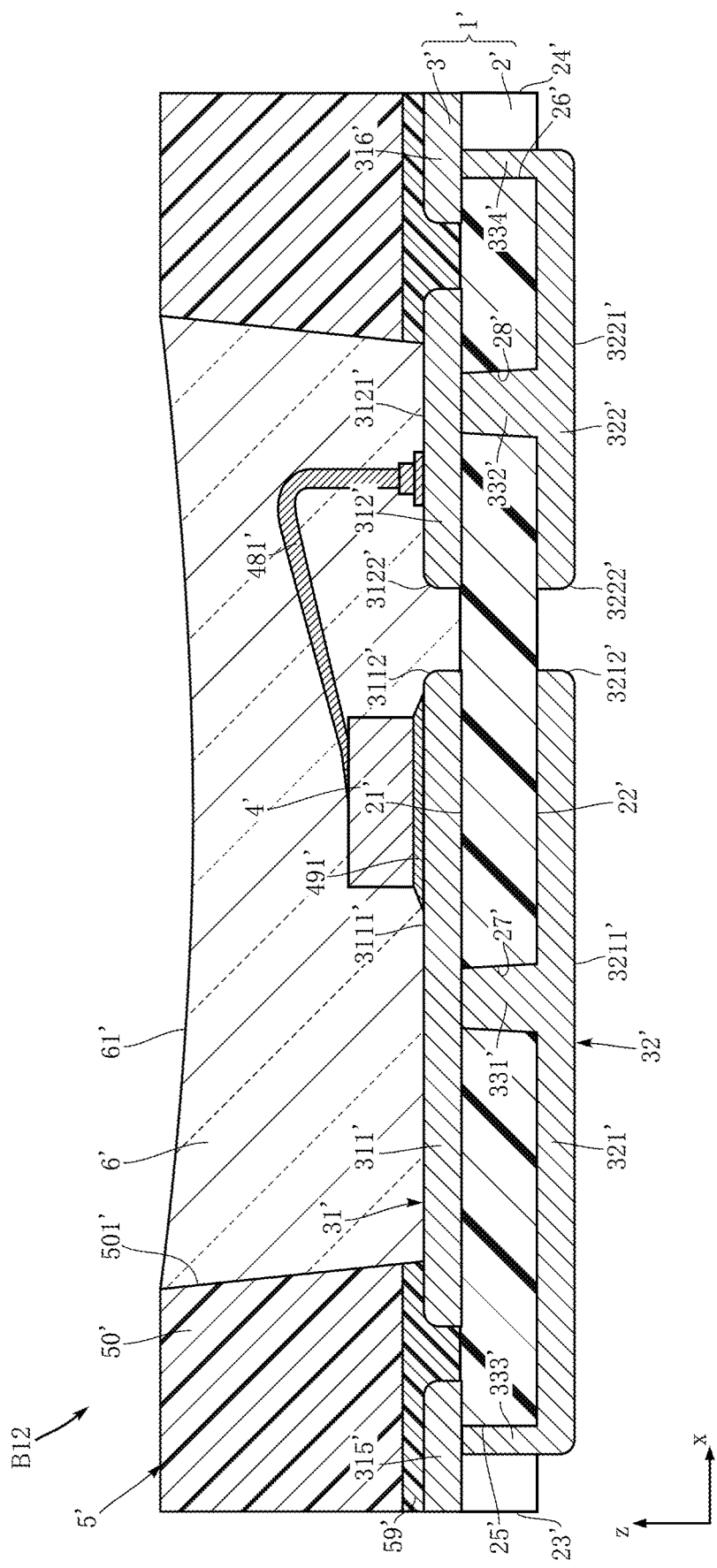
FIG. 47 is a sectional view showing a second variation of the semiconductor light-emitting device according to the first embodiment based on the second aspect.

FIG. 47 is a sectional view showing a second variation of the semiconductor light-emitting device B1. The semiconductor light-emitting device B12 of this variation differs from the above semiconductor light-emitting device B1 in configuration of the resin member 5'.

The resin member 5' of this variation is not formed by resin molding using a mold 8' but formed by bonding a resin member 5' formed in advance (or a plurality of resin intermediate products capable of forming the resin member 5') to the substrate 1' (substrate 1B). The resin member 5' is bonded to the substrate 1' by a bonding layer 59', for example. The bonding layer 59' is formed of an adhesive, for example. The resin member 5' of this variation does not have the front-surface covering portion 51' described above.

This variation also allows for proper mounting of the semiconductor light-emitting element 4' and proper mounting of the semiconductor light-emitting device B12. As will be understood from this variation, the specific configuration of the resin member 5' is not particularly limited. In other variations and embodiments, various configurations can be employed for the resin member 5'.

Figure 48:
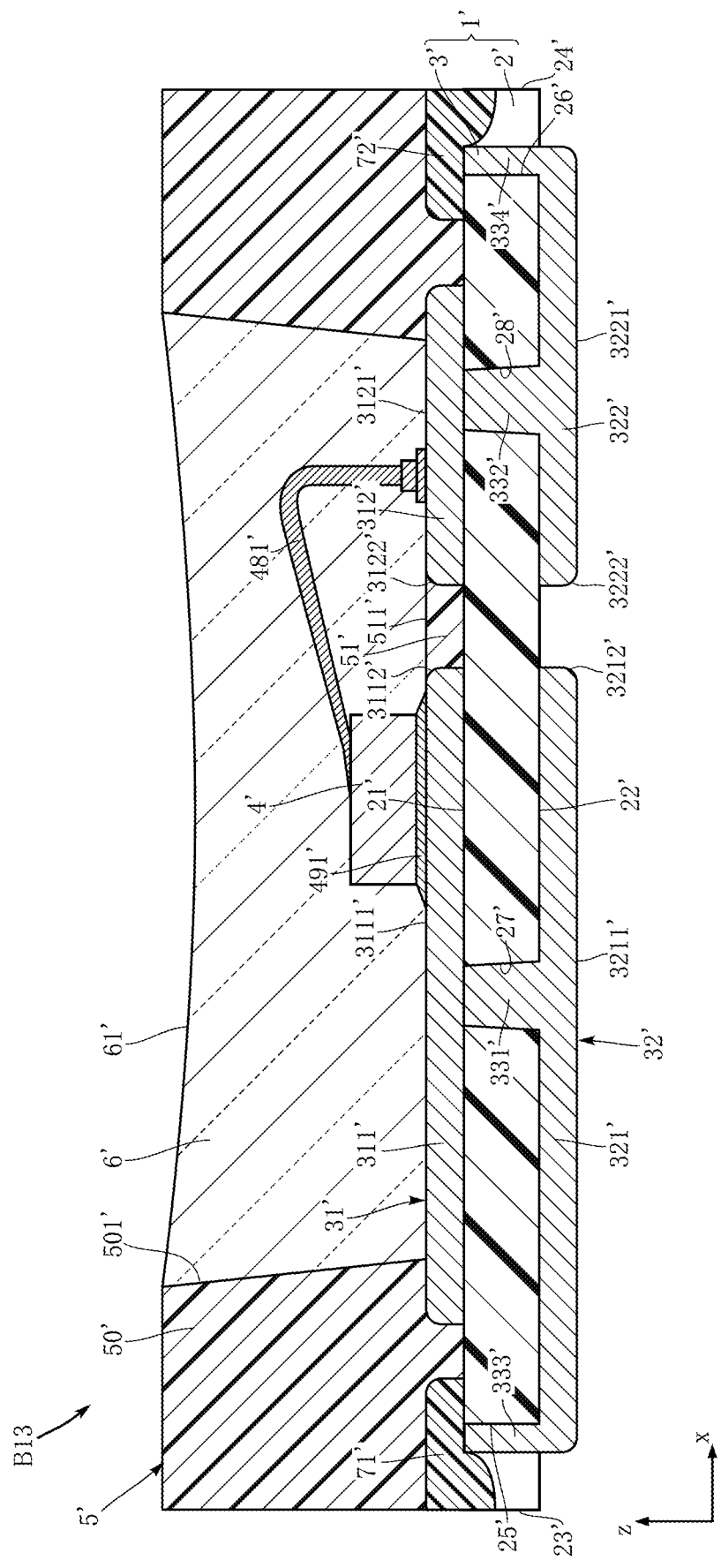
FIG. 48 is a sectional view showing a third variation of the semiconductor light-emitting device according to the first embodiment based on the second aspect.

FIG. 48 is a sectional view showing a third variation of the semiconductor light-emitting device B1. The semiconductor light-emitting device B13 of this variation differs from the semiconductor light-emitting device B1 in configuration covering the first groove 25' and the second groove 26'.

The semiconductor light-emitting device B13 has a first insulating layer 71' and a second insulating layer 72'. The first insulating layer 71' closes the first groove 25' from above in the z direction. The second insulating layer 72' closes the second groove 26' from above in the z direction. The first insulating layer 71' and the second insulating layer 72' are insulating resist layers, for example. The shapes of the first insulating layer 71' and the second insulating layer 72' are not particularly limited and may be the same as the front third portion 315' and the front fourth portion 316'. The first insulating layer 71' and the second insulating layer 72' may be formed by pressing a film forming a resist layer to the first-groove through-hole 25B and the second-groove through-hole 26B of the base member 2B of FIG. 41. In this case, like the example shown in the figure, the first insulating layer 71' and the second insulating layer 72' are partially embedded in the first groove 25' and the second groove 26', respectively.

This variation also allows for proper mounting of the semiconductor light-emitting element 4' and proper mounting of the semiconductor light-emitting device B13. The first insulating layer 71' and the second insulating layer 72' improves the bonding strength between the resin member 5' and the substrate 1.

Figure 49:
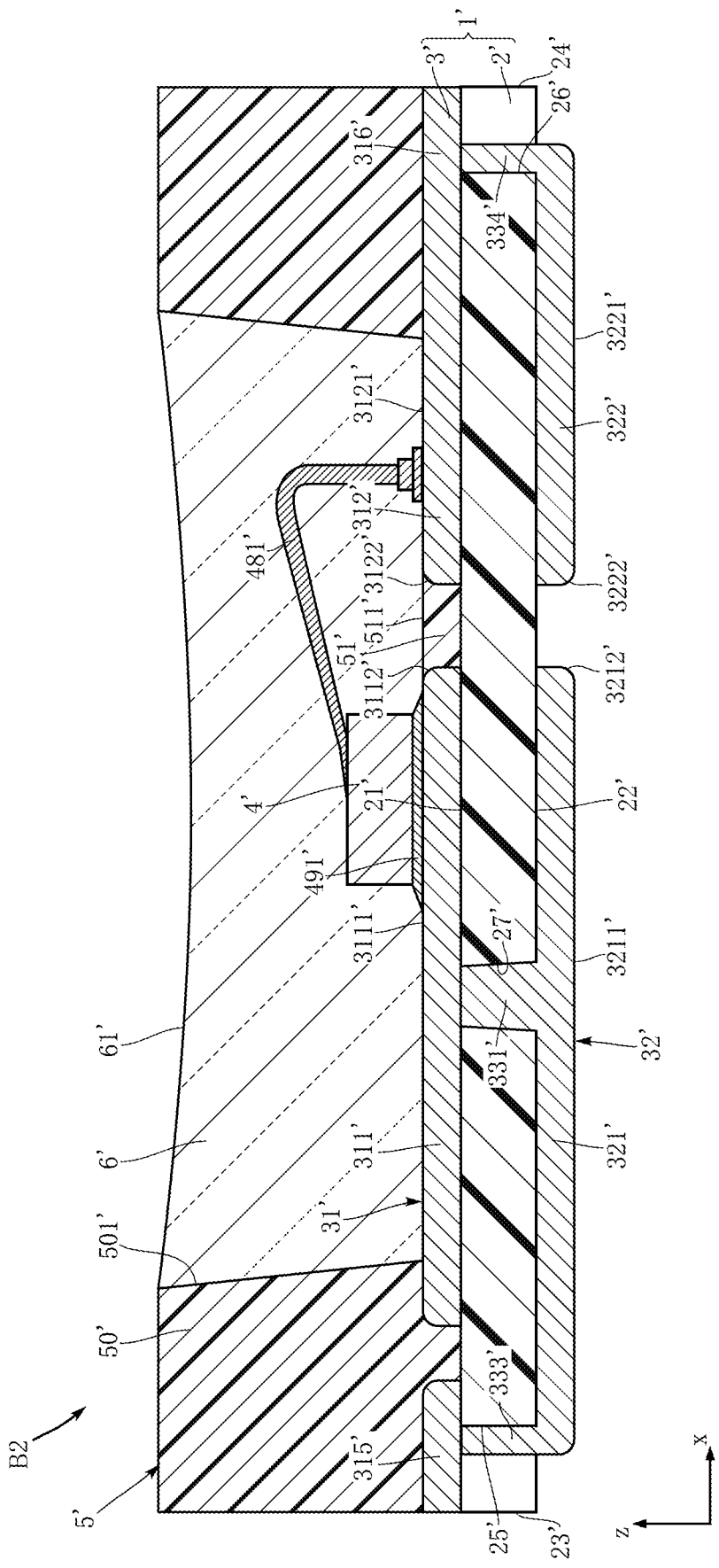
FIG. 49 is a sectional view showing a semiconductor light-emitting device according to a second embodiment based on the second aspect.

FIG. 49 is a sectional view showing a semiconductor light-emitting device according to a second embodiment of the second aspect. The semiconductor light-emitting device B2 shown in the figure differs from the semiconductor light-emitting device B1 mainly in configuration of the conductive part 3'.

The base member 2' is formed with the first through-hole 27' but is not formed with the second through-hole 28' (see FIG. 37). The connecting portion 33' of this embodiment has the first through-hole connecting portion 331' but does not have the second through-hole connecting portion 332' (see FIG. 37).

In the front portion 31' of this embodiment, the front second portion 312' and the front fourth portion 316' are connected to each other. The front fourth portion 316' is connected to the back second portion 322' by the second groove connecting portion 334'.

The present embodiment also allows for proper mounting of the semiconductor light-emitting element 4' and proper mounting of the semiconductor light-emitting device B2. Even when the front second portion 312' and the front fourth portion 316' are connected, problems can be avoided by preventing the material for the conductive bonding material 491' from spreading to the front second portion 312' in the process of forming the conductive bonding material 491'.

Figure 50:
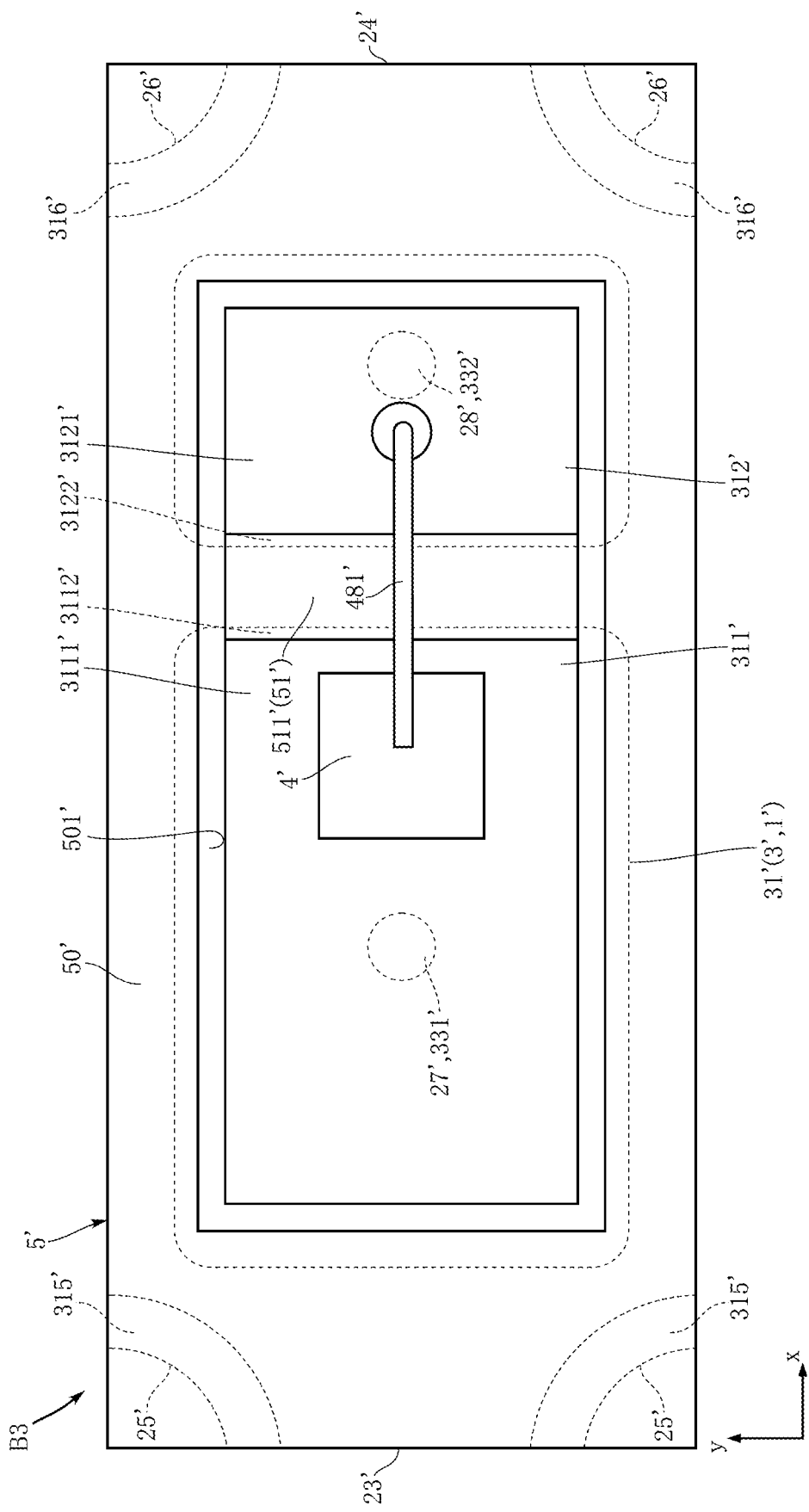
FIG. 50 is a plan view showing a semiconductor light-emitting device according to a third embodiment based on the second aspect.
Figure 51:
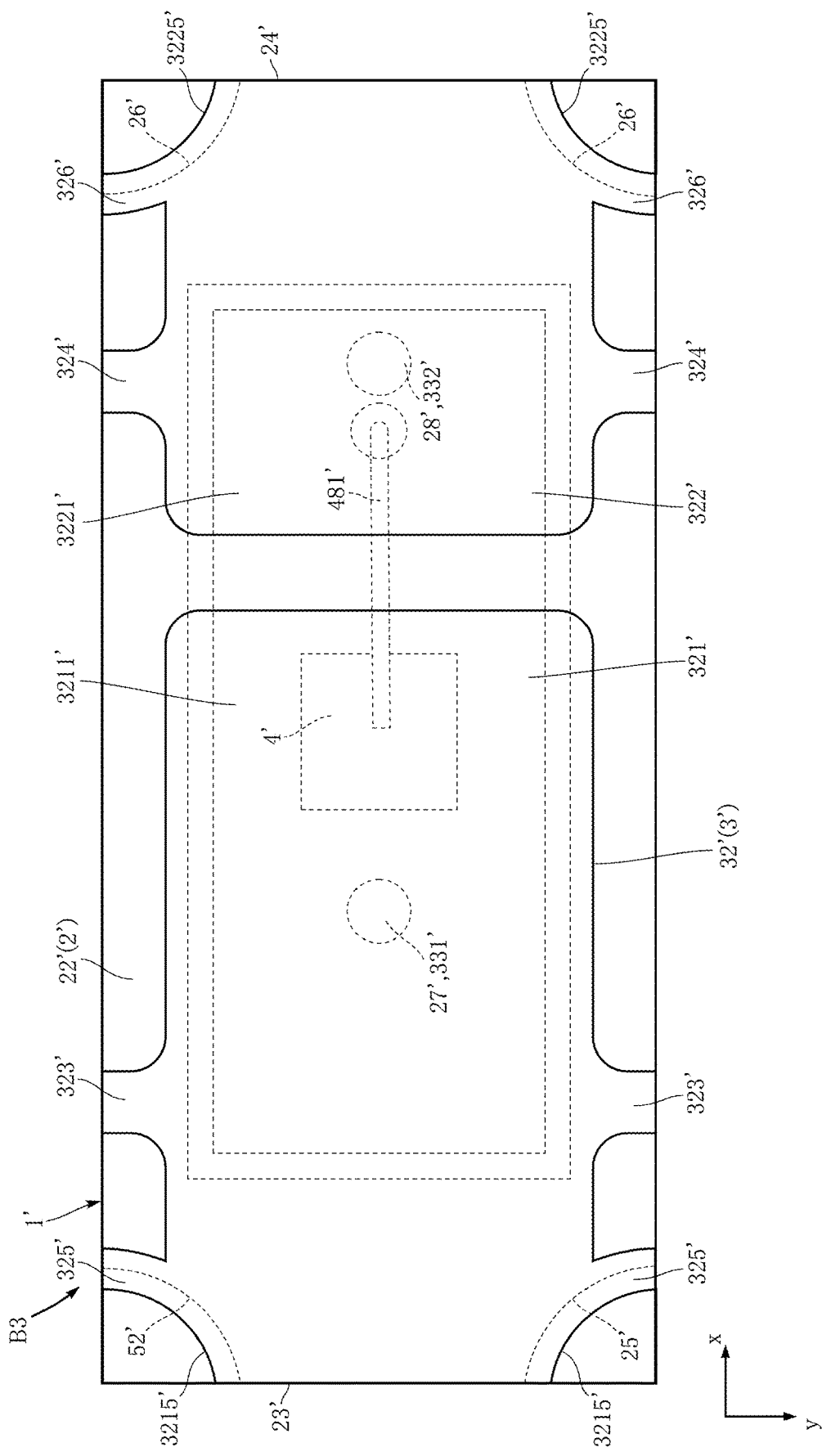
FIG. 51 is a bottom view showing the semiconductor light-emitting device according to the third embodiment based on the second aspect.

FIGS. 50 and 51 show a semiconductor light-emitting device B3 according to a third embodiment of the second aspect. FIG. 50 is a plan view showing the semiconductor light-emitting device B3, and FIG. 51 is a bottom view showing the semiconductor light-emitting device B3.

In the present embodiment, the base member 2' has two first grooves 25' and two second grooves 26'. The two first grooves 25' individually adjoin opposite ends of the front surface 21' of the base member 2' in the y direction. The two second grooves 26' individually adjoin opposite ends of the front surface 21' of the base member 2' in the y direction.

The front portion 31' has two front third portions 315' and two front fourth portions 316'. The two front third portions 315' are formed individually along the two first grooves 25'. The two front fourth portions 316' are formed individually along the two second grooves 26'.

The back portion 32' has two third extensions 325' and two fourth extensions 326'. The two third extensions 325' are along portions of the two first grooves 25' and extend out from the back first portion 321' in the y direction. The two third extensions 325' individually reach opposite ends of the back surface 22' in the y direction. The two fourth extensions 326' are along portions of the two second groove 26' and extend out from the back second portion 322' in the y direction. The two fourth extensions 326' individually reach opposite ends of the back surface 22' in the y direction.

The back first portion 321' has two recesses 3215'. The two recesses 3215' extend individually along portions of the two first grooves 25'. The back second portion 322' has two recesses 3225'. The two recesses 3225' extend individually along portions of the two second grooves 26'.

The present embodiment also allows for proper mounting of the semiconductor light-emitting element 4' and proper mounting of the semiconductor light-emitting device B3. As will be understood from the present embodiment, the number and arrangement of the first groove 25' and the second groove 26' are not limited in any way. Arranging the first groove 25' and the second groove 26' at the corners of the base member 2' as viewed in the z direction, as in the present embodiment, makes it easier to avoid interference with the front first portion 311' or the front second portion 312'.

Figure 52:
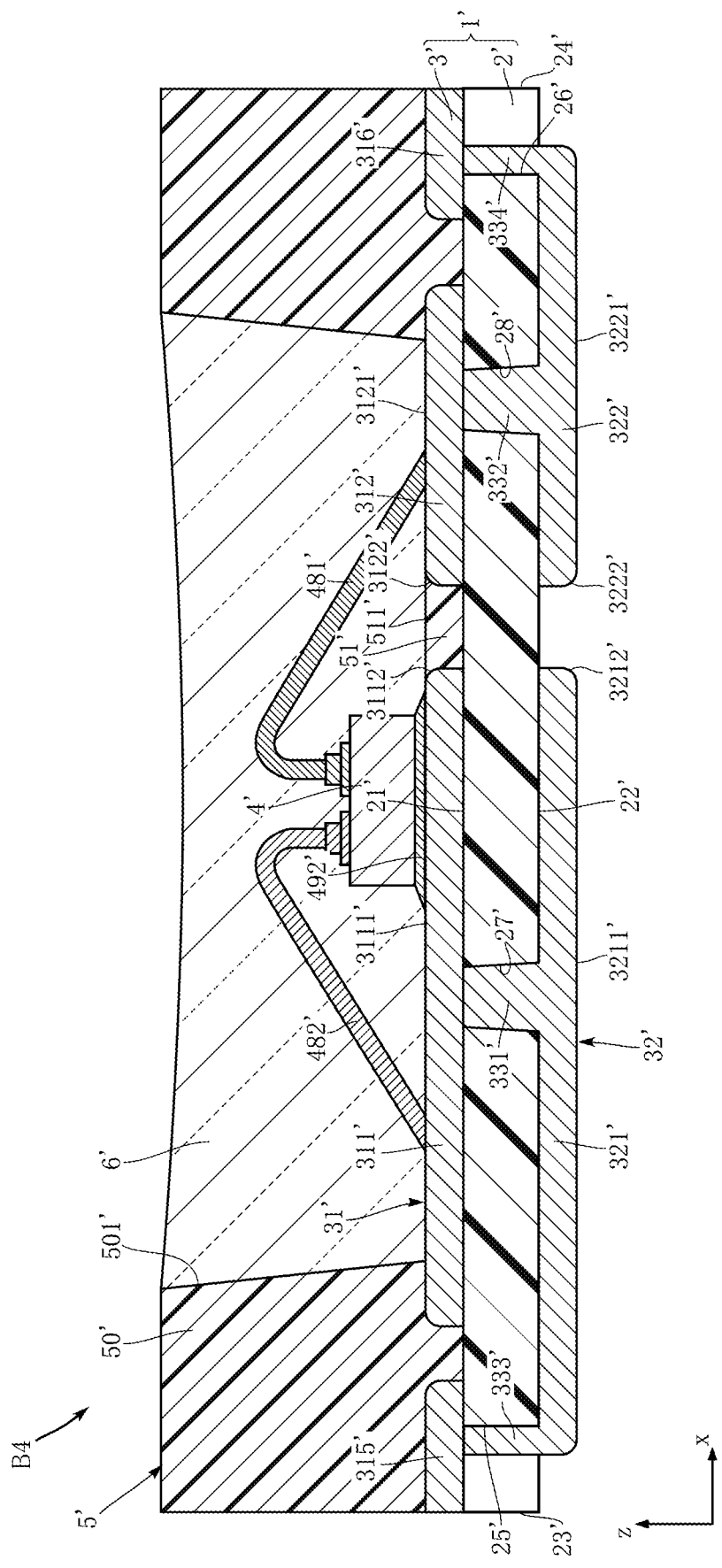
FIG. 52 is a sectional view showing a semiconductor light-emitting device according to a fourth embodiment based on the second aspect.

FIG. 52 is a sectional view showing a semiconductor light-emitting device B4 according to a fourth embodiment of the second aspect. The semiconductor light-emitting device B4 has a first wire 481' and a second wires 482'.

The semiconductor light-emitting element 4' of the present embodiment is a two-wire semiconductor light-emitting element that has two electrodes on its upper surface. The first wire 481' is connected to one of the electrodes of the semiconductor light-emitting element 4' and the front second portion 312'. The second wire 482' is connected to the other one of the electrodes of the semiconductor light-emitting element 4' and the front first portion 311'.

The semiconductor light-emitting element 4' is bonded to the front-portion first surface 3111' of the front first portion 311' with a bonding material 492'. The bonding material 492' may be a conductive material or an insulating material.

The present embodiment also allows for proper mounting of the semiconductor light-emitting element 4' and proper mounting of the semiconductor light-emitting device B4.

Figure 53:
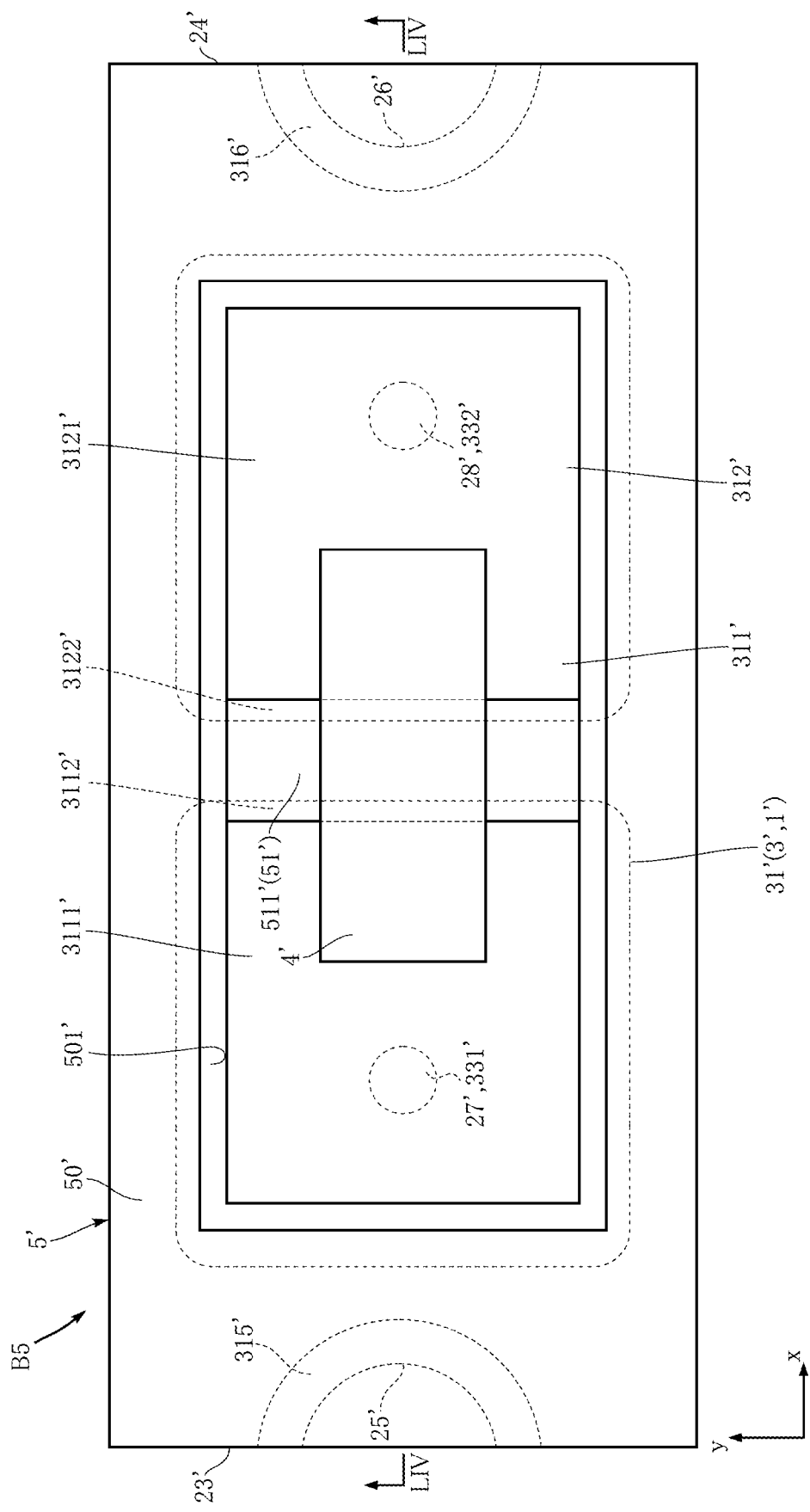
FIG. 53 is a plan view showing a semiconductor light-emitting device according to a fifth embodiment based on the second aspect.
Figure 54:
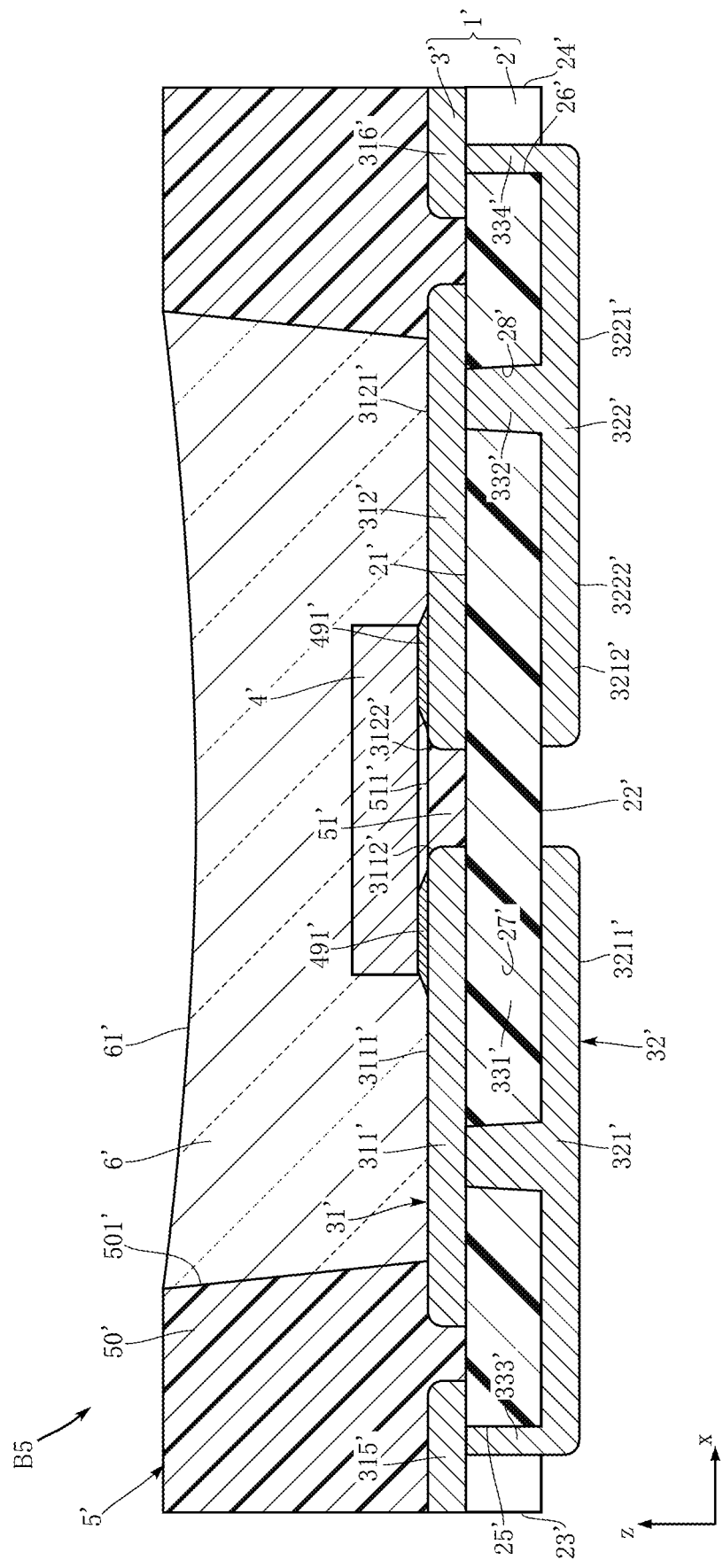
FIG. 54 is a sectional view taken along line LIV-LIV in FIG. 53.

FIGS. 53 and 54 show a semiconductor light-emitting device B5 according to a fifth embodiment of the second aspect. FIG. 53 is a plan view showing the semiconductor light-emitting device B5. FIG. 54 is a sectional view taken along line LIV-LIV in FIG. 53. The semiconductor light-emitting device B5 differs from the foregoing embodiments in configuration of the semiconductor light-emitting element 4'.

The semiconductor light-emitting element 4' of the present embodiment is a flip-chip LED chip. One of the electrodes of the semiconductor light-emitting element 4' is electrically bonded to the front first portion 311' with a conductive bonding material 491'. The other one of the electrodes of the semiconductor light-emitting element 4' is electrically bonded to the front second portion 312' with a conductive bonding material 491'. The conductive bonding material 491' is solder or Ag paste, for example.

In the present embodiment, the semiconductor light-emitting element 4' is arranged in the approximate center of the base member 2'. Accordingly, the front first portion 311' and the front second portion 312' are made approximately equal in dimension in the x direction. Also, the front-surface covering portion 51' is located in the approximate center of the semiconductor light-emitting device B5 in the x direction. The back first portion 321' and the back second portion 322' are made approximately equal in dimension in the x direction.

The present embodiment also allows for proper mounting of the semiconductor light-emitting element 4' and proper mounting of the semiconductor light-emitting device B5. As will be understood from the semiconductor light-emitting device B4 and the semiconductor light-emitting device B5, the specific configuration of the semiconductor light-emitting element 4' according to the present disclosure is not limited in any way and may be selected in combination with various implementations of other structural elements.

The arrangement of the semiconductor light-emitting element 4' on the substrate 1 is not limited. As viewed in the z direction, the center of the semiconductor light-emitting element 4' may coincide with the center of the base member 2', or the semiconductor light-emitting element 4' may overlap with the center in the z direction. Also, the semiconductor light-emitting element 4' may be spaced apart from the center of the base member 2'.

The semiconductor light-emitting device and the method for manufacturing the semiconductor light-emitting device based on the second aspect of the present disclosure are not limited to the foregoing embodiments. The configuration of the semiconductor light-emitting device according to the second aspect of the present disclosure and the method for manufacturing the semiconductor light-emitting device may be varied in design in many ways. The semiconductor light-emitting device according to the second aspect of the present disclosure may be defined as in the following clauses 1B-20B.

Clause 1B. A semiconductor light-emitting device comprising:
  a substrate having a base member and a conductive part;
  a semiconductor light-emitting element supported on the substrate; and
  a resin member covering at least a portion of the substrate, wherein
  the base member includes a front surface and a back surface that face opposite to each other in a thickness direction, a first side surface and a second side surface connecting the front surface and the back surface and located on opposite sides from each other in a first direction perpendicular to the thickness direction, a first groove recessed from the first side surface and reaching the front surface and the back surface, and a first through-hole penetrating in the thickness direction,
  the conductive part includes a front portion formed on the front surface, a back portion formed on the back surface, and a connecting portion including at least a first groove connecting portion formed in the first groove and a first through-hole connecting portion formed in the first through-hole,
  the front portion has a front first portion to which the semiconductor light-emitting element is mounted, the back portion has a back first portion, the first through-hole connecting portion connects the front first portion and the back first portion, and the first groove connecting portion is connected to the back first portion, the front first portion and the first groove connecting portion being spaced apart from each other.

Clause 2B. The semiconductor light-emitting device according to clause 1B, wherein the front portion has a front third portion covering the first groove as viewed in the thickness direction and connected to the back first portion by the first groove connecting portion.

Clause 3B. The semiconductor light-emitting device according to clause 1B or 2B, wherein the first groove is spaced apart from opposite ends of the front surface in a second direction perpendicular to the thickness direction and the first direction.

Clause 4B. The semiconductor light-emitting device according to clause 1B or 2B, wherein the first groove adjoins one of opposite ends of the front surface in a second direction perpendicular to the thickness direction and the first direction.

Clause 5B. The semiconductor light-emitting device according to clause 1B or 2B, wherein the base member has two said first grooves individually adjoining opposite ends of the front surface in a second direction perpendicular to the thickness direction and the first direction.

Clause 6B. The semiconductor light-emitting device according to any of clauses 1B-5B, wherein the front first portion and the back first portion overlap with each other as viewed in the thickness direction.

Clause 7B. The semiconductor light-emitting device according to any of clauses 1B-6B, wherein the first groove connecting portion is formed along an inner surface of the first groove.

Clause 8B. The semiconductor light-emitting device according to any of clauses 1B-7B, wherein the first through-hole connecting portion fills the first through-hole.

Clause 9B. The semiconductor light-emitting device according to clause 1B, further comprising a first insulating layer covering the first groove as viewed in the thickness direction.

Clause 10B. The semiconductor light-emitting device according to any of clauses 1B-9B, further comprising a wire, wherein the front portion has a front second portion spaced apart from the front first portion, the wire being connected to the semiconductor light-emitting element and the front second portion.

Clause 11B. The semiconductor light-emitting device according to clause 10B, wherein the base member has a second groove recessed from the second side surface and reaching the front surface and the back surface, and a second through-hole penetrating in the thickness direction, the back portion has a back second portion spaced apart from the back first portion, the connecting portion includes a second groove connecting portion formed in the second groove and a second through-hole connecting portion formed in the second through-hole, the second through-hole connecting portion connects the front second portion and the back second portion, the second groove connecting portion is connected to the back second portion, and the front second portion and the second groove connecting portion are spaced apart from each other.

Clause 12B. The semiconductor light-emitting device according to clause 11B, wherein the front portion has a front fourth portion covering the second groove as viewed in the thickness direction and connected to the back second portion by the second groove connecting portion.

Clause 13B. The semiconductor light-emitting device according to clause 11B or 12B, wherein the second groove is spaced apart from opposite ends of the front surface in a second direction perpendicular to the thickness direction and the first direction.

Clause 14B. The semiconductor light-emitting device according to clause 11B or 12B, wherein the second groove adjoins one of opposite ends of the front surface in a second direction perpendicular to the thickness direction and the first direction.

Clause 15B. The semiconductor light-emitting device according to clause 11B or 12B, wherein the base member has two said second grooves individually adjoining opposite ends of the front surface in a second direction perpendicular to the thickness direction and the first direction.

Clause 16B. The semiconductor light-emitting device according to any of clauses 11B-15B, wherein the front second portion and the back second portion overlap with each other as viewed in the thickness direction.

Clause 17B. The semiconductor light-emitting device according to any of clauses 11B-16B, wherein the second groove connecting portion is formed along an inner surface of the second groove.

Clause 18B. The semiconductor light-emitting device according to any of clauses 11B-17B, wherein the second through-hole connecting portion fills the second through-hole.

Clause 19B. The semiconductor light-emitting device according to clause 11B, further comprising a second insulating layer covering the second groove as viewed in the thickness direction.

Clause 20B. The semiconductor light-emitting device according to any of clauses 1B-19B, wherein the resin member includes a frame-shaped portion surrounding the semiconductor light-emitting element as viewed in the thickness direction, and a front-surface covering portion connected to the frame-shaped portion and covering a portion of the front surface of the base member that is exposed from the front portion.

The invention claimed is:

1. A semiconductor light-emitting device comprising:
   a substrate including an insulating base member and a conductive part;
   a semiconductor light-emitting element supported on the substrate; and
   a resin member covering at least a portion of the substrate,
   wherein the insulating base member includes an obverse surface and a reverse surface that face away from each other in a thickness direction,
   the conductive part includes a first portion formed on the obverse surface and a second portion separate from the first portion,
   the semiconductor light-emitting element is mounted on the first portion,
   the resin member includes a frame-shaped portion surrounding the semiconductor light-emitting element as viewed in the thickness direction, and an obverse-surface covering portion connected to the frame-shaped portion and covering a portion of the obverse surface of the insulating base member that is exposed from the first portion and the second portion,
   the resin member covers a side surface of the first portion and a side surface of the second portion, and the resin member is held in direct contact with the obverse surface of the insulating base member.

2. The semiconductor light-emitting device according to claim 1, wherein the resin member comprises a portion held in contact with the reverse surface of the insulating base member.

3. The semiconductor light-emitting device according to claim 1, wherein the frame-shaped portion and the obverse-surface covering portion are made of a same resin material.

4. The semiconductor light-emitting device according to claim 3, wherein the obverse surface coating portion is constant in height.

5. The semiconductor light-emitting device according to claim 1, wherein the obverse surface is flat.

6. The semiconductor light-emitting device according to claim 5, wherein the first portion and the second portion are located on the obverse surface.

7. The semiconductor light-emitting device according to claim 1, wherein the insulating base member is formed with a through-hole extending between the obverse surface and the reverse surface.

8. The semiconductor light-emitting device according to claim 7, wherein the resin member comprises a portion filled in the through-hole.

* * * * *